US010803968B2

(12) United States Patent
Kunz et al.

(10) Patent No.: US 10,803,968 B2
(45) Date of Patent: Oct. 13, 2020

(54) METHODS AND APPARATUS TO CONTROL SWITCHING OF A SAMPLING CIRCUIT

(71) Applicant: Texas Instruments Incorporated, Dallas, TX (US)

(72) Inventors: Keith Edmund Kunz, Tucson, AZ (US); BoQiang Xiao, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/809,474

(22) Filed: Mar. 4, 2020

(65) Prior Publication Data
US 2020/0286574 A1 Sep. 10, 2020

Related U.S. Application Data

(60) Provisional application No. 62/814,115, filed on Mar. 5, 2019, provisional application No. 62/814,122, filed on Mar. 5, 2019.

(51) Int. Cl.
G11C 27/02 (2006.01)
G05F 3/26 (2006.01)
G01R 19/165 (2006.01)
G05F 1/46 (2006.01)
H03K 5/24 (2006.01)
(Continued)

(52) U.S. Cl.
CPC ...... *G11C 27/026* (2013.01); *G01R 19/16552* (2013.01); *G05F 1/468* (2013.01); *G05F 1/575* (2013.01); *G05F 3/262* (2013.01); *H03K 5/24* (2013.01); *H03K 19/21* (2013.01)

(58) Field of Classification Search
None
See application file for complete search history.

(56) References Cited

U.S. PATENT DOCUMENTS 6,469,547 B1\* 10/2002 Rabii ................... H03K 5/24
327/58
2007/0126432 A1\* 6/2007 Goto ..................... G01D 18/00
324/658

(Continued)

OTHER PUBLICATIONS

Analog Devices, "MT-090 Tutorial: Sample-and-Hold Amplifiers," Oct. 2008 (21 pages).

(Continued)

*Primary Examiner* — Lincoln D Donovan
*Assistant Examiner* — Khareem E Almo
(74) *Attorney, Agent, or Firm* — Mark Allen Valetti; Charles A. Brill; Frank D. Cimino

(57) ABSTRACT

Methods, apparatus, systems and articles of manufacture are disclosed to control switching of a sampling circuit. An example apparatus includes an offset window detector to determine whether a first voltage meets a first threshold of a target input voltage; a settling time detector coupled to the offset window detector, the settling time detector to determine whether a second voltage meets a second threshold, the second voltage dependent on a delay of the settling time detector, the delay of the settling time detector to track a time response of a scaling amplifier; and a sample acquisition controller coupled to the offset window detector and the settling time detector, the sample acquisition controller operable to cause a reference voltage to be sampled, in response to the first threshold and the second threshold being met.

21 Claims, 14 Drawing Sheets

(51) Int. Cl.
*H03K 19/21* (2006.01)
*G05F 1/575* (2006.01)

(56) References Cited

U.S. PATENT DOCUMENTS

| | | | | |
|---|---|---|---|---|
| 2009/0268494 A1* | 10/2009 | Hu | .................... | H02M 3/33592 363/89 |
| 2011/0090604 A1* | 4/2011 | Butler | ....................... | G05F 1/44 361/18 |
| 2014/0049853 A1* | 2/2014 | Greene | .................. | G11C 27/02 360/51 |
| 2014/0168843 A1* | 6/2014 | Privitera | ................ | G01R 31/50 361/93.1 |

OTHER PUBLICATIONS

Texas Instruments, "TPS62840 1.8-V to 6.5-V, 750-mA, 60-nA IQ Step-Down Converter," Jun. 2019—revised Nov. 2019 (41 pages).

* cited by examiner

METHODS AND APPARATUS TO CONTROL SWITCHING OF A SAMPLING CIRCUIT

RELATED APPLICATION

This patent arises from an application claiming the benefit of U.S. Provisional Patent Application Ser. No. 62/814,115, which was filed on Mar. 5, 2019; and U.S. Provisional Patent Application Ser. No. 62/814,122, which was filed on Mar. 5, 2019. U.S. Provisional Patent Application Ser. No. 62/814,115 and U.S. Provisional Patent Application Ser. No. 62/814,122 are hereby incorporated herein by reference in their entireties. Priority to U.S. Provisional Patent Application Ser. No. 62/814,115 and U.S. Provisional Patent Application Ser. No. 62/814,122 is hereby claimed. This patent also incorporates by reference in its entirety U.S. patent application Ser. No. 16/810,560 which is assigned to Texas Instruments Incorporated and entitled "Low Quiescent Current Linear Regulator with Mode Selection Based on Load Current and Fast Transient Detection." The inventors of U.S. patent application Ser. No. 16/810,560 include Keith Edmund Kunz and Joseph Alan Sankman. The attorney docket number of U.S. patent application Ser. No. 16/810,560 is TI-90769.

FIELD OF THE DISCLOSURE

This disclosure relates generally to sample-and-hold circuits, and, more particularly, to methods and apparatus to control switching of a sampling circuit.

BACKGROUND

Many electronic devices (such as wearable electronics, cell phones, Internet of Things (IoT) devices, wireless devices, sensors, and other battery-operated devices) rely on one or more reference voltages to operate. For example, low-dropout (LDO) regulators are a type of linear voltage regulators that compare a stepped down output voltage to a reference voltage. Based on the comparison between the stepped down output voltage and the reference voltage, the LDO regulator adjusts the drive signal to a switch. Some circuit designers utilize sample-and-hold (S/H) circuits to generate reference voltages.

Figure 1:
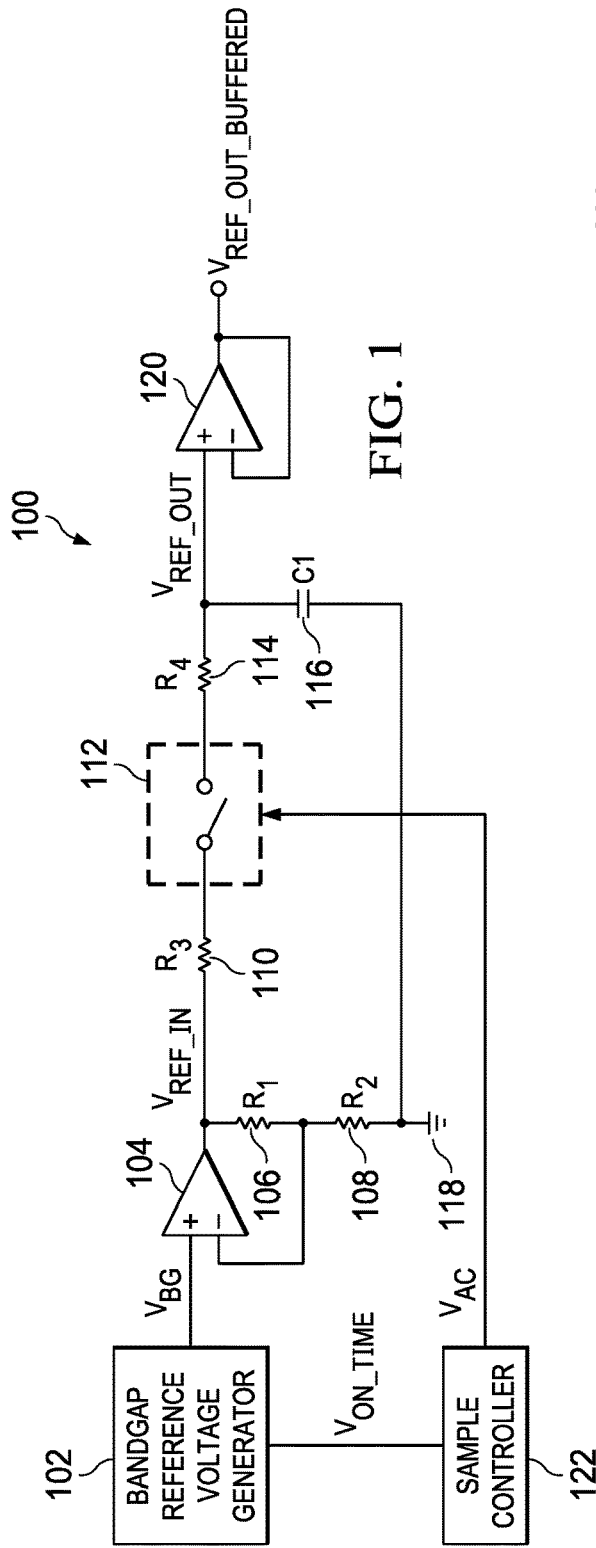
FIG. 1 is a schematic illustration of an example sample-and-hold circuit.

The figures are not to scale. In general, the same reference numbers will be used throughout the drawing(s) and accompanying written description to refer to the same or like parts. As used herein, connection references (e.g., attached, coupled, connected, and joined) are to be construed in light of the specification and, when pertinent, the surrounding claim language. Construction of connection references in the present application shall be consistent with the claim language and the context of the specification which describes the purpose for which various elements are connected. As such, connection references do not necessarily infer that two elements are directly connected and in fixed relation to each other.

Descriptors first, second, third, etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor first may be used to refer to an element in the detailed description, while the same element may be referred to in a claim with a different descriptor such as second or third. In such instances, it should be understood that such descriptors are used merely for ease of referencing multiple elements or components.

DETAILED DESCRIPTION

A low-dropout (LDO) regulator controls an output voltage based on a comparison between a stepped down output voltage and a reference voltage. Based on the comparison between the stepped down output voltage and the reference voltage, the LDO regulator adjusts a drive signal to a switch.

In ultra-low power systems, circuit designers rely on reducing average power consumption of a circuit. To reduce the power consumption in circuits utilizing LDO regulators, some circuit designers utilize sample-and-hold (S/H) circuits to generate reference voltages for LDO regulators. S/H circuits are advantageous because they can help reduce the average power consumption in a circuit. For example, an S/H circuit can sample the initial reference voltage and then hold (e.g., store) the voltage value for use by another circuit (e.g., via a capacitor). Thus, power is not consumed in continuously generating the reference voltage.

FIG. 1 is a schematic illustration of an example sample-and-hold (S/H) circuit 100. The S/H circuit 100 includes an example bandgap reference voltage generator 102, an example first operational amplifier 104, an example first resistor 106 ($R_1$), an example second resistor 108 ($R_2$), an example third resistor 110 ($R_3$), an example switch 112, an example fourth resistor 114 ($R_4$), an example capacitor 116 ($C_1$), an example ground node 118, an example second operational amplifier 120, and an example sample controller 122. In the example of FIG. 1, the sample controller 122 controls conduction of the switch 112 to generate a reference voltage at an output reference voltage node $V_{REF\_OUT}$.

In the illustrated example of FIG. 1, the bandgap reference voltage generator 102 is coupled to an inverting input of the first operational amplifier 104 and the sample controller 122. A non-inverting input of the first operational amplifier 104 is coupled between the first resistor 106 ($R^1$) and the second resistor 108 ($R_2$). The first resistor 106 ($R_1$) is coupled between an output of the first operational amplifier 104, the third resistor 110 ($R_3$), and the second resistor 108 ($R^2$). The second resistor 108 ($R^2$) is coupled between the first resistor 106 ($R_1$), the non-inverting input of the first operational amplifier 104, and the ground node 118. The third resistor 110 ($R_3$) is coupled between the output of the first operational amplifier 104, the first resistor 106 ($R_1$), and the switch 112.

In the example illustrated in FIG. 1, the bandgap reference voltage generator 102 is coupled to the inverting input of the first operational amplifier 104 to provide the operational amplifier with a bandgap reference voltage $V_{BG}$. The bandgap reference voltage generator 102 is coupled to the sample controller 122 to synchronize on-time operation of the S/H circuit 100. For example, the bandgap reference voltage generator 102 can be enabled by the on-time signal $V_{ON\_TIME}$ generated by the sample controller 122. The bandgap reference voltage generator 102 can be implemented by one or more transistors (e.g., bipolar junction transistors (BJTs), metal-oxide field-effect-transistors (MOSFETs), junction gate field-effect-transistors (JFETs), etc.), one or more resistors, and/or one or more operational amplifiers. In operation, the bandgap reference voltage generator 102 generates a voltage $V_{BG}$ less than 5 volts (e.g., preferably around 1.2 volts (V)).

In the illustrated example of FIG. 1, the first operational amplifier 104 includes a non-inverting input and an inverting input. The non-inverting input of the first operation amplifier 104 is coupled to the bandgap reference voltage generator 102 to amplify (e.g., scale) the bandgap reference voltage $V_{BG}$. The inverting input of the first operational amplifier 104 is coupled between the first resistor 106 ($R_1$) and the second resistor 108 ($R_2$) to receive a voltage representative of the voltage at the output of the first operational amplifier 104. In operation, the first operational amplifier 104 generates the voltage at an input reference voltage node $V_{REF\_IN}$. The first operational amplifier 104 can adjust the voltage at the input reference voltage node $V_{REF\_IN}$ to ensure the voltage at the inverting input of the first operational amplifier 104 is within a threshold of the voltage at the non-inverting input of the first operational amplifier 104.

In the example illustrated in FIG. 1, the first resistor 106 ($R_1$) and the second resistor 108 ($R_2$) are coupled together to form a voltage divider circuit. Together, the first resistor 106 ($R_1$) and the second resistor 108 ($R_2$) step-down the voltage at the output of the first operational amplifier 104. (e.g., $V_{REF\_IN}$). The values of the first resistor 106 ($R_1$) and the second resistor 108 ($R_2$) control the gain of the first operational amplifier 104 such that $$V_{REF\_IN} = V_{BG} * \frac{R_1 + R_2}{R_2}.$$

In the illustrated example of FIG. 1, the third resistor 110 ($R_3$) is coupled between the first operational amplifier 104, the first resistor 106 ($R_1$) and the switch 112 to filter noise in the voltage at the input reference voltage node $V_{REF\_IN}$. In the example of FIG. 1, the noise in the signal at the input reference voltage node $V_{REF\_IN}$ is generated by the bandgap reference voltage generator 102 and the first operational amplifier 104.

In the example illustrated in FIG. 1, the switch 112 is coupled between the third resistor 110 ($R_3$) and the fourth resistor 114 ($R_4$) to control the conduction of current between the input reference voltage node $V_{REF\_IN}$ and the output reference voltage node $V_{REF\_OUT}$. Additionally, the switch 112 is coupled to the sample controller 122 to facilitate control of the switch 112 to sample the voltage at the input reference voltage node $V_{REF\_IN}$. In FIG. 1, the switch 112 includes an n-channel MOSFET. In other examples, the switch 112 may be implemented by any number of n-channel MOSFETs (NMOS transistors), p-channel MOSFETs (PMOS transistors), JFETs, BJTs, and/or any other transistor suitable to a desired application. In FIG. 1, the switch 112 is controlled by the acquisition signal $V_{AC}$ generated by the sample controller 122.

In the illustrated example of FIG. 1, the fourth resistor 114 ($R_4$) is coupled between the switch 112, the capacitor 116 ($C_1$), and a non-inverting input of the second operational amplifier 120 to filter noise in the voltage at the input reference voltage node $V_{REF\_IN}$. The capacitor 116 ($C_1$) is coupled between the fourth resistor 114 ($R_4$), the non-inverting input of the second operational amplifier 120, and the ground node 118 to filter noise in the voltage at the input reference voltage node $V_{REF\_IN}$. Together, the third resistor 110 ($R_3$), the fourth resistor 114 ($R_4$), and the capacitor 116 ($C_1$) form a resistor capacitor (RC) filter that filters the voltage at the input reference voltage node $V_{REF\_IN}$ to generate the voltage at the output reference voltage node $V_{REF\_OUT}$ when the switch 112 is conducting. The RC filter formed by the third resistor 110 ($R_3$), the fourth resistor 114 ($R_4$), and the capacitor 116 ($C_1$) includes a time constant, $\tau$, equivalent to the sum of the resistance of the third resistor 110 ($R_3$) and the resistance of the fourth resistor 114 ($R_4$) multiplied by the capacitance of the capacitor 116 ($C_1$) (e.g., $\tau=(R_3+R_4)*C_1$).

In the illustrated example of FIG. 1, the second operational amplifier 120 includes a non-inverting input and an inverting input. The non-inverting input of the second operation amplifier 120 is coupled to the output voltage reference node $V_{REF\_OUT}$ to receive the voltage at the voltage at the output voltage reference node $V_{REF\_OUT}$. The inverting input of the second operational amplifier 120 is coupled to the output of the second operational amplifier and the buffered output reference voltage node $V_{REF\_OUT\_BUFFERED}$. In operation, the second operational amplifier 120 generates the voltage at the buffered output reference voltage node $V_{REF\_OUT\_BUFFERED}$. The second operational amplifier 120 can adjust the voltage at the buffered output reference voltage node $V_{REF\_OUT\_BUFFERED}$ to ensure the voltage at the non-inverting input of the second operational amplifier 120 is within a threshold of the voltage at the inverting input of the second operational amplifier 120. The voltage at the buffered output reference voltage node $V_{REF\_OUT\_BUFFERED}$ is equal to the voltage at the output reference voltage node $V_{REF\_OUT}$ The voltage at the output reference voltage node $V_{REF\_OUT}$ is equal to the voltage at the input reference voltage node $V_{REF\_IN}$ minus the voltage drop across the third resistor 110 ($R_3$) and the voltage drop across the fourth resistor 114 ($R_4$) (e.g., $V_{REF\_OUT\_BUFFERED}=V_{REF\_OUT}=V_{REF\_IN}-V_{R_3}-V_{R_4}$). In some examples, there is minimal (e.g., negligible) voltage drop across the third resistor 110 ($R_3$) and the fourth resistor 114 ($R_4$).

In the example illustrated in FIG. 1, the sample controller 122 is coupled to the switch 112 to control conduction of the switch 112 to sample the voltage at the input reference voltage node $V_{REF\_IN}$. The sample controller 122 is coupled to the bandgap reference voltage generator 102 to synchronize on-time operation of the S/H circuit 100. The sample controller 122 generates the on-time signal $V_{ON\_TIME}$ to control the operation of the S/H circuit 100. For example, if the sample controller 122 generates a logic high value (e.g., 5 volts, a binary one, etc.) as the on-time signal $V_{ON\_TIME}$, the S/H circuit 100 will be enabled. Alternatively, if the sample controller 122 generates a logic low value (e.g., 0 volts, a binary zero, etc.) as the on-time signal $V_{ON\_TIME}$, the S/H circuit 100 will be disabled.

In the illustrated example of FIG. 1, the sample controller 122 generates the acquisition signal $V_{AC}$ to control the switch 112. For example, if the sample controller 122 generates a logic low value (e.g., 0 volts, a binary zero, etc.) as the acquisition signal $V_{AC}$, the switch 112 will be disabled. Alternatively, if the sample controller 122 generates a logic high value (e.g., 5 volts, a binary one, etc.) as the acquisition signal $V_{AC}$, the switch 112 will be enabled. When the sample controller 122 enables the switch 112, the capacitor 116 ($C_1$) charges to the voltage at the output reference voltage node $V_{REF\_OUT}$. In some examples, when there is no voltage drop across the third resistor 110 ($R_3$) and the fourth resistor 114 ($R_4$), the capacitor 116 ($C_1$) charges to the voltage at the input reference voltage node $V_{REF\_IN}$. In operation, the sample controller 122 enables the switch 112 when the bandgap reference voltage generator 102 generates the bandgap reference voltage $V_{BG}$ and disables the switch 112 after the capacitor 116 ($C_1$) has charged to the voltage at the output reference voltage node $V_{REF\_OUT}$. In some examples, the sample controller 122 can operate based on a clock signal, CLK, generated by an oscillator and/or other clock generating circuitry.

While S/H circuits can reduce power consumption by storing a reference voltage (e.g., via a capacitor), S/H circuits (e.g., the S/H circuit 100) still consume power when sampling a voltage to store as a reference voltage (e.g., the voltage at the input reference voltage node $V_{REF\_IN}$). Thus, reducing power consumption while ensuring an adequate sampling time of S/H circuits is desirable. For example, by reducing the time that the switch 112 is enabled, the power consumption of the S/H circuit 100 can be reduced. Additionally, ensuring an adequate time period during which the switch 112 is enabled can lead to better performance of the S/H circuit 100 (e.g., reduced voltage ripple from sample to sample).

Some circuit designers utilize a fixed on-time to off-time ratio (e.g., a fixed duty cycle) to reduce power consumption. While a fixed on-time generally does not vary across process, voltage, and temperature (PVT), the biasing current $I_{BIAS}$ of the scaling amplifier (e.g., the first operational amplifier 104) can vary across PVT as well as the slew rate of the bandgap reference voltage generator (e.g., the bandgap reference voltage generator 102). The result is that even with a fixed duty cycle, the settling time varies. To solve this problem, circuit designers set the on-time to be longer to ensure accuracy and to reduce ripple on at the output reference voltage node (e.g., the output reference voltage node $V_{REF\_OUT}$). Thus, the average power consumption of an S/H circuit (e.g., the S/H circuit 100) varies across PVT and is greater due to the longer fixed on-time. Additionally, the variation in the acquisition time can lead to errors generated by the S/H circuit 100. The sum of the errors generated by the S/H circuit 100 is equivalent to the difference between the settled voltage at the input reference voltage node $V_{REF\_IN}$ and the voltage at the output reference voltage node $V_{REF\_OUT}$ (e.g., $E_{S/H}=V_{REF\_IN}$ (settled)$-V_{REF\_OUT}$).

Figure 2:
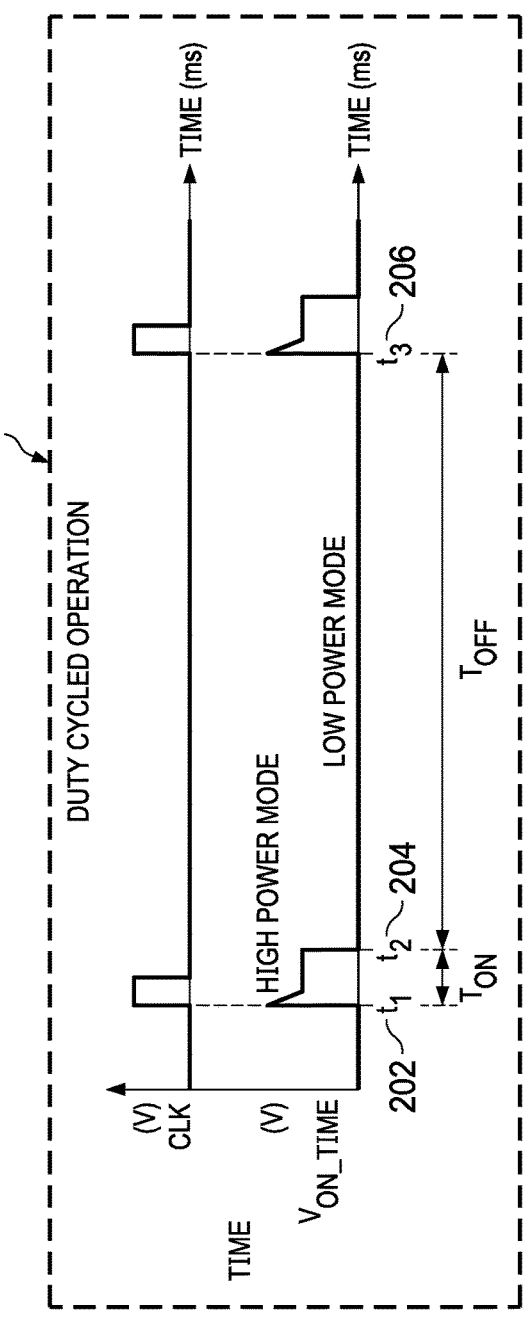
FIG. 2 is a graphical illustration depicting the example on-time signal of the sample-and hold circuit of FIG. 1.

FIG. 2 is a graphical illustration 200 depicting the example on-time signal $V_{ON\_TIME}$ of the sample-and hold circuit 100 of FIG. 1. The graphical illustration 200 is a timing diagram including two plots. The timing diagram of the graphical illustration 200 includes a plot of a clock signal, CLK, in volts versus time in milliseconds (ms) and a plot of the on-time signal $V_{ON\_TIME}$ in volts versus time in ms. The timing diagram of the graphical illustration 200 includes a first time 202 ($t_1$), a second time 204 ($t_2$), and a third time 206 ($t_3$).

The period between the first time 202 ($t_1$) and the second time 204 ($t_2$) is the on-time, $T_{ON}$. During the on-time, $T_{ON}$, the S/H circuit 100 is enabled and consumes power (e.g., on-time power, $P_{ON}$). The period between the second time 204 ($t_2$) and the third time 206 ($t_3$) is the off time, $T_{OFF}$. During the off time, $T_{OFF}$, the S/H circuit 100 is disabled and does not consume power (e.g., off time power, $P_{OFF}$). The frequency of the clock signal, CLK, can be determined as the inverse of the sum on the on-time, $T_{ON}$, and the off time, $T_{OFF}$ (e.g., $$\left(e.g., f_{CLK} = \frac{1}{T_{ON} + T_{OFF}}\right).$$

the average power consumed by the S/H circuit 100 can be determined as the product of the frequency of the clock signal, CLK, the on-time, $T_{ON}$, and the on-time power, $P_{ON}$, or the product of the duty cycle and the on-time power, $P_{ON}$ (e.g.

$$\left(e.g., P_{avg} = \frac{T_{ON}}{T_{ON} + T_{OFF}} * P_{ON} = D * P_{ON}\right).$$

Figure 3:
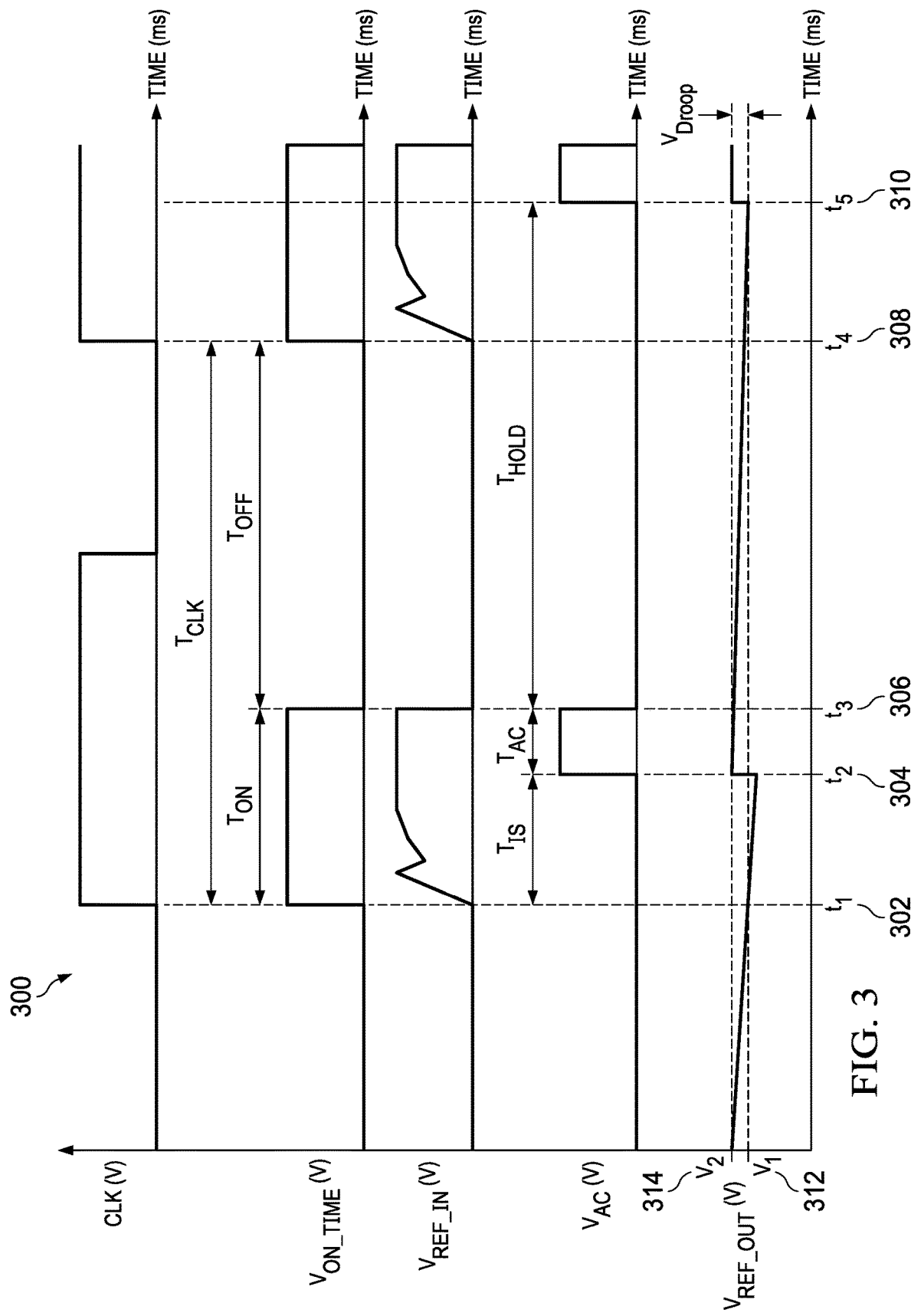
FIG. 3 is a graphical illustration depicting various time periods associated with the operation of the sample-and-hold circuit of FIG. 1.

FIG. 3 is a graphical illustration 300 depicting various time periods associated with the operation of the sample-and-hold (S/H) circuit 100 of FIG. 1. The graphical illustration 300 is a timing diagram including five plots. The timing diagram of the graphical illustration 300 includes a plot of a clock signal, CLK, in volts versus time in ms, a plot of the on-time signal $V_{ON\_TIME}$ in volts versus time in ms, a plot of the voltage at the input reference voltage node $V_{REF\_IN}$ in volts versus time is ms, a plot of the acquisition signal $V_{AC}$ in volts versus time in ms, and a plot of the voltage at the output reference voltage node $V_{REF\_OUT}$ in volts versus time in ms. The timing diagram of the graphical illustration 300 includes a first time 302 ($t_1$), a second time 304 ($t_2$), a third time 306 ($t_3$), a fourth time 308 ($t_4$), and a fifth time 310 ($t_5$). The fifth plot includes a first voltage 312 ($V^1$) and a second voltage 314 ($V^2$).

The period between the first time 302 ($t_1$) and the second time 304 ($t_2$) is the input settling time, $T_{IS}$. During the input settling time, $T_{IS}$, the voltage at the output of the first operational amplifier 104 is rising to within a threshold of a target input reference voltage. The period between the second time 304 ($t_2$) and the third time 306 ($t_3$) is the acquisition time, $T_{AC}$. During the acquisition time, $T_{AC}$, the switch 112 is enabled and the capacitor 116 ($C_1$) charges to the voltage at the output reference voltage node $V_{REF\_OUT}$. The period between the first time 302 ($t_1$) and the third time 306 ($t_3$) is the on-time, $T_{ON}$, of the S/H circuit 100. As such, the on-time, $T_{ON}$, is the sum of the input settling time, $T_{IS}$, and the acquisition time, $T_{AC}$.

The period between the third time 306 ($t_3$) and the fourth time 308 ($t_4$) is the off time, $T_{OFF}$. During the off time, $T_{OFF}$, the S/H circuit 100 is disabled and does not consume power. The period between the third time 306 ($t_3$) and the fifth time 310 ($t_5$) is the hold time, $T_{HOLD}$. During the hold time, $T_{HOLD}$, the capacitor 116 ($C_1$) maintains (e.g., holds) the reference voltage at the output reference voltage node $V_{REF\_OUT}$. Additionally, during the hold time, $T_{HOLD}$, the switch 112 is disabled. However, due to leakage of the switch 112 and/or the capacitor 116 ($C_1$), the voltage maintained by the capacitor 116 ($C_1$) decreases (e.g., droops) from the second voltage 314 ($V_2$) to the first voltage 312 ($V_1$) (e.g., $V_{DROOP}=V_2-V_1$).

Figure 4:
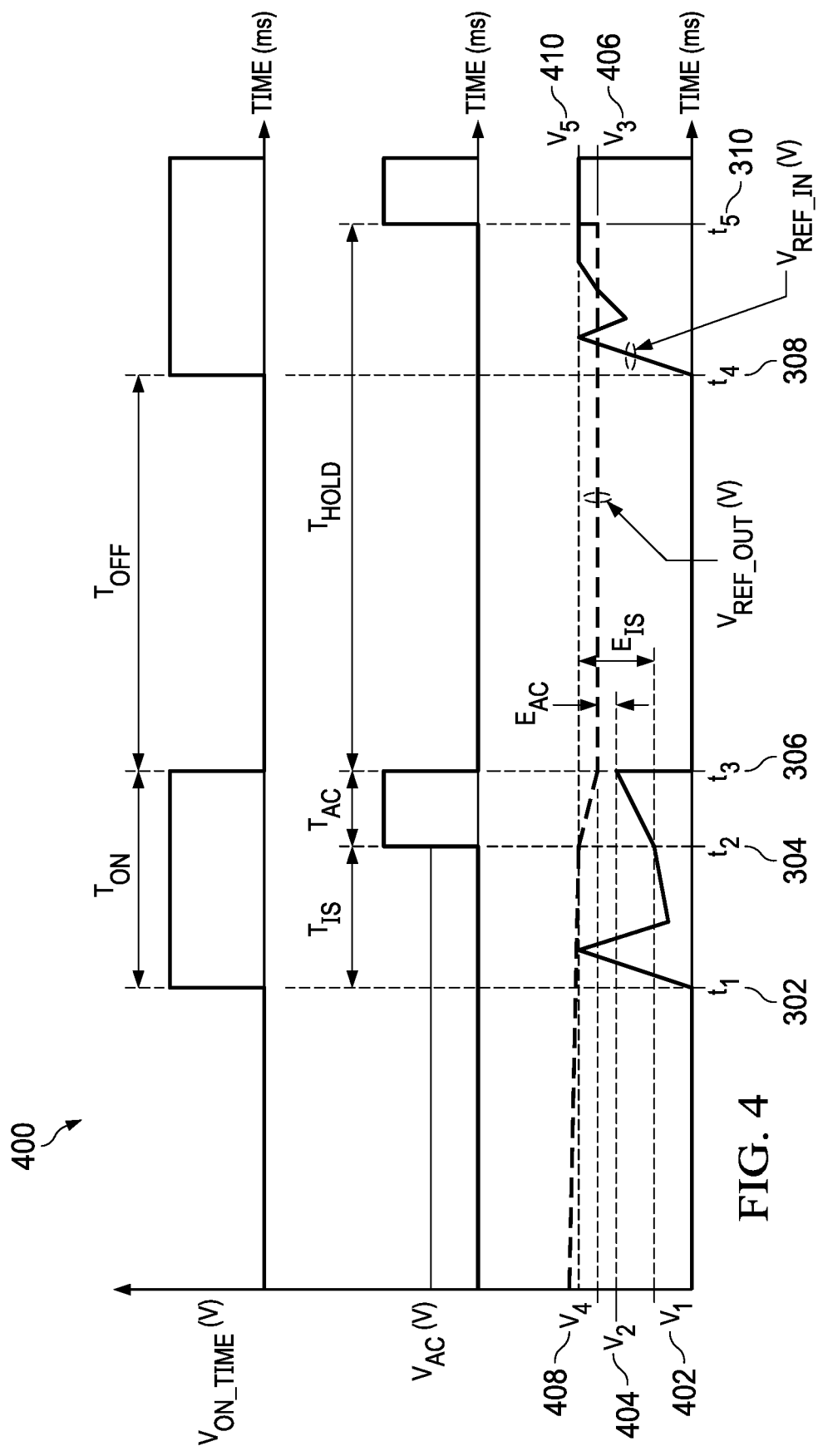
FIG. 4 is a graphical illustration depicting respective errors resulting from the various time periods depicted in the graphical illustration of FIG. 3.

FIG. 4 is a graphical illustration depicting respective errors resulting from the various time periods depicted in the graphical illustration 300 of FIG. 3. The graphical illustration 400 is a timing diagram including three plots. The timing diagram of the graphical illustration 400 includes a plot of the on-time signal $V_{ON\_TIME}$ in volts versus time in ms, a plot of the acquisition signal $V_{AC}$ in volts versus time in ms, and a plot of the voltage at the input reference voltage node $V_{REF\_IN}$ in volts and the voltage at the output reference voltage node $V_{REF\_OUT}$ in volts versus time in ms. The timing diagram of the graphical illustration 400 includes the first time 302 ($t_1$), the second time 304 ($t_2$), the third time 306 ($t_3$), the fourth time 308 ($t_4$), and the fifth time 310 ($t_5$). The third plot includes a first voltage 402 ($V_1$), a second voltage 404 ($V_2$), a third voltage 406 ($V_3$), a fourth voltage 408 ($V_4$), and a fifth voltage 410 ($V_5$).

The input settling time error, $E_{IS}$ (e.g., the error associated with the settling time of the voltage at the output of the first operational amplifier 104), is dependent upon the bandgap reference voltage generator 102 and the first operational amplifier 104. The input settling time error, $E_{IS}$, is equivalent to the difference between the fifth voltage 410 ($V_5$) and the first voltage 402 ($V^1$) (e.g., $E_{IS}=V_5-V_1$). The acquisition error, $E_{AC}$ (e.g., the error associated with sampling the voltage at the input reference voltage node $V_{REF\_IN}$), is dependent on (a) the duration during which the voltage at the input reference voltage node $V_{REF\_IN}$ is sampled and (b) the time constant of the RC filter. The acquisition error, $E_{AC}$, is equivalent to the difference between the fourth voltage 408 ($V_4$) and the second voltage 404 ($V_2$) (e.g., $E_{AC}=V_4-V_2$). The voltage droop error, $E_{DR}$ (e.g., the error associated with the loss in the voltage maintained by the capacitor 116 ($C_1$), is dependent on the frequency of the acquisition signal $V_{AC}$ and the leakage of the switch 112 as well as the capacitance of the capacitor 116 ($C_1$). The voltage droop error, $E_{DR}$, is equivalent to the difference between the fifth voltage 410 ($V_5$) and the third voltage 406 ($V_3$) (e.g., $E_{DR}=V_5-V_3$).

Figure 5A:
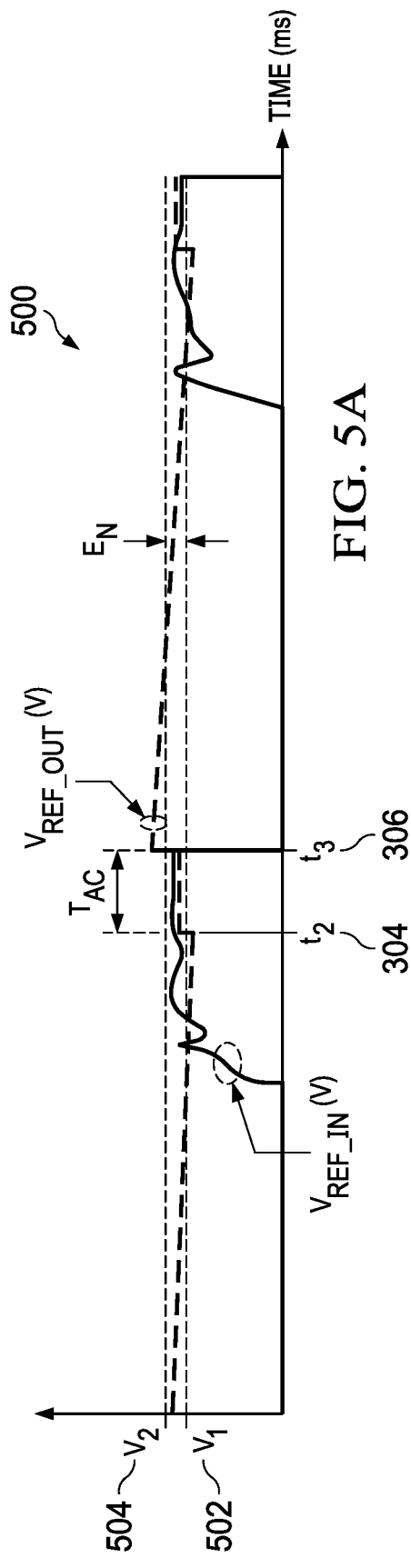
FIG. 5A is a graphical illustration depicting additional errors associated with the operation of the sample-and-hold circuit of FIG. 1.

FIG. 5A is a graphical illustration 500 depicting additional errors associated with the operation of the sample-and-hold (S/H) circuit 100 of FIG. 1. The graphical illustration 500 is a timing diagram including two plots. The timing diagram of the graphical illustration 500 includes a plot of the voltage at the input reference voltage node $V_{REF\_IN}$ in volts and the voltage at the output reference voltage node $V_{REF\_OUT}$ in volts versus time in ms. The timing diagram of the graphical illustration 500 includes the second time 304 ($t_2$) and the third time 306 ($t_3$). The plot includes a first voltage 502 ($V_1$) and a second voltage 504 ($V_2$). The input noise error, $E_N$ (e.g., the error associated with noise in the voltage at the output of the first operational amplifier 104), is dependent upon the noise on the bandgap voltage $V_{BG}$ generated by the bandgap reference voltage generator 102 and the noise generated by the first operational amplifier 104. The input noise error, $E_N$, can be filtered (e.g., by tuning the RC filter of the S/H circuit 100) but doing so can increase the acquisition time of the S/H circuit 100.

Figure 5B:
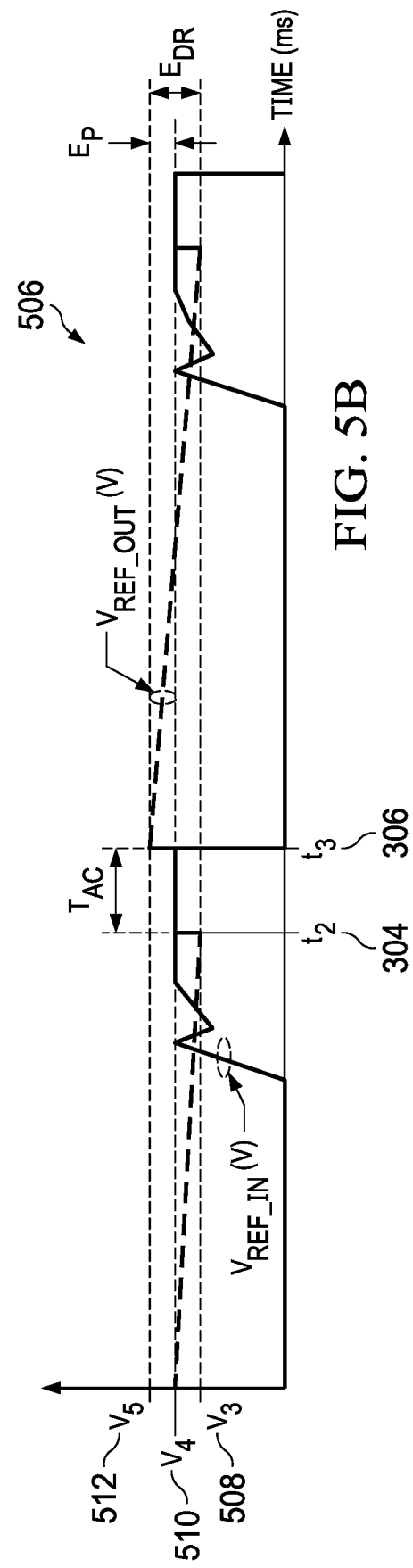
FIG. 5B is a graphical illustration depicting additional errors associated with the operation of the sample-and-hold circuit of FIG. 1.

FIG. 5B is a graphical illustration 506 depicting additional errors associated with the operation of the sample-and-hold (S/H) circuit 100 of FIG. 1. The graphical illustration 506 is a timing diagram including two plots. The timing diagram of the graphical illustration 506 includes a plot of the voltage at the input reference voltage node $V_{REF\_IN}$ in volts and the voltage at the output reference voltage node $V_{REF\_OUT}$ in volts versus time in ms. The timing diagram of the graphical illustration 506 includes the second time 304 ($t_2$) and the third time 306 ($t_3$). The plot includes a third voltage 508 ($V_3$), a fourth voltage 510 ($V_4$), and a fifth voltage 512 ($V_5$). The pedestal error, $E_P$, is error associated with charge injection to the capacitor 116 ($C_1$) during the hold time, $T_{HOLD}$. The voltage droop error, $E_{DR}$, is dependent on the frequency of the acquisition signal, $V_{AC}$, the leakage of the switch 112, and the capacitance of the capacitor 116 ($C_1$).

Figure 6:
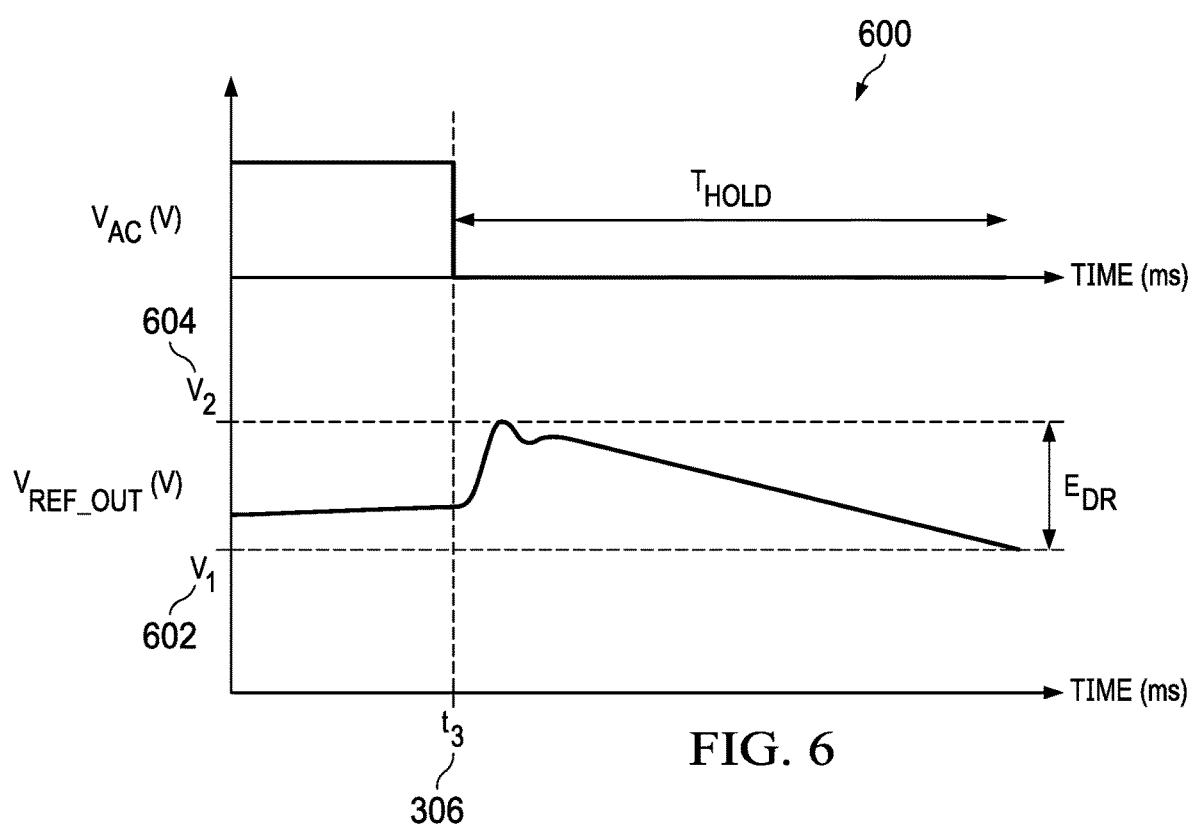
FIG. 6 is a graphical illustration depicting additional detail of the voltage droop error associated with the operation of the sample-and-hold circuit of FIG. 1.

FIG. 6 is a graphical illustration 600 depicting additional detail of the voltage droop error, $E_{DR}$, associated with the operation of the sample-and-hold circuit 100 of FIG. 1. The graphical illustration 600 is a timing diagram including two plots. The timing diagram of the graphical illustration 600 includes a plot of the acquisition signal, $V_{AC}$, in volts versus time in ms and a plot of the voltage at the output reference voltage node $V_{REF\_OUT}$ in volts versus time in ms. The timing diagram of the graphical illustration 600 includes the third time 306 ($t_3$), a first voltage 602 ($V_1$), and a second voltage 604 ($V_2$). At the third time 306 ($t_3$), the acquisitions signal, $V_{AC}$, falls from a logic high value to a logic low value. Additionally, at the third time 306 ($t_3$), the hold time, $T_{HOLD}$, begins. The voltage droop error, $E_{DR}$, is dependent on the frequency of the acquisition signal, $V_{AC}$, the leakage of the switch 112, and the capacitance of the capacitor 116 ($C_1$). For example, the voltage droop error, $E_{DR}$, can be represented as the quotient of the net leakage current flowing into and/or out of the capacitor 116 ($C_1$) and the product of the capacitance of the capacitor 116 ($C_1$) and the frequency of the acquisition signal, $V_{AC}$ (e.g., (e.g., $E_{DR} = \frac{I_{LKG}}{f_{AC} * C_1}$).

The S/H circuit 100, discussed in connection with FIGS. 1-6, is susceptible to numerous errors. The errors generated by the S/H circuit 100 are due to a variety of factors including the settling time of the bandgap reference voltage generator 102, the settling time of the first operational amplifier 104, the duration during which the voltage at the input reference voltage node $V_{REF\_IN}$ is sampled, the time constant of the RC filter of the S/H circuit 100, the frequency of the acquisition signal $V_{AC}$, the leakage of the switch 112, the capacitance of the capacitor 116 ($C_1$), the noise on the bandgap voltage $V_{BG}$ generated by the bandgap reference voltage generator 102, the noise generated by the first operational amplifier 104, and charge injection error from opening the switch 112. The sum of the errors generated by the S/H circuit 100 is equivalent to the sum of the input settling time error, $E_{IS}$, the acquisition error, $E_{AC}$, the voltage droop error, $E_{DR}$, and the input noise error, $E_N$ (e.g., $E_{S/H}=E_{Is}+E_{AC} E_{DR} E_N+E_P$).

Example methods and apparatus to control switching of a sampling circuit are disclosed. Examples disclosed herein reduce the average power consumption of S/H circuits across process, voltage, and temperature (PVT). Additionally, examples disclosed herein reduce the average quiescent current $I_{q\_vg}$ of S/H circuits across PVT. Without intervention by circuit design, there exists an inverse relationship between quiescent current $I_q$, input noise to an S/H circuit, and errors generated by an S/H circuit. That is, without designing to overcome this relationship, as the quiescent current $I_q$ is reduced, the input noise to and errors generated by an S/H circuit can increase. Advantageously, the example methods, apparatus, and articles of manufacture disclosed herein reduce the average quiescent current $I_{q\_avg}$ of S/H circuits while at the same time reducing errors generated by S/H circuits. For example, the disclosed methods, apparatus, and articles of manufacture allow for a larger RC filter at the output reference voltage node $V_{REF\_OUT}$, which reduces noise and allows for improved trade-off between the input noise error, $E_N$, and the acquisition error, $E_{AC}$. Examples disclosed herein reduce at least the acquisition error and settling time error which are a large factor in the sum of the errors generated by S/H circuits.

Figure 7:
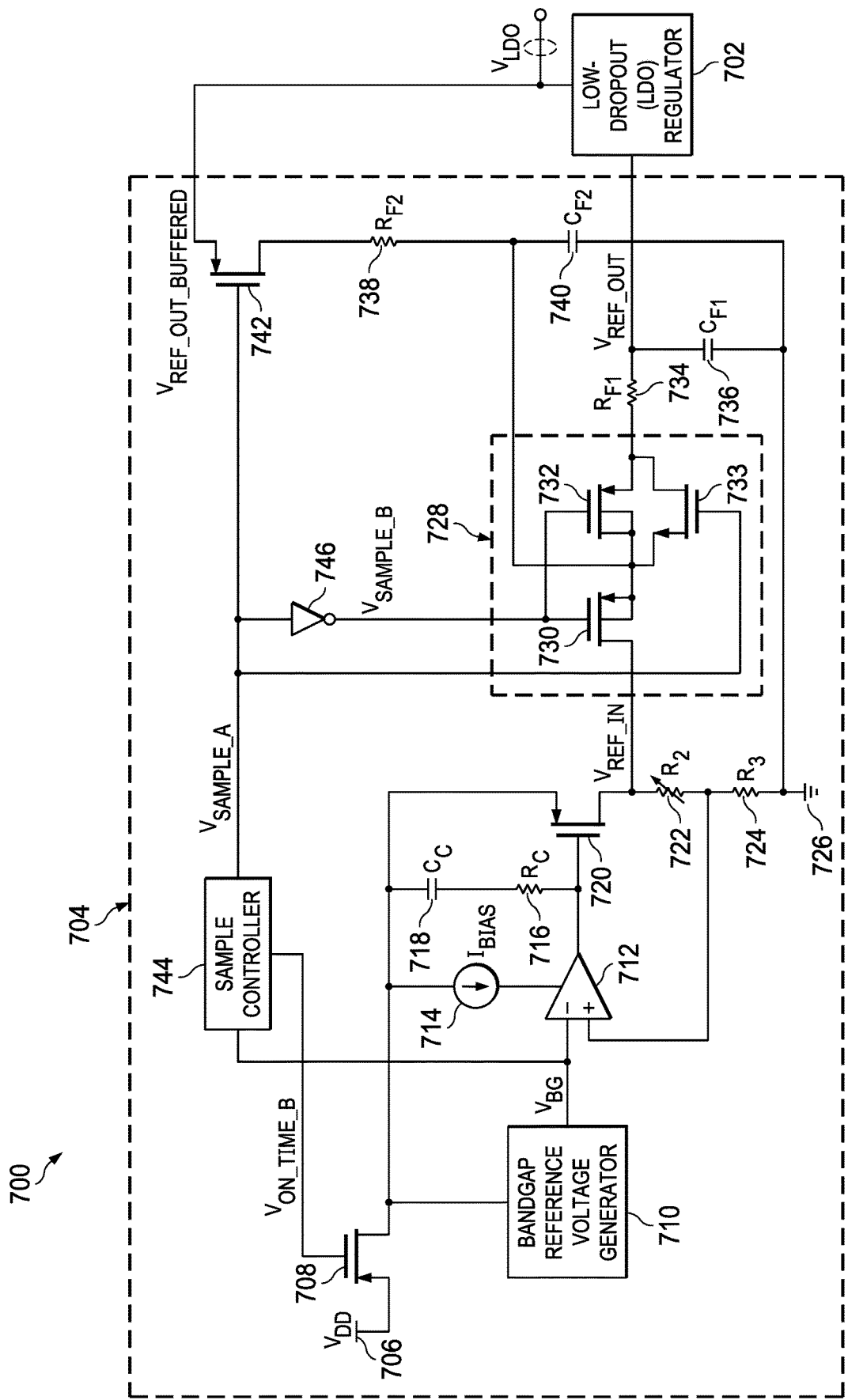
FIG. 7 is a schematic illustration of an example system including an example low-dropout regulator and an example sample-and-hold circuit.

FIG. 7 is a schematic illustration of an example system 700 including an example low-dropout (LDO) regulator 702 and an example sample-and-hold (S/H) circuit 704. The LDO regulator 702 is a linear voltage regulator that compares an output voltage to a reference voltage. The S/H circuit 704 samples a voltage at an input reference voltage node $V_{REF\_IN}$ and maintains that voltage at an output reference voltage node $V_{REF\_OUT}$.

In the illustrated example of FIG. 7, the LDO regulator 702 includes an input and an output. In the example of FIG. 7, one or more reference voltages of the LDO regulator 702 are generated by the S/H circuit 704. For example, the input of the LDO regulator 702 can be coupled to an output of the S/H circuit 704 at the output reference voltage node $V_{REF\_OUT}$ to obtain a reference voltage. The output of the LDO regulator 702 can be coupled to an input of the S/H circuit 704 at a buffered output reference voltage node $V_{REF\_OUT\_BUFFERED}$ to provide a buffered reference voltage (e.g., the LDO output voltage, $V_{LDO}$) to the S/H circuit 704. Additionally, for example, the output of the LDO regulator 702 can be coupled to one or more additional circuits. The LDO regulator 702 generates the LDO output voltage, $V_{LDO}$. The LDO regulator 702 can be implemented by one or more operational amplifiers, one or more resistors, one or more current limiters, one or more under voltage lockout controllers, ones or more thermal controllers, and/or one or more active discharge controllers. In some examples, the LDO regulator 702 can be implemented by any circuit suitable to a desired application to buffer the voltage at the output reference voltage node $V_{REF\_OUT}$ or a scaled version of the voltage at the output reference voltage node $V_{REF\_OUT}$.

In the example illustrated in FIG. 7, the S/H circuit 704 includes an input and an output. The output of the S/H circuit 704 can be coupled to the LDO regulator 702 to provide one or more reference voltages to the LDO regulator 702. For example, the output of the S/H circuit 704 can be coupled to the input of the LDO regulator 702 at the output reference voltage node $V_{REF\_OUT}$ to provide the LDO regulator 702 with a reference voltage. Additionally, for example, the input of the S/H circuit 704 can be coupled to the output of the LDO regulator 702 at the buffered output reference voltage node $V_{REF\_OUT\_BUFFERED}$ to obtain a buffered reference voltage from the LDO regulator 702.

In the illustrated example of FIG. 7, the S/H circuit 704 includes an example voltage supply node 706 ($V_{DD}$), an example power control switch 708, an example bandgap reference voltage generator 710, an example operational amplifier 712, an example biasing current source 714, an example first feedback resistor 716 ($R_C$), an example compensation capacitor 718 ($C_C$), an example first switch 720, and example second feedback resistor 722 ($R_2$), an example third feedback resistor 724 ($R_3$), an example ground node 726, an example sampling switch 728, an example second switch 730, an example third switch 732, an example fourth switch 733, an example first filter resistor 734 ($R_{F1}$), an example first filter capacitor 736 ($C_{F1}$), an example second filter resistor 738 ($R_{F2}$), an example second filter capacitor 740 ($C_{F2}$), an example fifth switch 742, an example sample controller 744, and an example inverter 746. In the example of FIG. 7, the sample controller 744 controls conduction of the sampling switch 728 the second switch 730, the third switch 732, the fourth switch 733, and/or the fifth switch 742 to generate one or more reference voltages at the output reference voltage node $V_{REF\_OUT}$ and/or sample one or more reference voltages at the buffered output reference voltage node $V_{REF\_OUT\_BUFFERED}$.

In the example illustrated in FIG. 7, the power control switch 708 is a PMOS transistor including a source (e.g., a first current terminal), a drain (e.g., a second current terminal), and a gate (e.g., a control terminal). In additional or alternative examples, the power control switch 708 can be implemented by any suitable transistor and/or transistors for a desired application such as NMOS transistors, BJTs, JFETs, etc. The bandgap reference voltage generator 710 includes an input and an output. The bandgap reference voltage generator 710 can be implemented by one or more transistors (e.g., BJTs, MOSFETs, JFETs, etc.), one or more resistors, and/or one or more operational amplifiers. In some examples, the bandgap reference voltage generator 710 can be referred to as a bandgap reference voltage amplifier.

In the illustrated example of FIG. 7, the operational amplifier 712 includes an inverting input, a non-inverting input, a biasing input, and an output. The biasing current source 714 includes a first terminal and a second terminal. In the example of FIG. 7, the biasing current source 714 can be implemented by one or more MOSFETs and one or more resistors (e.g., a Widlar current source and/or variations thereof). In additional or alternative example, the biasing current source 714 can be implemented by one or more MOSFETs, one or more resistors, one or more capacitors, one or more amplifiers, and/or any suitable component that is desirable for an application. The first feedback resistor 716 ($R_C$) includes a first terminal and a second terminal and the compensation capacitor 718 ($C_C$) includes a first terminal and a second terminal. In the example of FIG. 7, the first switch 720 is a PMOS transistor including a source (e.g., a first current terminal), a drain (e.g., a second current terminal), and a gate (e.g., a control terminal). In additional or alternative examples, the first switch 720 can be implemented by any suitable transistor and/or transistors for a desired application such as NMOS transistors, BJTs, JFETs, etc. In the example of FIG. 7, the second feedback resistor 722 ($R_2$) is a variable resistor including a first terminal and a second terminal. In additional or alternative examples, the second feedback resistor 722 ($R_2$) can be implemented by any suitable resistor, resistors, and/or variable resistors for a desired application. The third feedback resistor 724 ($R_3$) includes a first terminal and a second terminal.

In the example illustrated in FIG. 7, the sampling switch 728 includes a first input, a second input, a third input, a fourth input, and an output. In the example of FIG. 7, the sample switch 728 is implemented by the second switch 730, the third switch 732, and the fourth switch 733. The example second switch 730 is a PMOS transistor including a source (e.g., a first current terminal), a drain (e.g., a second current terminal), a gate (e.g., a control terminal), and a back-gate (e.g., a control terminal). The example third switch 732 is a PMOS transistor including a source (e.g., a first current terminal), a drain (e.g., a second current terminal), a gate (e.g., a control terminal) and a back-gate (e.g., a control terminal). The example fourth switch 733 is an NMOS transistor including a source (e.g., a first current terminal), a drain (e.g., a second current terminal), and a gate (e.g., a control terminal). The first input of the sampling switch 728 corresponds to the gate of the second switch 730 and the gate of the third switch 732. The second input of the sampling switch 728 corresponds to the drain of the second switch 730. The third input of the sampling switch 728 corresponds to the gate of the fourth switch 733. The fourth input of the sampling switch 728 corresponds to back-gate of the second switch 730, the source of the second switch 730, the back-gate of the third switch 732, the drain of the third switch 732, and the source if the fourth switch 733. The output of the sampling switch 728 corresponds to the source of the third switch 732 and the drain of the fourth switch 733. In additional or alternative examples, the sampling switch 728 can be implemented by any suitable transistor and/or transistors for a desired application such as NMOS transistors, BJTs, JFETs, etc.

In the illustrated example of FIG. 7, the first filter resistor 734 ($R_{F1}$) includes a first terminal and second terminal and the first filter capacitor 736 ($C_{F1}$) includes a first terminal and a second terminal. For example, the first filter resistor 734 ($R_{F1}$) can be on the order of 10 megaohms (MΩ) and the first filter capacitor 736 ($C_{F1}$) can be on the order of 6 picofarads (pF). The second filter resistor 738 ($R_{F2}$) includes a first terminal and second terminal and the second filter capacitor 740 ($C_{F2}$) includes a first terminal and a second terminal. For example, the second filter resistor 738 ($R_{F2}$) can be on the order of 10 MΩ and the second filter capacitor 740 ($C_{F2}$) can be on the order of 6 pF. In the example of FIG. 7, the fifth switch 742 is a PMOS transistor including a source (e.g., a first current terminal), a drain (e.g., a second current terminal), and a gate (e.g., a control terminal). In additional or alternative examples, the fifth switch 742 can be implemented by any suitable transistor and/or transistors for a desired application such as NMOS transistors, BJTs, JFETs, etc.

In the example illustrated in FIG. 7, the sample controller 744 includes an input, a first output, and a second output. In the example of FIG. 7, the sample controller 744 can be implemented by one or more logic gates, one or more comparators, one or more Schmitt triggers, one or more transistors, one or more current sources, one or more capacitors, and/or one or more oscillators. In additional or alternative examples, the sample controller 744 can be implemented by any number of logic gates, comparators, Schmitt triggers, transistors, current sources, capacitors, oscillators, and/or any other suitable circuit component for a desired application. In the example of FIG. 7, the inverter 746 includes an input and an output and is preferably implemented with an NMOS transistor and a PMOS transistor.

In the illustrated example of FIG. 7, the voltage supply node 706 ($V_{DD}$) is coupled to the source of the power control switch 708. For example, the voltage supply node 706 ($V_{DD}$) is coupled to the source of the power control switch 708 to supply power to the S/H circuit 704. The source of the power control switch 708 is coupled to the voltage supply node 706 ($V_{DD}$). For example, the source of the power control switch 708 can be coupled to the voltage supply node 706 ($V_{DD}$) to receive power to power the S/H circuit 704.

In the example illustrated in FIG. 7, the drain of the power control switch 708 is coupled to the input of the bandgap reference voltage generator 710, the first terminal of the biasing current source 714, the first terminal of the compensation capacitor 718 ($C_C$), and the source of the first switch 720. For example, the drain of the power control switch 708 can be coupled to the input of the bandgap reference voltage generator 710, the first terminal of the biasing current source 714, the first terminal of the compensation capacitor 718 ($C_C$), and the source of the first switch 720 to supply power from the voltage supply node 706 ($V_{DD}$) to the bandgap reference voltage generator 710, the biasing current source 714, the compensation capacitor 718 ($C_C$), and the first switch 720. The gate of the power control switch 708 is coupled to the second output of the sample controller 744. For example, the gate of the power control switch 708 can be coupled to the second output of the sample controller 744 to be enabled and/or disabled based on the voltage of a complimented on-time signal, $V_{ON-TIME\_B}$, generated by the sample controller 744. In some examples, the power control switch 708 can be implemented in any number of ways including an enable and/or disable feature for any number of components of the S/H circuit 704.

In the illustrated example of FIG. 7, the input of the bandgap reference voltage generator 710 is coupled to the drain of the power control switch 708, the biasing current source 714, the compensation capacitor 718 ($C_C$), and the source of the first switch 720. For example, the input of the bandgap reference voltage generator 710 can be coupled to the drain of the power control switch 708, the biasing current source 714, the compensation capacitor 718 ($C_C$), and the source of the first switch 720 to be powered by the voltage at the voltage supply node 706 ($V_{DD}$). The output of the bandgap reference voltage generator 710 is coupled to the inverting input of the operational amplifier 712 and the input of the sample controller 744. For example, the output of the bandgap reference voltage generator 710 can be coupled to the inverting input of the operational amplifier 712 to provide a bandgap reference voltage, $V_{BG}$, to be amplified by the operational amplifier 712. For example, the output of the bandgap reference voltage generator 710 can be coupled to the input of the sampling controller 744 to provide the bandgap reference voltage, $V_{BG}$, to be sampled by the sample controller 744.

In the example illustrated in FIG. 7, the inverting input of the operational amplifier 712 is coupled to the output of the bandgap reference voltage generator 710 and the input of the sample controller 744. The inverting input of the operational amplifier 712 can be coupled to the output of the bandgap reference voltage generator 710 and the input of the sample controller 744 to obtain the bandgap reference voltage, $V_{BG}$. The non-inverting input of the operational amplifier 712 is coupled between the second feedback resistor 722 ($R_2$) and the third feedback resistor 724 ($R_3$). For example, the non-inverting input of the operational amplifier 712 can be coupled between the second feedback resistor 722 ($R_2$) and the third feedback resistor 724 ($R_3$) to set the voltage between the second feedback resistor 722 ($R_2$) and the third feedback resistor 724 ($R_3$) to a voltage within a threshold of the bandgap reference voltage, $V_{BG}$. The biasing input of the operational amplifier 712 is coupled to the second terminal of the biasing current source 714. For example, the biasing input of the operational amplifier 712 can be coupled to the second terminal of the biasing current source 714 to obtain a biasing current, $I_{BIAS}$. The output of the operational amplifier 712 is coupled to the second terminal of the first feedback resistor 716 ($R_C$) and the gate of the first switch 720. For example, the output of the operational amplifier 712 can be coupled to the second terminal of the first feedback resistor 716 ($R_C$) and the gate of the first switch 720 to set the voltage at the second terminal of the first feedback resistor 716 ($R_C$) and the gate of the first switch 720.

In the illustrated example of FIG. 7, the first terminal of the biasing current source 714 is coupled to the drain of the power control switch 708, the first terminal of the compensation capacitor 718 ($C_C$), and the source of the first switch 720. For example, the first terminal of the biasing current source 714 can be coupled to the drain of the power control switch 708, the first terminal of the compensation capacitor 718 ($C_C$), and the source of the first switch 720 to obtain power from the voltage supply node 706 ($V_{DD}$) via the power control switch 708. The second terminal of the biasing current source 714 is coupled to the biasing input of the operational amplifier 712. For example, the second terminal of the biasing current source 714 can be coupled to the biasing input of the operational amplifier 712 to supply the operational amplifier 712 with the biasing current $I_{BIAS}$.

In the example illustrated in FIG. 7, the first terminal of the first feedback resistor 716 ($R_C$) is coupled to the second terminal of the compensation capacitor 718 ($C_C$). The second terminal of the first feedback resistor 716 ($R_C$) is coupled to the output of the operational amplifier 712 and the gate of the first switch 720. For example, the first feedback resistor 716 ($R_C$) can be coupled between the compensation capacitor 718 ($C_C$), the output of the operational amplifier 712, and the gate of the first switch 720 to filter high frequency noise from the voltage at the voltage supply node 706 ($V_{DD}$).

In the illustrated example of FIG. 7, the first terminal of the compensation capacitor 718 ($C_C$) is coupled to the drain of the power control switch 708, the first terminal of the biasing current source 714 and the source of the first switch 720. The second terminal of the compensation capacitor 718 ($C_C$) is coupled to the first terminal of the first feedback resistor 716 ($R_C$). For example, the compensation capacitor 718 ($C_C$) can be coupled between the drain of the power control switch 708, the first terminal of the biasing current source 714, the source of the first switch 720, and the first terminal of the first feedback resistor 716 ($R_C$) to filter high frequency noise from the voltage at the voltage supply node 706 ($V_{DD}$). Together, the first feedback resistor 716 ($R_C$) and the compensation capacitor 718 ($C_C$) form an RC filter.

In the example illustrated in FIG. 7, the source of the first switch 720 is coupled to the drain of the power control switch 708, the input of the bandgap reference voltage generator 710, the first terminal of the biasing current source 714, and the first terminal of the compensation capacitor 718 ($C_C$). For example, the source of the first switch 720 can be coupled to the drain of the power control switch 708, the input of the bandgap reference voltage generator 710, the first terminal of the biasing current source 714, and the first terminal of the compensation capacitor 718 ($C_C$) to receive power from the voltage supply node 706 ($V_{DD}$) via the power control switch 708. The drain of the first switch 720 is coupled to the first terminal of the second feedback resistor 722 ($R_2$) and the drain of the second switch 730 at the input reference voltage node $V_{REF\_IN}$. For example, the drain of the first switch 720 can be coupled to the first terminal of the second feedback resistor 722 ($R_2$) and the drain of the second switch 730 to set the voltage at the input reference voltage node $V_{REF\_IN}$ based, in part, on the conduction of the first switch 720. The gate of the first switch 720 is coupled to the output of the operational amplifier 712 and the second terminal of the first feedback resistor 716 ($R_C$). For example, the gate of the first switch 720 can be coupled to the output of the operational amplifier 712 and the second terminal of the first feedback resistor 716 ($R_C$) to obtain the voltage at the output of the operational amplifier 712.

In the illustrated example of FIG. 7, the first terminal of the second feedback resistor 722 ($R_2$) is coupled to the drain of the first switch 720 and the drain of the second switch 730 at the input reference voltage node $V_{REF\_IN}$. The second terminal of the second feedback resistor 722 ($R_2$) is coupled to the first terminal of the third feedback resistor 724 ($R_3$) and the non-inverting input of the operational amplifier 712. For example, the second feedback resistor 722 ($R_2$) can be coupled between the drain of the first switch 720, the drain of the second switch 730, the first terminal of the third feedback resistor 724 ($R_3$), and the non-inverting input of the operational amplifier 712 to form a voltage divider circuit with the third feedback resistor 724 ($R_3$).

In the example illustrated in FIG. 7, the first terminal of the third feedback resistor 724 ($R_3$) is coupled to the second terminal of the second feedback resistor 722 ($R_2$) and the non-inverting input of the operational amplifier 712. The second terminal of the third feedback resistor 724 ($R_3$) is coupled to the ground node 726, the second terminal of the first filter capacitor 736 (CFO, and the second terminal of the second filter capacitor 740 ($C_{F2}$). For example, the third feedback resistor 724 ($R_3$) can be coupled between the second terminal of the second feedback resistor 722 ($R_2$), the non-inverting input of the operational amplifier 712, the ground node 726, the second terminal of the first filter capacitor 736 ($C_{F1}$), and the second terminal of the second filter capacitor 740 ($C_{F2}$) to form a voltage divider circuit with the second feedback resistor 722 ($R_2$).

In the illustrated example of FIG. 7, the operational amplifier 712, the biasing current source 714, the first feedback resistor 716 ($R_C$), the compensation capacitor 718 ($C_C$), the first switch 720, the second feedback resistor 722 ($R_2$), and the third feedback resistor 724 ($R_3$) form a feedback network and amplifier to amplify the bandgap reference voltage, $V_{BG}$. The time constant (e.g., a settling time constant) of the feedback network and amplifier is equivalent to the quotient of (a) the product of the capacitance of the compensation capacitor 718 ($C_C$) and the threshold voltage of the first switch 720 and (b) the biasing current, $I_{BIAS}$ (e.g., $\tau = C_C * V_{th}/I_{BIAS}$). In some examples, the quotient of (a) the product of the capacitance of the compensation capacitor 718 ($C_C$) and the threshold voltage of the first switch 720 and (b) the biasing current, $I_{BIAS}$ represents an upper limit of the time constant of the feedback network and amplifier.

In the illustrated example of FIG. 7, the drain of the second switch 730 is coupled to the drain of the first switch 720 and the first terminal of the second feedback resistor 722 ($R_2$) at the input reference voltage node $V_{REF\_IN}$. For example, the drain of the second switch 730 can be coupled to the drain of the first switch 720 and the first terminal of the second feedback resistor 722 ($R_2$) at the input reference voltage node $V_{REF\_IN}$ to receive the voltage at the input reference voltage node $V_{REF\_IN}$. The source of the second switch 730 is coupled to the back-gate of the second switch 730, the drain of the third switch 732, the back-gate of the third switch 732, the source of the fourth switch 733, the second terminal of the second filter resistor 738 ($R_{F2}$), and the first terminal of the second filter capacitor 740 ($C_{F2}$). For example, source of the second switch 730 can be coupled to the back-gate of the second switch 730, the drain of the third switch 732, the back-gate of the third switch 732, the source of the fourth switch 733, the second terminal of the second filter resistor 738 ($R_{F2}$), and the first terminal of the second filter capacitor 740 ($C_{F2}$) to reduce leakage from the first filter capacitor 736 ($C_{F1}$). The gate of the second switch 730 is coupled to the gate of the third switch 732 and the output of the inverter 746. For example, the gate of the second switch 730 can be coupled to the gate of the third switch 732 and the output of the inverter 746 to be controlled by the sample controller 744 and/or the inverter 746 based on the voltage of a complimented sample control signal, $V_{SAMPLE\_B}$, generated by the inverter 746.

In the example illustrated in FIG. 7, the drain of the third switch 732 is coupled to the source of the second switch 730, the back-gate of the second switch 730, the back-gate of the third switch 732, the source of the fourth switch 733, the second terminal of the second filter resistor 738 ($R_{F2}$), and the first terminal of the second filter capacitor 740 ($C_{F2}$). For example, the drain of the third switch 732 can be coupled to the source of the second switch 730, the back-gate of the second switch 730, the back-gate of the third switch 732, the source of the fourth switch 733, the second terminal of the second filter resistor 738 ($R_{F2}$), and the first terminal of the second filter capacitor 740 ($C_{F2}$) to reduce leakage from the first filter capacitor 736 ($C_{F1}$). The source of the third switch 732 is coupled to the drain of the fourth switch 733 and the first terminal of the first filter resistor 734 ($R_{F1}$). For example, the source of the third switch 732 can be coupled to the drain of the fourth switch 733 and the first terminal of the first filter resistor 734 ($R_{F1}$) to provide a point at which to sample the voltage at the input reference voltage node $V_{REF\_IN}$. The gate of the third switch 732 is coupled to the gate of the second switch 730 and the output of the inverter 746. For example, the gate of the third switch 732 can be coupled to the gate of the second switch 730 and the output of the inverter 746 to be controlled by the sample controller 744 and/or the inverter 746 based on the voltage of a complimented sample control signal, $V_{SAMPLE\_B}$, generated by the inverter 746.

In the example illustrated in FIG. 7, the drain of the fourth switch 733 is coupled to the source of the third switch 732 and the first terminal of the first filter resistor 734 ($R_{F1}$). For example, the drain of the fourth switch 733 can be coupled to the source of the third switch 732 and the first terminal of the first filter resistor 734 ($R_{F1}$) to reduce error in the S/H circuit 704 (e.g., pedestal error $E_P$) caused by charge injection. The source of the fourth switch 733 is coupled to the back-gate of the second switch 730, the source of the second switch 730, the back-gate of the third switch 732, the drain of the third switch 732, the first terminal of the second filter resistor 738 ($R_{F2}$), and the first terminal of the second filter capacitor 740 ($C_{F2}$). For example, the source of the fourth switch 733 can be coupled to the back-gate of the second switch 730, the source of the second switch 730, the back-gate of the third switch 732, the drain of the third switch 732, the first terminal of the second filter resistor 738 ($R_{F2}$), and the first terminal of the second filter capacitor 740 ($C_{F2}$) to reduce error in the S/H circuit 704 (e.g., pedestal error $E_P$) caused by charge injection. In the example of FIG. 7, the gate of the fourth switch 733 is coupled to the gate of the fifth switch 742, the second output of the sample controller 744, and the input of the inverter 746. For example, the gate of the fourth switch 733 can be coupled to the gate of the fifth switch 742, the second output of the sample controller 744, and the input of the inverter 746 to be controlled by the sample controller 744 based on the voltage of the sample control signal, $V_{SAMPLE\_A}$, generated by the sample controller 744.

In the illustrated example of FIG. 7, the first terminal of the first filter resistor 734 ($R_{F1}$) is coupled to the source of the third switch 732 and the drain of the fourth switch 733. The second terminal of the first filter resistor 734 ($R_{F1}$) is coupled to the first terminal of the first filter capacitor 736 ($C_{F1}$) and the input of the LDO regulator 702 at the output reference voltage node $V_{REF\_OUT}$. For example, the first filter resistor 734 ($R_{F1}$) can be coupled between the source of the third switch 732, the drain of the fourth switch 733, the first terminal of the first filter capacitor 736 ($C_{F1}$), and the input of the LDO regulator 702 to filter high frequency noise from the voltage at the input reference voltage node $V_{REF\_IN}$.

In the example illustrated in FIG. 7, the first terminal of the first filter capacitor 736 ($C_{F1}$) is coupled to the second terminal of the first filter resistor 734 (RF1) and the input of the LDO regulator 702 at the output reference voltage node $V_{REF\_OUT}$. For example, the first terminal of the first filter capacitor 736 ($C_{F1}$) can be coupled to the second terminal of the first filter resistor 734 (RF1) and the input of the LDO regulator 702 to filter high frequency noise from the voltage at the input reference voltage node $V_{REF\_IN}$. The second terminal of the first filter capacitor 736 ($C_{F1}$) is coupled to the ground node 726 and the second terminal of the second filter capacitor 740 ($C_{F2}$). For example, the second terminal of the first filter capacitor 736 ($C_{F1}$) can be coupled to the ground node 726 and the second terminal of the second filter capacitor 740 ($C_{F2}$) to filter high frequency noise from the voltage at the input reference voltage node $V_{REF\_IN}$. Together, the first filter resistor 734 (RF1) and the first filter capacitor 736 ($C_{F1}$) form an RC filter. The RC filter formed by the first filter resistor 734 ($R_{F1}$) and the first filter capacitor 736 ($C_{F1}$) includes a time constant, $\tau_{F1}$, equivalent to the product of the resistance of the first filter resistor 734 (RF1) and the capacitance of the first filter capacitor 736 ($C_{F1}$) (e.g., $\tau_{F1} = R_{F1} * C_{F1}$). Additionally, the first filter capacitor 736 ($C_{F1}$) can be coupled between the first filter resistor 734 ($R_{F1}$), the input of the LDO regulator 702, the ground node 726, and the second terminal of the second filter capacitor 740 ($C_{F2}$) to store the voltage sampled from the input reference voltage node $V_{REF\_IN}$.

In the illustrated example of FIG. 7, the first terminal of the second filter resistor 738 ($R_{F2}$) is coupled to the back-gate of the second switch 730, the source of the second switch 730, the back-gate of the third switch 732, the drain of the third switch 732, and the source of the fourth switch 733. The second terminal of the second filter resistor 738 ($R_{F2}$) is coupled to the drain of the fifth switch 742. For example, the second filter resistor 738 ($R_{F2}$) can be coupled between the back-gate of the second switch 730, the source of the second switch 730, the back-gate of the third switch 732, the drain of the third switch 732, the source of the fourth switch 733, and the drain of the fifth switch 742 to filter high frequency noise from the voltage at the input reference voltage node $V_{REF\_IN}$.

In the example illustrated in FIG. 7, the first terminal of the second filter capacitor 740 ($C_{F2}$) is coupled to the back-gate of the second switch 730, the source of the second switch 730, the back-gate of the third switch 732, the drain of the third switch 732, the source of the fourth switch 733, and the first terminal of the second filter resistor 738 ($R_{F2}$). For example, the first terminal of the second filter capacitor 740 ($C_{F2}$) can be coupled to the back-gate of the second switch 730, the source of the second switch 730, the back-gate of the third switch 732, the drain of the third switch 732, the source of the fourth switch 733, and the first terminal of the second filter resistor 738 ($R_{F2}$) to filter high frequency noise from the voltage at the buffered output reference voltage node $V_{REF\_OUT\_BUFFERED}$. The second terminal of the second filter capacitor 740 ($C_{F2}$) is coupled to the ground node 726 and the second terminal of the first filter capacitor 736 ($C_{F1}$). For example, the second terminal of the second filter capacitor 740 ($C_{F2}$) can be coupled to the ground node 726 and the second terminal of the first filter capacitor 736 ($C_{F1}$) to filter high frequency noise from the voltage at the buffered output reference voltage node $V_{REF\_OUT\_BUFFERED}$. Together, the second filter resistor 738 ($R_{F2}$) and the second filter capacitor 740 ($C_{F2}$) form an RC filter. The RC filter formed by the second filter resistor 738 ($R_{F2}$) and the second filter capacitor 740 ($C_{F2}$) includes a time constant equivalent to the product of the resistance of the second filter resistor 738 ($R_{F2}$) and the capacitance of the second filter capacitor 740 ($C_{F2}$) (e.g., $\tau_{F2}=R_{F2}*C_{F2}$). Additionally, the second filter capacitor 740 ($C_{F2}$) can be coupled between the back-gate of the second switch 730, the source of the second switch 730, the back-gate of the third switch 732, the drain of the third switch 732, the source of the fourth switch 733, the first terminal of the second filter resistor 738 ($R_{F2}$), the ground node 726, and the second terminal of the first filter capacitor 736 ($C_{F1}$) to store the voltage sampled from the buffered output reference voltage node $V_{REF\_OUT\_BUFFERED}$.

In the illustrated example of FIG. 7, the drain of the fifth switch 742 is coupled to the second terminal of the second filter resistor 738 ($R_{F2}$). For example, the drain of the fifth switch 742 can be coupled to the second terminal of the second filter resistor 738 to receive the voltage at the second terminal of the second filter resistor 738 ($R_{F2}$). The source of the fifth switch 742 is coupled to the output of the LDO regulator 702. For example, the source of the fifth switch 742 can be coupled to the output of the LDO regulator 702 to sample the voltage at the buffered output reference voltage node $V_{REF\_OUT\_BUFFERED}$. The gate of the fifth switch 742 is coupled to the first output of the sample controller 744 and the input of the inverter 746. For example, the gate of the fifth switch 742 can be coupled to the first output of the sample controller 744 and the input of the inverter 746 to be enabled and/or disabled based on the voltage of a sample control signal, $V_{SAMPLE\_A}$, generated by the sample controller 744.

In the example illustrated in FIG. 7, the input of the sample controller 744 is coupled to the output of the bandgap reference voltage generator 710 and the inverting input of the operational amplifier 712. For example, the input of the sample controller 744 can be coupled to the output of the bandgap reference voltage generator 710 and the inverting input of the operational amplifier 712 to sample the bandgap reference voltage, $V_{BG}$. In additional or alternative examples, the input of the sample controller 744 can be coupled to the input reference voltage node $V_{REF\_IN}$ to sample the voltage at the input reference voltage node $V_{REF\_IN}$. The first output of the sample controller 744 is coupled to the gate of the fourth switch 733, the gate of the fifth switch 742, and the input of the inverter 746. For example, the first output of the sample controller 744 can be coupled to the gate of the fourth switch 733, the gate of the fifth switch 742, and the input of the inverter 746 to enable and/or disable one or more of the second switch 730, the third switch 732, the fourth switch 733, and/or the fifth switch 742. The second output of the sample controller 744 is coupled to the gate of the power control switch 708. For example, the second output of the sample controller 744 can be coupled to the gate of the power control switch 708 to control the power consumption of the S/H circuit 704.

In the illustrated example of FIG. 7, the input of the inverter 746 is coupled to the gate of the fourth switch 733, the first output of the sample controller 744, and the gate of the fifth switch 742. For example, the input of the inverter 746 can be coupled to the gate of the fourth switch 733, the first output of the sample controller 744, and the gate of the fifth switch 742 to obtain the voltage of the sample control signal, $V_{SAMPLE\_A}$, generated by the sample controller 744. The output of the inverter 746 is coupled to the gate of the second switch 730 and the gate of the third switch 732. For example, the output of the inverter 746 is coupled to the gate of the second switch 730 and the gate of the third switch to enable and/or disable the second switch 730 and/or the third switch 732 based on the voltage of the sample control signal, $V_{SAMPLE\_A}$, generated by the sample controller 744.

In example operation, when the sample controller 744 enables the power control switch 708 (e.g., when the complimented on-time signal, $V_{ON\_TIME\_B}$, is a logic low value—if the power control switch 708 is implemented by a PMOS transistor), the bandgap reference voltage generator 710 begins to generate the bandgap reference voltage, $V_{BG}$. The sample controller 744 samples and/or otherwise monitors the bandgap reference voltage, $V_{BG}$, to determine whether the bandgap reference voltage, $V_{BG}$, meets a bandgap threshold of a target bandgap reference voltage (e.g., the bandgap reference voltage, $V_{BG}$, is within an offset window (e.g., a range of +/−10 millivolts (mV)). If the bandgap reference voltage, $V_{BG}$, meets the bandgap threshold, the sample controller 744 initiates a timer indicative of the settling time of the signal at the input reference voltage node $V_{REF\_IN}$. If the bandgap reference voltage, $V_{BG}$, does not meet the bandgap threshold, the sample controller 744 continues to sample and/or otherwise monitor the bandgap reference voltage, $V_{BG}$.

In additional or alternative examples, in operation, the sample controller 744 can sample and/or otherwise monitor the signal at the input reference voltage node $V_{REF\_IN}$, to determine whether the voltage at the input reference voltage node $V_{REF\_IN}$ meets an input reference voltage threshold of a target input reference voltage (e.g., the signal at the input reference voltage node $V_{REF\_IN}$ is within an offset window (e.g., a range of +/−10 mV)). If the voltage at the input reference voltage node $V_{REF\_IN}$ meets the input reference voltage threshold, the sample controller 744 initiates a timer indicative of the settling time of the signal at the input reference voltage node $V_{REF\_IN}$. If the voltage at the input reference voltage node $V_{REF\_IN}$ does not meet the input reference voltage threshold, the sample controller 744 continues to sample and/or otherwise monitor the signal at the input reference voltage node $V_{REF\_IN}$.

As described, in example operation, if the bandgap reference voltage, $V_{BG}$, meets the bandgap threshold and/or if the signal at the input reference voltage node $V_{REF\_IN}$ meets the input reference voltage threshold, the sample controller 744 initiates a first timer indicative of the settling time of the signal at the input reference voltage node $V_{REF\_IN}$. For example, the sample controller 744 can monitor a voltage that is associated with a first delay of the sample controller 744 to determine whether the voltage meets a first timing threshold. In examples disclosed herein, the first delay of the sample controller 744 tracks the time response of the feedback network and amplifier formed by the operational amplifier 712, the biasing current source 714, the compensation capacitor 718 ($C_C$), and the first switch 720.

In example operation, in response to (a) the bandgap reference voltage, $V_{BG}$, meeting the bandgap threshold and/or the voltage at the input reference voltage node $V_{REF\_IN}$ meeting the input reference voltage threshold and (b) the voltage that is associated with the first delay of the sample controller 744 meeting the first timing threshold, the sample controller 744 indicates to sample the voltage at the input reference voltage node $V_{REF\_IN}$ (e.g., sets the sample control signal, $V_{SAMPLE\_A}$ to a logic high value and/or causes the complimented sample control signal, $V_{SAMPLE\_B}$ to be set to a logic low value).

In example operation, after indicating to sample the voltage at the input reference voltage node $V_{REF\_IN}$, the sample controller 744 initiates a second timer to track the time response of the RC filter formed by the first filter resistor 734 ($R_{F1}$) and the first filter capacitor 736 ($C_{F1}$). For example, the sample controller 744 can monitor a voltage that is dependent upon a second delay of the sample controller 744 to determine whether the voltage meets a second timing threshold. In examples disclosed herein, the second delay of the sample controller 744 tracks the time response of the RC filter formed by the first filter resistor 734 ($R_{F1}$) and the first filter capacitor 736 ($C_{F1}$).

In example operation, in response to the voltage meeting the second timing threshold, the sample controller 744 indicates to halt sampling of the voltage at the input reference voltage node $V_{REF\_IN}$ (e.g., sets the sample control signal, $V_{SAMPLE\_A}$ to a logic low value and/or causes the complimented sample control signal, $V_{SAMPLE\_B}$ to be set to a logic high value). Detailed operation and structure of the sample controller 744 is discussed in connection with FIGS. 8 and 9.

The disclosed system 700 of FIG. 7 advantageously combines delay elements to improve on-time control of the S/H circuit 704 and reduce the average power consumption of the S/H circuit 704. For example, the sample controller 744 of FIG. 7 implements at least three delay elements to improve on-time control and reduce the average power consumption of the S/H circuit 704. The example three delay elements include a delay element that tracks the startup time of the bandgap reference voltage generator 710 and/or the startup time of the feedback network and the amplifier formed by the operational amplifier 712, the biasing current source 714, the first feedback resistor 716 ($R_C$), the compensation capacitor 718 ($C_C$), the first switch 720, the second feedback resistor 722 ($R_2$), and the third feedback resistor 724 ($R_3$); a delay element that tracks the settling time of the feedback network and the amplifier formed by the operational amplifier 712, the biasing current source 714, the first feedback resistor 716 ($R_C$), the compensation capacitor 718 ($C_C$), the first switch 720, the second feedback resistor 722 ($R_2$), and third feedback resistor 724 ($R_3$); and a delay element that tracks the time response of the RC filter formed by the first filter resistor 734 (RH) and the first filter capacitor 736 (CFO.

Because of the advantageous combination of delay elements disclosed herein, even if the biasing current of the scaling amplifier (e.g., the feedback network and the amplifier formed by the operational amplifier 712, the biasing current source 714, the first feedback resistor 716 ($R_C$), the compensation capacitor 718 ($C_C$), the first switch 720, the second feedback resistor 722 ($R_2$), and third feedback resistor 724 ($R_3$)) and/or the slew rate of the bandgap reference voltage generator (e.g., the bandgap reference voltage generator 710) vary across process, voltage, and temperature (PVT), the on-time control and acquisition time of the S/H circuit 704 will still be improved. For example, as the biasing current of the scaling amplifier and/or the slew rate of the bandgap reference voltage generator vary across PVT, the delay elements disclosed herein will similarly vary across PVT. Thus, the acquisition time of the S/H circuit 704 will be accurately matched regardless of variations across PVT.

Additionally, examples disclosed herein reduce ripple voltage in the output of a low-dropout (LDO) regulator. For example, when implementing the example methods, apparatus, and articles of manufacture disclosed herein the ripple voltage at the output of an LDO regulator can be reduced to less than 23 microvolts (µV).

Figure 8:
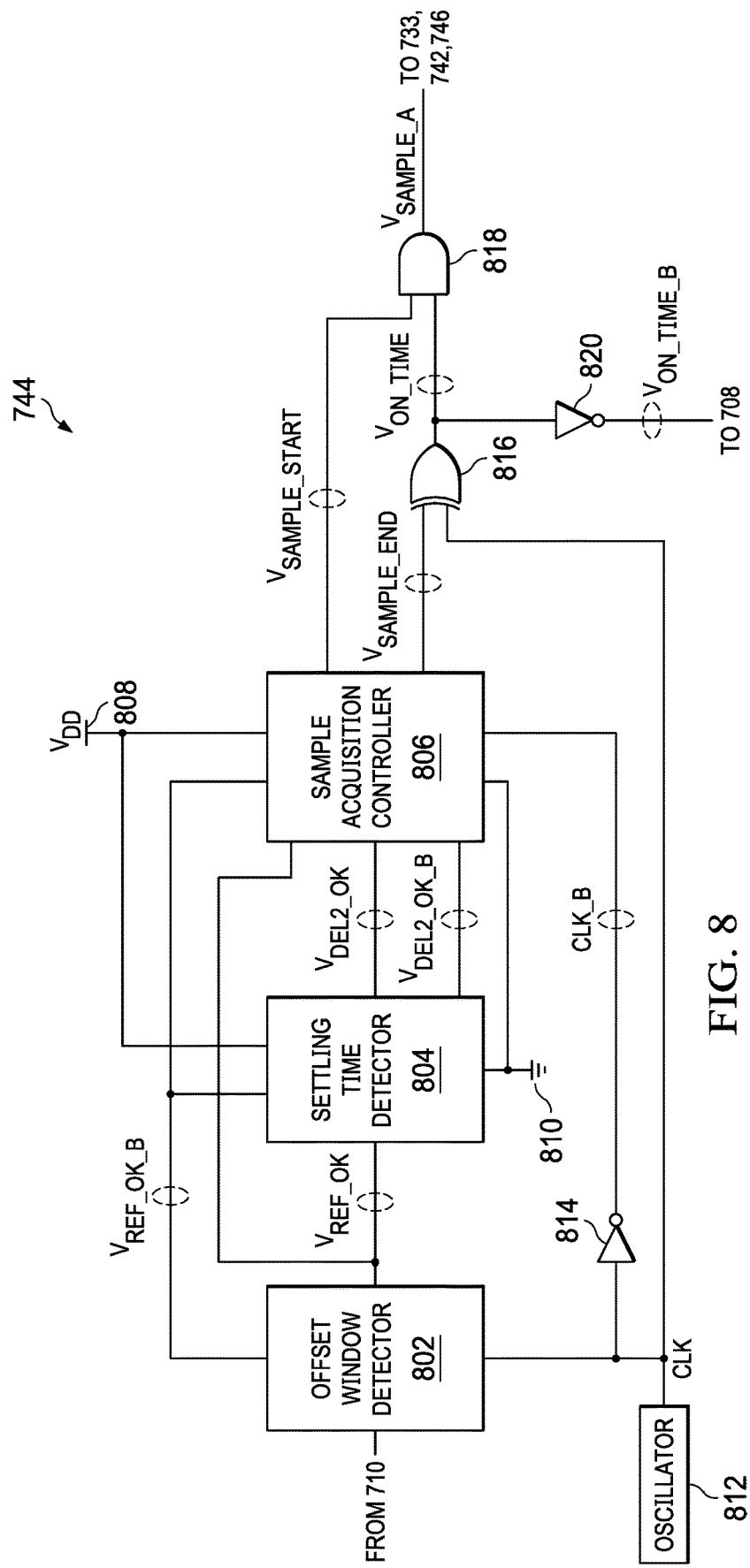
FIG. 8 is a block diagram of the example sample controller of the example sample-hold circuit of FIG. 7.

FIG. 8 is a block diagram of the example sample controller 744 of the example sample-hold (S/H) circuit 704 of FIG. 7. The example sample controller 744 includes an example offset window detector 802, an example settling time detector 804, an example sample acquisition controller 806, an example voltage supply node 808 ($V_{DD}$), an example ground node 810, an example oscillator 812, an example first inverter 814, an example first logic gate 816, an example second logic gate 818, and an example second inverter 820. In examples disclosed herein, the sample controller 744 controls conduction of the sampling switch 728, the second switch 730, the third switch 732, the fourth switch 733, and/or the fifth switch 742 to generate one or more reference voltages at the output reference voltage node $V_{REF\_OUT}$ and/or sample one or more reference voltages at the buffered output reference voltage node $V_{REF\_OUT\_BUFFERED}$.

In the example illustrated in FIG. 8, the offset window detector 802 includes a first input, a second input, a first output, and a second output. In the example of FIG. 8, the offset window detector 802 can be implemented by one or more comparators, one or more AND gates, and/or one or more inverters. In additional or alternative examples, the offset window detector 802 can be implemented by any number of logic gates, comparators, and/or any other suitable circuit component for a desired application.

In the illustrated example of FIG. 8, the settling time detector 804 includes a first input, a second input, a third input, a ground terminal, a first output, and a second output.

In the example of FIG. 8, the settling time detector 804 can be implemented by one or more capacitors, one or more current sources, one or more transistors, one or more Schmitt triggers, one or more inverters, and/or one or more NOR gates. In additional or alternative examples, the settling time detector 804 can be implemented by any number of capacitors, current sources, transistors, Schmitt triggers, inverters, NOR gates, and/or any other suitable circuit component for a desired application.

In the example illustrated in FIG. 8, the sample acquisition controller 806 includes a first input, a second input, a third input, a fourth input, a fifth input, a sixth input, a ground terminal, a first output, and a second output. In the example of FIG. 8, the sample acquisition controller 806 can be implemented by one or more current sources, one or more transistors, one or more AND gates, one or more Schmitt triggers, and/or one or more capacitors. In additional or alternative examples, the sample acquisition controller 806 can be implemented by any number of current sources, transistors, AND gates, Schmitt triggers, capacitors, and/or any other suitable circuit component for a desired application.

In the illustrated example of FIG. 8, the oscillator 812 includes an output. In the example of FIG. 8, the oscillator 812 can be implemented by a ring oscillator. For example, the oscillator 812 can be a ring oscillator including a frequency of 20 Hertz (Hz). In additional or alternative examples, the oscillator 812 can be implemented by any number of oscillators such as an RC oscillator, an inductor capacitor (LC) oscillator, a crystal oscillator, a negative-resistance oscillator, etc. ranging in frequency from 100 Hz to 10 kilohertz (kHz). In the example of FIG. 8, the first inverter 814 includes an input and an output.

In the illustrated example of FIG. 8, the first logic gate 816 is an XOR gate (e.g., an exclusive-OR gate) including a first input, a second input, and an output. In additional or alternative examples, the first logic gate 816 can be implemented by any suitable logic gate and/or logic gates for a desired application. In the example of FIG. 8, the second logic gate 818 is an AND gate including a first input, a second input, and an output. In additional or alternative examples, the second logic gate 818 can be implemented by any suitable logic gate and/or logic gates for a desired application. In the example of FIG. 8, the second inverter 820 includes an input and an output.

In the illustrated example of FIG. 8, the first input of the offset window detector 802 is coupled to the output of the bandgap reference voltage generator 710. In additional or alternative examples, the first input of the offset window detector 802 is coupled between the drain of the first switch 720, the second feedback resistor 722 ($R_2$), and the drain of the second switch 730 at the input reference voltage node $V_{REF\_IN}$. For example, the first input of the offset window detector 802 can be coupled to the output of the bandgap reference voltage generator 710 and/or the input reference voltage node $V_{REF\_IN}$ to sample and/or otherwise monitor the voltage of the bandgap reference voltage, $V_{BG}$, and/or the voltage at the input reference voltage node $V_{REF\_IN}$.

In the example illustrated in FIG. 8, the second input of the offset window detector 802 is coupled to the output of the oscillator 812. For example, the second input of the offset window detector 802 can be coupled to the output of the oscillator 812 to receive a clock signal, CLK. The first output of the offset window detector 802 is coupled to the first input of the settling time detector 804 and the first input of the sample acquisition controller 806. For example, the first output of the offset window detector 802 can be coupled to the first input of the settling time detector 804 and the first input of the sample acquisition controller 806 to provide the settling time detector 804 and the sample acquisition controller 806 with a complimented reference confirmation signal, $V_{REF\_OK\_B}$. The second output of the offset window detector 802 is coupled to the second input of the settling time detector 804 and the second input of the sample acquisition controller 806. For example, the second output of the offset window detector 802 can be coupled to the second input of the settling time detector 804 and the second input of the sample acquisition controller 806 to provide the settling time detector 804 and the sample acquisition controller 806 with a reference confirmation signal, $V_{REF\_OK}$.

In the illustrated example of FIG. 8, the first input of the settling time detector 804 is coupled to the first output of the offset window detector 802 and the first input of the sample acquisition controller 806. For example, the first input of the settling time detector 804 can be coupled to the first output of the offset window detector 802 and the first input of the sample acquisition controller 806 to obtain the complimented reference confirmation signal, $V_{REF\_OK\_B}$. The second input of the settling time detector 804 is coupled to the second output of the offset window detector 802 and the second input of the sample acquisition controller 806. For example, the second input of the settling time detector 804 can be coupled to the second output of the offset window detector 802 and the second input of the sample acquisition controller 806 to obtain the reference confirmation signal, $V_{REF\_OK}$.

In the example illustrated in FIG. 8, the third input of the settling time detector 804 is coupled to the voltage supply node 808 ($V_{DD}$) and the sixth input of the sample acquisition controller 806. For example, the third input of the settling time detector 804 can be coupled to the voltage supply node 808 ($V_{DD}$) and the sixth input of the sample acquisition controller 806 to receive power to power the settling time detector 804. The ground terminal of the settling time detector 804 is coupled to the ground terminal of the sample acquisition controller 806 and the ground node 810. For example, the ground terminal of the settling time detector 804 can be coupled to the ground terminal of the sample acquisition controller 806 and the ground node 810 to ground the settling time detector 804. The first output of the settling time detector 804 is coupled to the third input of the sample acquisition controller 806. For example, the first output of the settling time detector 804 can be coupled to the third input of the sample acquisition controller 806 to provide the sample acquisition controller 806 with a first delay confirmation signal, $V_{DEL2\_OK}$. The second output of the settling time detector 804 is coupled to the fourth input of the sample acquisition controller 806. For example, the second output of the settling time detector 804 can be coupled to the fourth input of the sample acquisition controller 806 to provide the sample acquisition controller 806 with a complimented first delay confirmation signal, $V_{DEL2\_OK\_B}$.

In the illustrated example of FIG. 8, the first input of the sample acquisition controller 806 is coupled to the first output of the offset window detector 802 and the first input of the settling time detector 804. For example, the first input of the sample acquisition controller 806 can be coupled to the first output of the offset window detector 802 and the first input of the settling time detector 804 to obtain the complimented reference confirmation signal, $V_{REF\_OK\_B}$. The second input of the sample acquisition controller 806 is coupled to the second output of the offset window detector 802 and the second input of the settling time detector 804. For example, the second input of the sample acquisition controller 806 can be coupled to the second output of the offset window detector 802 and the second input of the settling time detector 804 to obtain the reference confirmation signal, $V_{REF\_OK}$.

In the example illustrated in FIG. 8, the third input of the sample acquisition controller 806 is coupled to the first output of the settling time detector 804. For example, the third input of the sample acquisition controller 806 can be coupled to the first output of the settling time detector 804 to obtain the first delay confirmation signal, $V_{DEL2\_OK}$. The fourth input of the sample acquisition controller 806 is coupled to the second output of the settling time detector 804. For example, the fourth input of the sample acquisition controller 806 can be coupled to the second output of the settling time detector 804 to obtain the complimented first delay confirmation signal, $V_{DEL2\_OK\_B}$. The fifth input of the sample acquisition controller 806 is coupled to the output of the first inverter 814. For example, the fifth input of the sample acquisition controller 806 can be coupled to the output of the first inverter 814 to receive a complimented clock signal, CLK_B. The sixth input of the sample acquisition controller 806 is coupled to the third input of the settling time detector 804 and the voltage supply node 808 ($V_{DD}$). For example, the sixth input of the sample acquisition controller 806 can be coupled to the third input of the settling time detector 804 and the voltage supply node 808 ($V_{DD}$) to receive power to power the sample acquisition controller 806. The ground terminal of the sample acquisition controller 806 is coupled to the ground terminal of the settling time detector 804 and the ground node 810. For example, the ground terminal of the sample acquisition controller 806 can be coupled to the ground terminal of the settling time detector 804 and the ground node 810 to ground the sample acquisition controller 806.

In the illustrated example of FIG. 8, the first output of the sample acquisition controller 806 is coupled to the first input of the first logic gate 816. For example, the first output of the sample acquisition controller 806 can be coupled to the first input of the first logic gate 816 to provide the first logic gate 816 with the end sample signal, $V_{SAMPLE\_END}$. The second output of the sample acquisition controller 806 is coupled to the first input of the second logic gate 818. For example, the second output of the sample acquisition controller 806 can be coupled to the first input of the second logic gate 818 to provide the second logic gate 818 with the start sample signal, $V_{SAMPLE\_START}$.

In the example illustrated in FIG. 8, the output of the oscillator 812 is coupled to the second input of the offset window detector 802, the input of the first inverter 814, and the second input of the first logic gate 816. For example, the output of the oscillator 812 can be coupled to the second input of the offset window detector 802, the input of the first inverter 814, and the second input of the first logic gate 816 to provide the offset window detector 802, the first inverter 814, and the first logic gate 816 with the clock signal, CLK. In the example of FIG. 8, the input of the first inverter 814 is coupled to the second input of the offset window detector 802, the output of the oscillator 812, and the second input of the first logic gate 816. For example, the input of the first inverter 814 can be coupled to the second input of the offset window detector 802, the output of the oscillator 812, and the second input of the first logic gate 816 to obtain the clock signal, CLK. The output of the first inverter 814 is coupled to the fifth input of the sample acquisition controller 806. For example, the output of the first inverter 814 can be coupled to the fifth input of the sample acquisition controller 806 to provide the complimented clock signal, CLK_B.

In the example illustrated in FIG. 8, the first input of the first logic gate 816 is coupled to the first output of the sample acquisition controller 806. For example, the first input of the first logic gate 816 can be coupled to the first output of the sample acquisition controller 806 to obtain the end sample signal, $V_{SAMPLE\_END}$. The second input of the first logic gate 816 is coupled to the second input of the offset window detector 802, the output of the oscillator 812, and the input of the first inverter 814. For example, the second input of the first logic gate 816 can be coupled to the second input of the offset window detector 802, the output of the oscillator 812, and the input of the first inverter 814 to obtain the clock signal, CLK. The output of the first logic gate 816 is coupled to the second input of the second logic gate 818 and the input of the second inverter 820. For example, the output of the first logic gate 816 can be coupled to the second input of the second logic gate 818 and the input of the second inverter 820 to provide the second logic gate 818 and the second inverter 820 with an on-time signal, $V_{ON\_TIME}$.

In the illustrated example of FIG. 8, the first input of the second logic gate 818 is coupled to the second output of the sample acquisition controller 806. For example, the first input of the second logic gate 818 can be coupled to the second output of the sample acquisition controller 806 to obtain the start sample signal, $V_{SAMPLE\_START}$. The second input of the second logic gate 818 is coupled to the output of the first logic gate 816 and the input of the second inverter 820. For example, the second input of the second logic gate 818 can be coupled to the output of the first logic gate 816 and the input of the second inverter 820 to obtain the on-time signal, $V_{ON\_TIME}$. The output of the second logic gate 818 is coupled to the gate of the fourth switch 733, the gate of the fifth switch 742, and the input of the inverter 746. For example, the output of the second logic gate 818 can be coupled to the gate of the fourth switch 733, the gate of the fifth switch 742, and the input of the inverter 746 to provide the fourth switch 733, the fifth switch 742 and the inverter 746 with the sample control signal, $V_{SAMPLE\_A}$. The input of the second inverter 820 is coupled to the output of the first logic gate 816 and the second input of the second logic gate 818. For example, the input of the second inverter 820 can be coupled to the output of the first logic gate 816 and the second input of the second logic gate 818 to obtain the on-time signal, $V_{ON\_TIME}$. The output of the second inverter 820 is coupled to the gate of the power control switch 708. For example, the output of the second inverter 820 can be coupled to the gate of the power control switch 708 to provide the complimented on-time signal, $V_{ON\_TIME\_B}$, to the power control switch 708.

In example operation, when the clock signal, CLK, generated by the oscillator 812 rises (e.g., there is a rising edge on the clock signal, CLK), the first logic gate 816 generates a logic high value as the on-time signal $V_{ON\_TIME}$. As such, the second inverter 820 generates a logic low value as the complimented on-time signal $V_{ON\_TIME\_B}$, to enable the power control switch 708. While the power control switch 708 is enabled, the bandgap reference voltage, $V_{BG}$, generated by the bandgap reference voltage generator 710 rises. The offset window detector 802 monitors the bandgap reference voltage, $V_{BG}$, as it rises and determines whether the voltage of the bandgap reference voltage, $V_{BG}$, meets a bandgap threshold of a target bandgap reference voltage (e.g., the bandgap reference voltage, $V_{BG}$, is within an offset window (e.g., a range of +/−10 mV)).

In example operation, if the offset window detector 802 determines that the bandgap reference voltage, $V_{BG}$, meets the bandgap threshold, the offset window detector 802 sets the reference confirmation signal, $V_{REF\_OK}$ and the complimented reference confirmation signal, $\overline{V_{REF\_OK\_B}}$, to a logic high value and logic low value, respectively. If the offset window detector 802 determines that the bandgap reference voltage, $V_{BG}$, does not meet the bandgap threshold, the offset window detector 802 continues to sample and/or otherwise monitor the bandgap reference voltage, $V_{BG}$.

In additional or alternative examples, in operation, the offset window detector 802 can sample and/or otherwise monitor the signal at the input reference voltage node $V_{REF\_IN}$, to determine whether the voltage at the input reference voltage node $V_{REF\_IN}$ meets an input reference voltage threshold of a target input reference voltage (e.g., the voltage at the input reference voltage node $V_{REF\_IN}$ is within an offset window (e.g., a range of +/−10 mV)). If the offset window detector 802 determines that the voltage at the input reference voltage node $V_{REF\_IN}$ meets the input reference voltage threshold, the offset window detector 802 sets the reference confirmation signal, $V_{REF\_OK}$ and the complimented reference confirmation signal, $\overline{V_{REF\_OK\_B}}$, to a logic high value and logic low value, respectively. If the offset window detector 802 determines that the voltage at the input reference voltage node $V_{REF\_IN}$ does not meet the input reference voltage threshold, the offset window detector 802 continues to sample and/or otherwise monitor the signal at the input reference voltage node $V_{REF\_IN}$.

As described, in example operation, if the offset window detector 802 determines that the voltage of the bandgap reference voltage, $V_{BG}$, meets the bandgap threshold and/or if the voltage at the input reference voltage node $V_{REF\_IN}$ meets the input reference voltage threshold, the offset window detector 802 sets the reference confirmation signal, $V_{REF\_OK}$ and the complimented reference confirmation signal, $\overline{V_{REF\_OK\_B}}$, to a logic high value and logic low value, respectively. In response to logic high value on the reference confirmation signal, $V_{REF\_OK}$, and the falling edge of the complimented reference confirmation signal, $\overline{V_{REF\_OK\_B}}$, the settling time detector 804 determines whether a voltage that is dependent upon a delay of the settling time detector 804 meets a first timing threshold. In examples disclosed herein, the delay of the settling time detector 804 tracks the time response (e.g., the settling time) of the feedback network and amplifier formed by the operational amplifier 712, the biasing current source 714, the compensation capacitor 718 ($C_C$), and the first switch 720.

In example operation, in response to (a) the bandgap reference voltage, $V_{BG}$, meeting the bandgap threshold and/or the voltage at the input reference voltage node $V_{REF\_IN}$ meeting the input reference voltage threshold and (b) the voltage that is dependent upon the delay of the settling time detector 804 meeting the first timing threshold, the sample acquisition controller 806 causes the second logic gate 818 to indicate to sample the voltage at the input reference voltage node $V_{REF\_IN}$ (e.g., causes the second logic gate 818 to set the sample control signal, $V_{SAMPLE\_A}$ to a logic high value and/or causes the inverter 746 to set the complimented sample control signal, $V_{SAMPLE\_B}$ to a logic low value).

In example operation, after causing the second logic gate 818 to indicate to sample the voltage at the input reference voltage node $V_{REF\_IN}$, the sample acquisition controller 806 determines whether a voltage that is dependent upon a delay of the sample acquisition controller 806 meets a second timing threshold. In examples disclosed herein, the delay of the sample acquisition controller 806 tracks the time response of the RC filter formed by the first filter resistor 734 (RH) and the first filter capacitor 736 (CH).

In response to the voltage meeting the second timing threshold, the sample acquisition controller 806 causes the second logic gate 818 to indicate to halt sampling of the voltage at the input reference voltage node $V_{REF\_IN}$ (e.g., causes the second logic gate 818 to set the sample control signal, $V_{SAMPLE\_A}$ to a logic low value and/or causes the inverter 746 to set the complimented sample control signal, $V_{SAMPLE\_B}$ to a logic high value). Additionally, in response to the voltage meeting the second timing threshold, the sample acquisition controller 806 causes the first logic gate 816 to set the on-time signal, $V_{ON\_TIME}$, to a logic low value and consequently causes the second inverter 820 to set the logic value of the complimented on-time signal, $V_{ON\_TIME\_B}$, to a logic high value to disable to the power control switch 708.

Figure 9:
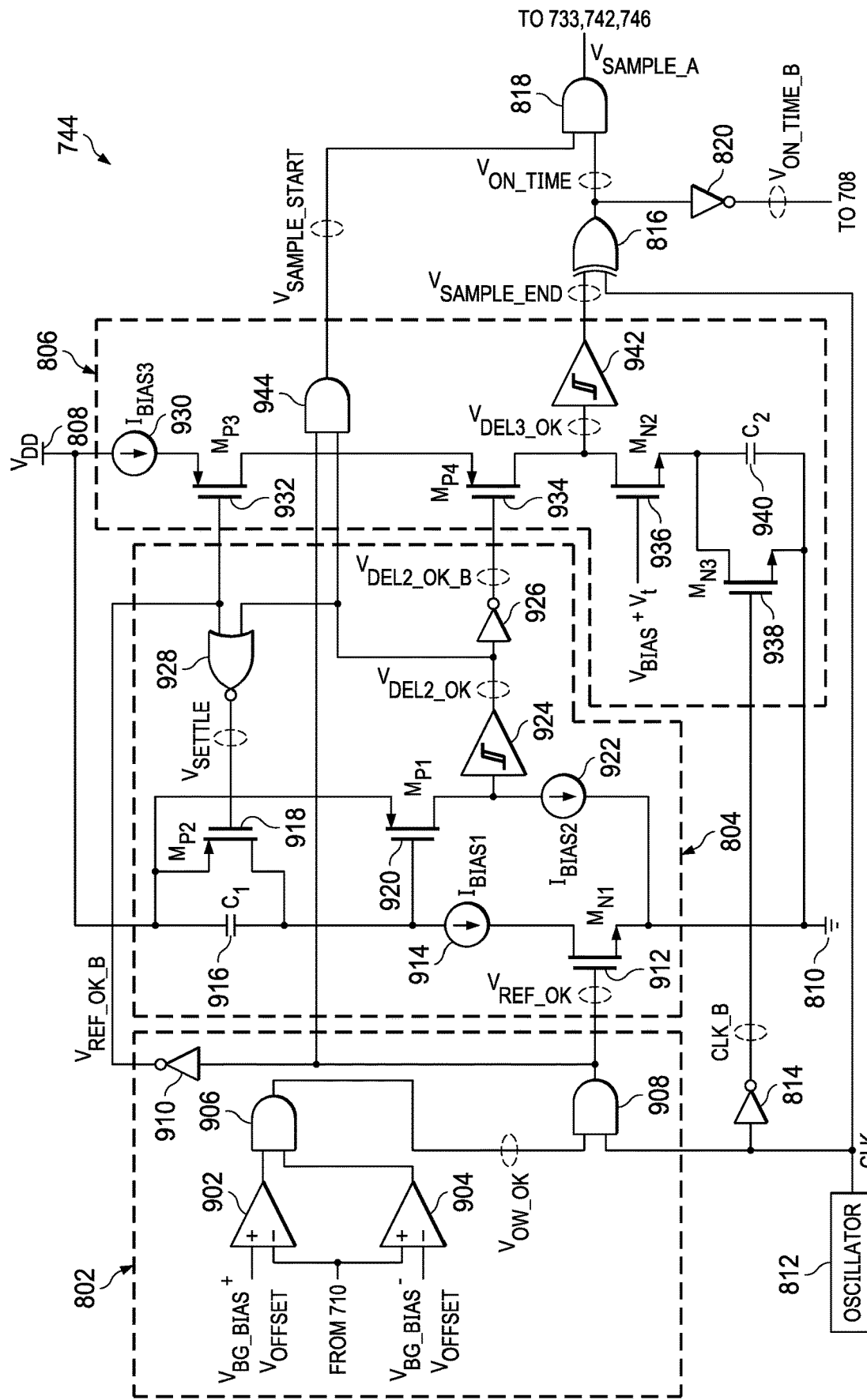
FIG. 9 is a schematic illustration of the example sample controller of FIGS. 7 and 8.

FIG. 9 is a schematic illustration of the example sample controller 744 of FIGS. 7 and 8. The example sample controller 744 includes an example offset window detector 802, an example settling time detector 804, an example sample acquisition controller 806, an example voltage supply node 808 ($V_{DD}$), an example ground node 810, an example oscillator 812, an example first inverter 814, an example first logic gate 816, an example second logic gate 818, and an example second inverter 820. The example offset window detector 802 includes an example first comparator 902, an example second comparator 904, an example third logic gate 906, an example fourth logic gate 908, and an example third inverter 910.

In the illustrated example of FIG. 9, the example settling time detector 804 includes an example first switch 912 ($M_{N1}$), an example first biasing current source 914, an example first charge capacitor 916 ($C_1$), an example second switch 918 ($M_{P2}$), an example third switch 920 ($M_{P1}$), an example second biasing current source 922, an example first trigger 924, an example fourth inverter 926, and an example fifth logic gate 928. In the example of FIG. 9, the sample acquisition controller 806 includes an example third biasing current source 930, an example fourth switch 932 ($M_{P3}$), an example fifth switch 934 ($M_{P4}$), an example sixth switch 936 ($M_{N2}$), an example seventh switch 938 ($M_{N3}$), an example second charge capacitor 940 ($C_2$), an example second trigger 942, and an example sixth logic gate 944.

In the example illustrated in FIG. 9, the first comparator 902 includes a non-inverting input, an inverting input, and an output. The second comparator 904 includes a non-inverting input, an inverting input, and an output. In the example of FIG. 9, the third logic gate 906 is an AND gate including a first input, a second input, and an output. In additional or alternative examples, the third logic gate 906 can be implemented by any suitable logic gate and/or logic gates for a desired application. In the example of FIG. 9, the fourth logic gate 908 is an AND gate including a first input, a second input, and an output. In additional or alternative examples, the fourth logic gate 908 can be implemented by any suitable logic gate and/or logic gates for a desired application.

In the illustrated example of FIG. 9, the third inverter 910 includes an input and an output. In the example of FIG. 9, the first switch 912 (MO is a PMOS transistor including a source (e.g., a first current terminal), a drain (e.g., a second current terminal), and a gate (e.g., a control terminal). In additional or alternative examples, the first switch 912 (MO can be implemented by any suitable transistor and/or transistors for a desired application such as NMOS transistors, BJTs, JFETs, etc. The first biasing current source 914 includes a first terminal and a second terminal. In the example of FIG. 9, the first biasing current source 914 can be implemented by one or more MOSFETs and one or more resistors (e.g., a Widlar current source and/or variations thereof). In additional or alternative example, the first biasing current source 914 can be implemented by one or more MOSFETs, one or more resistors, one or more capacitors, one or more amplifiers, and/or any suitable component that is desirable for an application.

In the example illustrated in FIG. 9, the first charge capacitor 916 ($C_C$) includes a first terminal and a second terminal. In the example of FIG. 9, the second switch 918 ($M_{P2}$) is a PMOS transistor including a source (e.g., a first current terminal), a drain (e.g., a second current terminal), and a gate (e.g., a control terminal). In additional or alternative examples, the second switch 918 ($M_{P2}$) can be implemented by any suitable transistor and/or transistors for a desired application such as NMOS transistors, BJTs, JFETs, etc. In the example of FIG. 9, the third switch 920 ($M_{P1}$) is a PMOS transistor including a source (e.g., a first current terminal), a drain (e.g., a second current terminal), and a gate (e.g., a control terminal). In additional or alternative examples, the third switch 920 ($M_{P1}$) can be implemented by any suitable transistor and/or transistors for a desired application such as NMOS transistors, BJTs, JFETs, etc.

In the illustrated example of FIG. 9, the second biasing current source 922 includes a first terminal and a second terminal. In the example of FIG. 9, the second biasing current source 922 can be implemented by one or more MOSFETs and one or more resistors (e.g., a Widlar current source and/or variations thereof). In additional or alternative example, the second biasing current source 922 can be implemented by one or more MOSFETs, one or more resistors, one or more capacitors, one or more amplifiers, and/or any suitable component that is desirable for an application. The first trigger 924 includes an input and an output. In the example of FIG. 9, the first trigger 924 can be implemented by a non-inverting Schmitt trigger. In additional or alternative examples, the first trigger 924 can be implemented by any trigger and/or triggers suitable to an application, such as a comparator, an inverting Schmitt trigger, etc.

In the example illustrated in FIG. 9, the fourth inverter 926 includes an input and an output. In the example of FIG. 9, the fifth logic gate 928 is a NOR gate (e.g., a NOT-OR gate) including a first input, a second input, and an output. The third biasing current source 930 includes a first terminal and a second terminal. In the example of FIG. 9, the third biasing current source 930 can be implemented by one or more MOSFETs and one or more resistors (e.g., a Widlar current source and/or variations thereof). In additional or alternative example, the third biasing current source 930 can be implemented by one or more MOSFETs, one or more resistors, one or more capacitors, one or more amplifiers, and/or any suitable component that is desirable for an application.

In the illustrated example of FIG. 9, the fourth switch 932 ($M_{P3}$) is a PMOS transistor including a source (e.g., a first current terminal), a drain (e.g., a second current terminal), and a gate (e.g., a control terminal). In additional or alternative examples, the fourth switch 932 ($M_{P3}$) can be implemented by any suitable transistor and/or transistors for a desired application such as NMOS transistors, BJTs, JFETs, etc. In the example of FIG. 9, the fifth switch 934 ($M_{P4}$) is a PMOS transistor including a source (e.g., a first current terminal), a drain (e.g., a second current terminal), and a gate (e.g., a control terminal). In additional or alternative examples, the fifth switch 934 ($M_{P4}$) can be implemented by any suitable transistor and/or transistors for a desired application such as NMOS transistors, BJTs, JFETs, etc.

In the example illustrated in FIG. 9, the sixth switch 936 ($M_{N2}$) is an NMOS transistor including a source (e.g., a first current terminal), a drain (e.g., a second current terminal), and a gate (e.g., a control terminal). In additional or alternative examples, the sixth switch 936 ($M_{N2}$) can be implemented by any suitable transistor and/or transistors for a desired application such as PMOS transistors, BJTs, JFETs, etc. In the example of FIG. 9, the seventh switch 938 ($M_{N3}$) is an NMOS transistor including a source (e.g., a first current terminal), a drain (e.g., a second current terminal), and a gate (e.g., a control terminal). In additional or alternative examples, the seventh switch 938 ($M_{N3}$) can be implemented by any suitable transistor and/or transistors for a desired application such as PMOS transistors, BJTs, JFETs, etc. The second charge capacitor 940 includes a first terminal and a second terminal.

In the illustrated example of FIG. 9, the second trigger 942 includes an input and an output. In the example of FIG. 9, the second trigger 942 can be implemented by a non-inverting Schmitt trigger. In additional or alternative examples, the second trigger 942 can be implemented by any trigger and/or triggers suitable to an application, such as a comparator, an inverting Schmitt trigger, etc. In the example of FIG. 9, the sixth logic gate 944 is an AND gate including a first input, a second input, and an output. In additional or alternative examples, the sixth logic gate 944 can be implemented by any suitable logic gate and/or logic gates for a desired application.

In the illustrated example of FIG. 9, the non-inverting input of the first comparator 902 is coupled to a voltage source set to a voltage equivalent to the sum of the target bandgap reference voltage and an offset voltage (e.g., $V_{BG}+V_{OFFSET}$). The voltage source set to a voltage equivalent to the sum of the target bandgap reference voltage and an offset voltage (e.g., $V_{BG}+V_{OFFSET}$) sets an upper threshold for the offset window detector 802. In some examples, the offset voltage can be 10 mV. The inverting input of the first comparator 902 is coupled to the output of the bandgap reference voltage generator 710 and the non-inverting input of the second comparator 904. For example, (a) the non-inverting input of the first comparator 902 can be coupled to the voltage source set a voltage equivalent to the sum of the target bandgap reference voltage and an offset voltage (e.g., $V_{BG}+V_{OFFSET}$) and (b) the inverting input of the first comparator 902 can be coupled to the output of the bandgap reference voltage generator 710 and the non-inverting input of the second comparator 904 so that the first comparator 902 can determine whether the voltage of the bandgap reference voltage, $V_{BG}$, is greater than or less than the upper threshold. The output of the first comparator 902 is coupled to the first input of the third logic gate 906. For example, the output of the first comparator 902 can be coupled to the first input of the third logic gate 906 to provide the third logic gate 906 with the result of the determination made by the first comparator 902.

In additional or alternative examples, the non-inverting input of the first comparator 902 is coupled to a voltage source set to a voltage equivalent to the sum of the target input reference voltage and an offset voltage (e.g., $V_{REF\_IN}+V_{OFFSET}$). The voltage source set to a voltage equivalent to the sum of the target input reference voltage and an offset voltage (e.g., $V_{REF\_IN}+V_{OFFSET}$) sets an upper threshold for the offset window detector 802. In some examples, the offset voltage can be 10 mV. The inverting input of the first comparator 902 is coupled between the drain of the first switch 720, the second feedback resistor 722 ($R_2$), and the drain of the second switch 730 at the input reference voltage node $V_{REF\_IN}$. For example, (a) the non-inverting input of the first comparator 902 can be coupled to a voltage source set to a voltage equivalent to the sum of the target input reference voltage and an offset voltage (e.g., $V_{REF\_IN}$+$V_{OFFSET}$) and (b) the inverting input of the first comparator 902 can be coupled between the drain of the first switch 720, the second feedback resistor 722 ($R_2$), and the drain of the second switch 730 at the input reference voltage node $V_{REF\_IN}$ so that the first comparator 902 can determine whether the voltage at the input reference voltage node $V_{REF\_IN}$ is greater than or less than the upper threshold. The output of the first comparator 902 is coupled to the first input of the third logic gate 906. For example, the output of the first comparator 902 can be coupled to the first input of the third logic gate 906 to provide the third logic gate 906 with the result of the determination made by the first comparator 902.

In the example illustrated in FIG. 9, the non-inverting input of the second comparator 904 is coupled to the output of the bandgap reference voltage generator 710 and the inverting input of the first comparator 902. The inverting input of the second comparator 904 is coupled to a voltage source set a voltage equivalent to the difference of the target bandgap reference voltage and an offset voltage (e.g., $V_{BG}$-$V_{OFFSET}$). The voltage source set a voltage equivalent to the difference of the target bandgap reference voltage and an offset voltage (e.g., $V_{BG}$-$V_{OFFSET}$) sets a lower threshold for the offset window detector 802. In some examples, the offset voltage can be 10 mV. For example, (a) the non-inverting input of the second comparator 904 can be coupled to the output of the bandgap reference voltage generator 710 and the inverting input of the first comparator 902 and (b) the inverting input of the second comparator 904 is coupled to a voltage source set a voltage equivalent to the difference of the target bandgap reference voltage and an offset voltage (e.g., $V_{BG}$-$V_{OFFSET}$) so that the second comparator 904 can determine whether the voltage of the bandgap reference voltage, $V_{BG}$, is greater than or less than the lower threshold. The output of the second comparator 904 is coupled to the second input of the third logic gate 906. For example, the output of the second comparator 904 can be coupled to the second input of the third logic gate 906 to provide the third logic gate 906 with the result of the determination made by the second comparator 904.

In additional or alternative examples, the non-inverting input of the second comparator 904 is coupled to the input reference voltage node $V_{REF\_IN}$ and the inverting input of the first comparator 902. The inverting input of the second comparator 904 is coupled to a voltage source set to a voltage equivalent to the difference of the target input reference voltage and an offset voltage (e.g., $V_{REF\_IN}$-$V_{OFFSET}$). The voltage source set to a voltage equivalent to the difference of the target input reference voltage and an offset voltage (e.g., $V_{REF\_IN}$-$V_{OFFSET}$) sets a lower threshold for the offset window detector 802. In some examples, the offset voltage can be 10 mV. For example, (a) the non-inverting input of the second comparator 904 can be coupled to the input reference voltage node $V_{REF\_IN}$ and the inverting input of the first comparator 902 and (b) the inverting input of the second comparator 904 can be coupled to a voltage source set to a voltage equivalent to the difference of the target input reference voltage and an offset voltage (e.g., $V_{REF\_IN}$-$V_{OFFSET}$) so that the second comparator 904 can determine whether the voltage of the input reference voltage node $V_{REF\_IN}$ is greater than or less than the lower threshold. The output of the second comparator 904 is coupled to the second input of the third logic gate 906. For example, the output of the second comparator 904 can be coupled to the second input of the third logic gate 906 to provide the third logic gate 906 with the result of the determination made by the second comparator 904.

In the illustrated example of FIG. 9, the first input of the third logic gate 906 is coupled to the output of the first comparator 902. For example, the first input of the third logic gate 906 can be coupled to the output of the first comparator 902 to obtain the result of the determination made by the first comparator 902. The second input of the third logic gate 906 is coupled to the output of the second comparator 904. For example, the second input of the third logic gate 906 can be coupled to the output of the second comparator 904 to obtain the result of the determination made by the second comparator 904. The output of the third logic gate 906 is coupled to the first input of the fourth logic gate 908. For example, the output of the third logic gate 906 can be coupled to the first input of the fourth logic gate 908 to provide the fourth logic gate 908 with an offset window confirmation signal, $V_{OW\_OK}$.

In the example illustrated in FIG. 9, the first input of the fourth logic gate 908 is coupled to the output of the third logic gate 906. For example, the first input of the fourth logic gate 908 can be coupled to the output of the third logic gate 906 to obtain the offset window confirmation signal, $V_{OW\_OK}$. The second input of the fourth logic gate 908 is coupled to the output of the oscillator 812, the input of the first inverter 814, and the second input of the first logic gate 816. For example, the second input of the fourth logic gate 908 can be coupled to the output of the oscillator 812, the input of the first inverter 814, and the second input of the first logic gate 816 to obtain the clock signal, CLK. The output of the fourth logic gate 908 is coupled to the input of the third inverter 910, the gate of the first switch 912 ($M_{N1}$), and the first input of the sixth logic gate 944. For example, the output of the fourth logic gate 908 can be coupled to the input of the third inverter 910, the gate of the first switch 912 ($M_{N1}$), and the first input of the sixth logic gate 944 to provide the third inverter 910 the first switch 912 ($M_{N1}$), and the sixth logic gate 944 with the reference confirmation signal, $V_{REF\_OK}$.

In the illustrated example of FIG. 9, the input of the third inverter 910 is coupled to the output of the fourth logic gate 908, the gate of the first switch 912 ($M_{N1}$), and the first input of the sixth logic gate 944. For example, the input of the third inverter 910 can be coupled to the output of the fourth logic gate 908, the gate of the first switch 912 ($M_{N1}$), and the first input of the sixth logic gate 944 to obtain the reference confirmation signal, $V_{REF\_OK}$. The output of the third inverter 910 is coupled to the first input of the fifth logic gate 928 and the gate of the fourth switch 932. For example, the output of the third inverter 910 can be coupled to the first input of the fifth logic gate 928 and the gate of the fourth switch 932 to provide the fifth logic gate 928 and the fourth switch 932 with the complimented reference confirmation signal, $V_{REF\_OK\_B}$.

In the example illustrated in FIG. 9, the gate of the first switch 912 ($M_{N1}$) is coupled to the output of the fourth logic gate 908, the input of the third inverter 910, and the first input of the sixth logic gate 944. For example, the gate of the first switch 912 ($M_{N1}$) can be coupled to the output of the fourth logic gate 908, the input of the third inverter 910, and the first input of the sixth logic gate 944 to obtain the reference confirmation signal, $V_{REF\_OK}$. The source of the first switch 912 ($M_{N1}$) is coupled to the ground node 810, the second terminal of the second biasing current source 922, the source of the seventh switch 938, and the second terminal of the second charge capacitor 940. For example, the source of the first switch 912 ($M_{N1}$) can be coupled to the ground node 810, the second terminal of the second biasing current source 922, the source of the seventh switch 938, and the second terminal of the second charge capacitor 940 to ground the source of the first switch 912 (MO. The drain of the first switch 912 (MO is coupled to the second terminal of the first biasing current source 914. For example, the drain of the first switch 912 ($M_{N1}$) can be coupled to the second terminal of the first biasing current source 914 to obtain a first bias current, $I_{BIAS1}$, generated by the first biasing current source 914.

In the illustrated example of FIG. 9, the first terminal of the first biasing current source 914 is coupled to the second terminal of the first charge capacitor 916 ($C_1$), the drain of the second switch 918 ($M_{P2}$), and the gate of the third switch 920 ($M_{P1}$). The second terminal of the first biasing current source 914 is coupled to the drain of the first switch 912 ($M_{N1}$). For example, the first terminal of the first biasing current source 914 can be coupled to the second terminal of the first charge capacitor 916 ($C_1$), the drain of the second switch 918 ($M_{P2}$), and the gate of the third switch 920 ($M_{P1}$), and the second terminal of the first biasing current source 914 can be coupled to the drain of the first switch 912 ($M_{N1}$) to set the current flowing through the first charge capacitor 916 ($C_1$), the second switch 918 ($M_{P2}$), and/or the first switch 912 ($M_{N1}$) to be equal to the first biasing current, $I_{BIAS1}$. In some examples, the first biasing current, $I_{BIAS1}$, can be equivalent to the product of a factor, K, and the biasing current, $I_{BIAS}$, of the operational amplifier 712 (e.g., $I_{BIAS1}=K*I_{BIAS}$). The example factor, K, and corresponding temperature coefficient can be weighted to improve (a) control of the sampling switch 728 and (b) tracking of the time response (e.g., settling time) of the feedback network and amplifier formed by the operational amplifier 712, the biasing current source 714, the compensation capacitor 718 ($C_C$), and the first switch 720.

In the example illustrated in FIG. 9, the first terminal of the first charge capacitor 916 is coupled to the voltage supply node 808 ($V_{DD}$), the source of the second switch 918 ($M_{P2}$), the source of the third switch 920 ($M_{P3}$), and the first terminal of the third biasing current source 930. For example, the first terminal of the first charge capacitor 916 can be coupled to the voltage supply node 808 ($V_{DD}$), the source of the second switch 918 ($M_{P2}$), the source of the third switch 920 ($M_{P3}$), and the first terminal of the third biasing current source 930 to charge the first charge capacitor 916. The second terminal of the first charge capacitor 916 ($C_1$) is coupled to the drain of the second switch 918 ($M_{P2}$), the gate of the third switch 920 ($M_{P3}$), and the first terminal of the first biasing current source 914. For example, the second terminal of the first charge capacitor 916 can be coupled to the drain of the second switch 918 ($M_{P2}$), the gate of the third switch 920 ($M_{P3}$), and the first terminal of the first biasing current source 914 to track the time response of the compensation capacitor 718 ($C_C$). The example capacitance of the first charge capacitor 916 ($C_1$) is equivalent to the product of a factor, N, and the capacitance of the compensation capacitor 718 ($C_C$) (e.g., $C_1=N*C_C$). The example factor, N, and corresponding temperature coefficient can be weighted to improve (a) control of the sampling switch 728 and (b) tracking of the time response of the compensation capacitor 718 ($C_C$).

In the illustrated example of FIG. 9, the source of the second switch 918 ($M_{P2}$) is coupled to the voltage supply node 808 ($V_{DD}$), the first terminal of the first charge capacitor 916 ($C_1$), the source of the third switch 920 ($M_{P1}$), and the first terminal of the third biasing current source 930. The drain of the second switch 918 ($M_{P2}$) is coupled to the second terminal of the first charge capacitor 916, the gate of the third switch 920 ($M_{P1}$), and the first terminal of the first biasing current source 914. The gate of the second switch 918 ($M_{P2}$) is coupled to the output of the fifth logic gate 928. For example, the second switch 918 ($M_{P1}$) can be coupled between the voltage supply node 808 ($V_{DD}$), the first terminal of the first charge capacitor 916 ($C_1$), the source of the third switch 920 ($M_{P1}$), the first terminal of the third biasing current source 930, the second terminal of the first charge capacitor 916, the gate of the third switch 920 ($M_{P1}$), and the first terminal of the first biasing current source 914 to bypass the first charge capacitor 916 ($C_1$) based on the voltage of a settling confirmed signal, $V_{SETTLE}$, at the output of the fifth logic gate 928.

In the example illustrated in FIG. 9, the gate of the third switch 920 ($M_{P1}$) is coupled to the first terminal of the first biasing current source 914, the second terminal of the first charge capacitor 916 ($C_1$), and the drain of the second switch 918 ($M_{P2}$). The source of the third switch 920 ($M_{P1}$) is coupled to the voltage supply node 808 ($V_{DD}$), the first terminal of the first charge capacitor 916 ($C_1$), the source of the second switch 918 ($M_{P2}$), and the first terminal of the third biasing current source 930. The drain of the third switch 920 ($M_{P1}$) is coupled to the first terminal of the second biasing current source 922 and the input of the first trigger 924. For example, the third switch 920 ($M_{P1}$) can be coupled between the voltage supply node 808 ($V_{DD}$), the first terminal of the first charge capacitor 916 ($C_1$), the source of the second switch 918 ($M_{P2}$), the first terminal of the third biasing current source 930, the first terminal of the second biasing current source 922, and the input of the first trigger 924 to set the voltage at the input of the first trigger 924 based on the voltage at the second terminal of the first charge capacitor 916 ($C_1$) and/or the drain of the second switch 918 ($M_{P2}$). For example, the gate of the third switch 920 ($M_{P1}$) can be coupled to the second terminal of the first charge capacitor 916 and/or the drain of the second switch 918 ($M_{P2}$) to track the time response of the first switch 720. The example threshold voltage, $V_{th\_MP1}$, of the third switch 920 ($M_{P1}$) is proportional to the threshold voltage of the first switch 720. In the illustrated example of FIG. 9, the voltage at the second terminal of the first biasing current source 914, the second terminal of the first charge capacitor 916 ($C_1$), the drain of the second switch 918 ($M_{P2}$), and the gate of the third switch 920 ($M_{P1}$) is dependent on the delay of the settling time detector 804. In the example of FIG. 9, the time delay of the settling time detector 804 is equivalent to the quotient of (a) the product of the capacitance of the first charge capacitor 916 ($C_1$) and the threshold voltage, $V_{th\_MP1}$, of the third switch 920 ($M_{P1}$) and (b) the first biasing current, $I_{BIAS1}$ (e.g., $$\left(e.g., D_1 = \frac{C_1 * V_{th\_MP1}}{I_{BIAS1}}\right).$$

In the illustrated example of FIG. 9, the first terminal of the second biasing current source 922 is coupled to the drain of the third switch 920 ($M_{P1}$) and the input of the first trigger 924. The second terminal of the second biasing current source 922 is coupled to the ground node 810, the source of the first switch 912 ($M_{N1}$), the source of the seventh switch 938, and the second terminal of the second charge capacitor 940. For example, the first terminal of the second biasing current source 922 can be coupled to the drain of the third switch 920 ($M_{P1}$) and the input of the first trigger 924, and the second terminal of the second biasing current source 922 can be coupled to the ground node 810, the source of the first switch 912 ($M_{N1}$), the source of the seventh switch 938, and the second terminal of the second charge capacitor 940 to set the current flowing through the third switch 920 ($M_{P1}$) to be equal to the second biasing current, $I_{BIAS2}$. In some examples, the second biasing current, $I_{BIAS2}$, can be equivalent to the biasing current, $I_{BIAS}$, of the operational amplifier 712 (e.g., $I_{BIAS2}=I_{BIAS}$).

In the example illustrated in FIG. 9, the input of the first trigger 924 is coupled to the drain of the third switch 920 ($M_{P1}$) and the first terminal of the second biasing current source 922. For example, the input of the first trigger 924 can be coupled to the drain of the third switch 920 ($M_{P1}$) and the first terminal of the second biasing current source 922 to obtain the voltage at the drain of the third switch 920 ($M_{P1}$) and the first terminal of the second biasing current source 922. The output of the first trigger 924 is coupled to the input of the fourth inverter 926, the second input of the fifth logic gate 928, and the second input of the sixth logic gate 944. For example, the output of the first trigger 924 can be coupled to the input of the fourth inverter 926, the second input of the fifth logic gate 928, and the second input of the sixth logic gate 944 to provide the fourth inverter 926, the fifth logic gate 928, and the sixth logic gate 944 with the first delay confirmation signal, $V_{DEL2\_OK}$. In the example of FIG. 9, the first trigger 924 outputs a logic high value as the first delay confirmation signal, $V_{DEL2\_OK}$, when the voltage at the drain of the third switch 920 ($M_{P1}$) and the first terminal of the second biasing current source 922 satisfies the threshold of the first trigger 924.

In the example illustrated in FIG. 9, the input of the fourth inverter 926 is coupled to the output of the first trigger 924 and the second input of the fifth logic gate 928. For example, the input of the fourth inverter 926 can be coupled to the output of the first trigger 924 and the second input of the fifth logic gate 928 to obtain the first delay confirmation signal, $V_{DEL2\_OK}$. The output of the fourth inverter 926 is coupled to the gate of the fifth switch 934 ($M_{P4}$). For example, the output of the fourth inverter 926 can be coupled to the gate of the fifth switch 934 ($M_{P4}$) to provide the complimented first delay confirmation signal, $V_{DEL2\_OK\_B}$, to the gate of the fifth switch 934 ($M_{P4}$) to control conduction of current through the fifth switch 934 ($M_{P4}$).

In the illustrated example of FIG. 9, the first input of the fifth logic gate 928 is coupled to the output of the third inverter 910 and the gate of the fourth switch 932 (MP3). For example, the first input of the fifth logic gate 928 can be coupled to the output of the third inverter 910 and the gate of the fourth switch 932 ($M_{P3}$) to obtain the complimented reference confirmation signal, $V_{REF\_OK\_B}$. The second input of the fifth logic gate 928 is coupled to the output of the first trigger 924, the input of the fourth inverter 926, and the second input of the sixth logic gate 944. The second input of the fifth logic gate 928 can be coupled to the output of the first trigger 924, the input of the fourth inverter 926, and the second input of the sixth logic gate 944 to obtain the first delay confirmation signal, $V_{DEL2\_OK}$. The output of the fifth logic gate 928 is coupled to the gate of the second switch 918 ($M_{P2}$). For example, the output of the fifth logic gate 928 can be coupled to the gate of the second switch 918 ($M_{P2}$) to provide the gate of the second switch 918 ($M_{P2}$) with the settling confirmed signal, $V_{SETTLE}$, to control the flow of current through the second switch 918 ($M_{P2}$).

In the example illustrated in FIG. 9, the first terminal of the third biasing current source 930 is coupled to the voltage supply node 808 ($V_{DD}$), the first terminal of the first charge capacitor 916 ($C_1$), the source of the second switch 918 ($M_{P2}$), and the source of the third switch 920 ($M_{P1}$). The second terminal of the third biasing current source 930 is coupled to the source of the fourth switch 932 ($M_{P3}$). For example, the first terminal of the third biasing current source 930 can be coupled to the voltage supply node 808 ($V_{DD}$), the first terminal of the first charge capacitor 916 ($C_1$), the source of the second switch 918 ($M_{P2}$), and the source of the third switch 920 ($M_{P1}$), and the second terminal of the third biasing current source 930 can be coupled to the source of the fourth switch 932 ($M_{P3}$) to set the current flowing through fourth switch 932 ($M_{P3}$), the fifth switch 934 ($M_{P4}$), the sixth switch 936 ($M_{N2}$), the seventh switch 938 ($M_{N3}$), and/or the second charge capacitor 940 ($C_2$) to be equal to the third biasing current, $I_{BIAS3}$. In some examples, the third biasing current, $I_{BIAS3}$, can be equivalent to the quotient of (a) a fixed biasing voltage, $V_{BIAS}$, and (b) the product of a factor, M, and the resistance of the first filter resistor 734 ($R_{F1}$) (e.g., $$\left(e.g., I_{BIAS3} = \frac{V_{BIAS}}{R_{F1} * M}\right).$$

The example factor, M, and corresponding temperature coefficient can be weighted to improve (a) control of the sampling switch 728 and (b) tracking of the time response of the RC filter formed by the first filter resistor 734 ($R_{F1}$) and the first filter capacitor 736 ($C_{F1}$).

In the illustrated example of FIG. 9, the source of the fourth switch 932 ($M_{P3}$) is coupled to the second terminal of the third biasing current source 930. For example, the source of the fourth switch 932 ($M_{P3}$) can be coupled to the second terminal of the third biasing current source 930 to obtain the third biasing current, $I_{BIAS3}$. The drain of the fourth switch 932 ($M_{P3}$) is coupled to the source of the fifth switch 934 ($M_{P4}$). For example, the drain of the fourth switch 932 ($M_{P3}$) can be coupled to the source of the fifth switch 934 ($M_{P4}$) to provide the third biasing current, $I_{BIAS3}$, to the fifth switch 934 ($M_{P4}$). The gate of the fourth switch 932 ($M_{P3}$) is coupled to the output of the third inverter 910 and the first input of the fifth logic gate 928. For example, the gate of the fourth switch 932 ($M_{P3}$) can be coupled to the output of the third inverter 910 and the first input of the fifth logic gate 928 to obtain the complimented reference confirmation signal, $V_{REF\_OK\_B}$.

In the example illustrated in FIG. 9, the source of the fifth switch 934 ($M_{P4}$) is coupled to the drain of the fourth switch 932 ($M_{P3}$). For example, the source of the fifth switch 934 ($M_{P4}$) can be coupled to the drain of the fourth switch 932 ($M_{P3}$) to obtain the third biasing current, $I_{BIAS3}$, from the drain of the fourth switch 932 ($M_{P3}$). The drain of the fifth switch 934 ($M_{P4}$) is coupled to the drain of the sixth switch 936 ($M_{N2}$) and the input of the second trigger 942. For example, the drain of the fifth switch 934 ($M_{P4}$) can be coupled to the drain of the sixth switch 936 ($M_{N2}$) and the input of the second trigger 942 to provide the third biasing current, $I_{BIAS3}$, to the drain of the sixth switch 936 ($M_{N2}$).

The gate of the fifth switch 934 (MP$_4$) is coupled to the output of the fourth inverter 926. For example, the gate of the fifth switch 934 (M$_{P4}$) can be coupled to the output of the fourth inverter 926 to obtain the complimented first delay confirmation signal, V$_{DEL2\_OK\_B}$.

In the illustrated example of FIG. 9, the drain of the sixth switch 936 (M$_{N2}$) is coupled to the drain of the fifth switch 934 (M$_{P4}$) and the input of the second trigger 942. For example, the drain of the sixth switch 936 (M$_{N2}$) can be coupled to the drain of the fifth switch 934 (M$_{P4}$) and the input of the second trigger 942 to obtain the third biasing current, I$_{BIAS3}$, from the drain of the fifth switch 934 (M$_{P4}$). The source of the sixth switch 936 (M$_{N2}$) is coupled to the drain of the seventh switch 938 (M$_{N3}$) and the first terminal of the second charge capacitor 940 (C$_2$). For example, the source of the sixth switch 936 (M$_{N2}$) can be coupled to the drain of the seventh switch 938 (M$_{N3}$) and the first terminal of the second charge capacitor 940 (C$_2$) to provide the third biasing current, I$_{BIAS3}$, to the seventh switch 938 (M$_{N3}$) and/or the second charge capacitor 940 (C$_2$). The gate of the sixth switch 936 (M$_{N2}$) is coupled to a biasing voltage source set to a voltage equivalent to the sum of the fixed biasing voltage, V$_{BIAS}$, and a threshold voltage V$_{th\_MN2}$, of the sixth switch 936 (M$_{N2}$) (e.g., V$_{BIAS}$+V$_{th\_MN2}$). For example, the gate of the sixth switch 936 (M$_{N2}$) can be coupled to the biasing voltage source set to a voltage equivalent to the sum of the fixed biasing voltage, V$_{BIAS}$, and a threshold voltage V$_{th\_MN2}$, of the sixth switch 936 (M$_{N2}$) (e.g., V$_{BIAS}$+V$_{th\_MN2}$) to enable the sixth switch 936 (M$_{N2}$). In the example of FIG. 9, when the rising edge of the voltage at the first terminal of the second charge capacitor 940 (C$_2$) reaches the biasing voltage, V$_{BIAS}$, the sixth switch 936 (M$_{N2}$) is disabled and the voltage of a second delay confirmation signal, V$_{DEL3\_OK}$, at the drain of the fifth switch 934 (M$_{P4}$), the drain of the sixth switch 936 (M$_{N2}$), and the input of the second trigger 942 rises to a logic high value.

In the example illustrated in FIG. 9, the drain of the seventh switch 938 (M$_{N3}$) is coupled to the source of the sixth switch 936 (M$_{N2}$) and the first terminal of the second charge capacitor 940 (C$_2$). For example, the drain of the seventh switch 938 (M$_{N3}$) can be coupled to the source of the sixth switch 936 (M$_{N2}$) and the first terminal of the second charge capacitor 940 (C$_2$) to obtain the third biasing current, I$_{BIAS3}$, from the source of the sixth switch 936 (M$_{N2}$). The source of the seventh switch 938 (M$_{N3}$) is coupled to the ground node 810, the source of the first switch 912 (M$_{N1}$), the second terminal of the second biasing current source 922, and the second terminal of the second charge capacitor 940 (C$_2$). For example, the source of the seventh switch 938 (M$_{N3}$) can be coupled to the ground node 810, the source of the first switch 912 (M$_{N1}$), the second terminal of the second biasing current source 922, and the second terminal of the second charge capacitor 940 (C$_2$) to ground the source of the seventh switch 938 (M$_{N3}$). The gate of the seventh switch 938 (M$_{N3}$) is coupled to the output of the first inverter 814. For example, the gate of the seventh switch 938 (M$_{N3}$) can be coupled to the output of the first inverter 814 to obtain the complimented clock signal, CLK_B.

In the illustrated example of FIG. 9, the first terminal of the second charge capacitor 940 (C$_2$) is coupled to the source of the sixth switch 936 (M$_{N2}$), and the drain of the seventh switch 938 (M$_{N3}$). For example, the first terminal of the second charge capacitor 940 (C$_2$) can be coupled to the source of the sixth switch 936 (M$_{N2}$), and the drain of the seventh switch 938 (M$_{N3}$) to set the voltage of a second delay confirmation signal, V$_{DEL3\_OK}$, at the drain of the fifth switch 934 (M$_{P4}$), the drain of the sixth switch 936 (M$_{N2}$), and the input of the second trigger 942. The second terminal of the second charge capacitor 940 (C$_2$) is coupled to the ground node 810, the source of the first switch 912 (M$_{N1}$), the second terminal of the second biasing current source 922, and the source of the seventh switch 938 (M$_{N3}$). For example, second terminal of the second charge capacitor 940 (C$_2$) can be coupled to the ground node 810, the source of the first switch 912 (MO, the second terminal of the second biasing current source 922, and the source of the seventh switch 938 (M$_{N3}$) to ground the second charge capacitor 940 (C$_2$). For example, the second charge capacitor 940 (C$_2$) can be coupled between the source of the sixth switch 936 (M$_{N2}$) and the ground node 810 to track the time response of the first filter capacitor 736 (C$_{F1}$) and/or the second filter capacitor 740 (C$_{F2}$). The example capacitance of the second charge capacitor 940 (C$_2$) is equivalent to the product of a factor, L, and the capacitance of the first filter capacitor 736 (C$_{F1}$) (e.g., C$_2$=L*C$_{F1}$). The example factor, L, and corresponding temperature coefficient can be weighted to improve (a) control of the sampling switch 728 and (b) tracking of the time response of the first filter capacitor 736 (C$_{F1}$) and/or the second filter capacitor 740 (C$_{F2}$).

In the example illustrated in FIG. 9, the input of the second trigger 942 is coupled to the drain of the fifth switch 934 (M$_{P4}$) and the drain of the sixth switch 936 (M$_{N2}$). For example, the input of the second trigger 942 can be coupled to the drain of the fifth switch 934 (M$_{P4}$) and the drain of the sixth switch 936 (M$_{N2}$) to obtain the voltage at the source of the sixth switch 936 (M$_{N2}$), the drain of the seventh switch 938 (M$_{N3}$), and the first terminal of the second charge capacitor 940 (C$_2$). The output of the second trigger 942 is coupled to the first input of the first logic gate 816. For example, the output of the second trigger 942 can be coupled to the first input of the first logic gate 816 to provide the first logic gate 816 with the end sample signal, V$_{SAMPLE\_END}$.

In the illustrated example of FIG. 9, the voltage at the source of the sixth switch 936 (M$_{N2}$), the drain of the seventh switch 938 (M$_{N3}$), and the first terminal of the second charge capacitor 940 (C$_2$) is dependent on the delay of the sample acquisition controller 806. In the example of FIG. 9, the delay of the sample acquisition controller 806 is equivalent to the quotient of (a) the product of the capacitance of the second charge capacitor 940 (C$_2$) and the fixed biasing voltage, V$_{BIAS}$, and (b) the third biasing current, I$_{BIAS3}$ (e.g., $$\left(e.g., D_2 = \frac{C_2 * V_{BIAS}}{I_{BIAS3}} \propto C_2 * R_{F1}\right).$$

In the example of FIG. 9, the second trigger 942 outputs a logic high value as the sample end signal, V$_{SAMPLE\_END}$, when the voltage at the source of the sixth switch 936 (M$_{N2}$), the drain of the seventh switch 938 (M$_{N3}$), and the first terminal of the second charge capacitor 940 (C$_2$) satisfies the threshold of the second trigger 942.

In the example illustrated in FIG. 9, the first input of the sixth logic gate 944 is coupled to output of the fourth logic gate 908, the input of the third inverter 910, and the gate of the first switch 912 (M$_{N1}$). For example, the first input of the sixth logic gate 944 can be coupled to output of the fourth logic gate 908, the input of the third inverter 910, and the gate of the first switch 912 (M$_{N1}$) to obtain the reference confirmation signal, V$_{REF\_OK}$. The second input of the sixth logic gate 944 is coupled to the output of the first trigger 924, the input of the fourth inverter 926, and the second input of the fifth logic gate 928. For example, the second input of the sixth logic gate 944 can be coupled to the output of the first trigger 924, the input of the fourth inverter 926, and the second input of the fifth logic gate 928 to obtain the first delay confirmation signal, $V_{DEL2\_OK}$. The output of the sixth logic gate 944 is coupled to the first input of the second logic gate 818. For example, the output of the sixth logic gate 944 can be coupled to the first input of the second logic gate 818 to provide the second logic gate 818 with the start sample signal, $V_{SAMPLE\_START}$.

In example operation, when the oscillator 812 generates a logic high value, (e.g., when there is a rising edge on the clock signal, CLK), the first logic gate 816 generates a logic high value as the on-time signal, $V_{ON\_TIME}$. As such, the second inverter 820 generates a logic low value as the complimented on-time signal, $V_{ON\_TIME\_B}$, to enable the power control switch 708. While the power control switch 708 is enabled, the bandgap reference voltage, $V_{BG}$, generated by the bandgap reference voltage generator 710 rises. The offset window detector 802 monitors the bandgap reference voltage, $V_{BG}$, as it rises and determines whether the voltage of the bandgap reference voltage, $V_{BG}$, meets a bandgap threshold of a target bandgap reference voltage (e.g., the bandgap reference voltage, $V_{BG}$, is within an offset window (e.g., a range of +/−10 mV)).

In example operation, if the offset window detector 802 determines that the bandgap reference voltage, $V_{BG}$, meets the bandgap threshold, the offset window detector 802 sets the reference confirmation signal, $V_{REF\_OK}$, and the complimented reference confirmation signal, $V_{REF\_OK\_B}$, to a logic high value and logic low value, respectively. If the offset window detector 802 determines that the bandgap reference voltage, $V_{BG}$, does not meet the bandgap threshold, the offset window detector 802 continues to sample and/or otherwise monitor the bandgap reference voltage, $V_{BG}$.

For example, if (a) the first comparator 902 determines that the voltage of the bandgap reference voltage, $V_{BG}$, is less than the upper threshold (e.g., $V_{BG}+V_{OFFSET}$) and (b) the second comparator 904 determines that the voltage of the bandgap reference voltage, $V_{BG}$, is greater than the lower threshold (e.g., $V_{BG}-V_{OFFSET}$), the third logic gate 906 outputs a logic high value. In other words, if the first comparator 902 and the second comparator 904 determine that the bandgap reference voltage, $V_{BG}$, is within the offset window (e.g., the bandgap reference voltage, $V_{BG}$, meets the bandgap threshold, is within the range, etc.), the third logic gate 906 outputs a logic high value. Otherwise, the third logic gate 906 outputs a logic low value.

In additional or alternative examples, in operation, the offset window detector 802 can sample and/or otherwise monitor the signal at the input reference voltage node $V_{REF\_IN}$, to determine whether the voltage at the input reference voltage node $V_{REF\_IN}$ meets an input reference voltage threshold of a target input reference voltage (e.g., the voltage at the input reference voltage node $V_{REF\_IN}$ is within an offset window (e.g., a range of +/−10 mV)).

In example operation, if the offset window detector 802 determines that the voltage at the input reference voltage node $V_{REF\_IN}$ meets the input reference voltage threshold, the offset window detector 802 sets the reference confirmation signal, $V_{REF\_OK}$ and the complimented reference confirmation signal, $V_{REF\_OK\_B}$, to a logic high value and logic low value, respectively. If the offset window detector 802 determines that the voltage at the input reference voltage node $V_{REF\_IN}$ does not meet the input reference voltage threshold, the offset window detector 802 continues to sample and/or otherwise monitor the signal at the input reference voltage node $V_{REF\_IN}$.

For example, if (a) the first comparator 902 determines that the voltage the input reference voltage node $V_{REF\_IN}$ is less than the upper threshold (e.g., $V_{REF\_IN}+V_{OFFSET}$) and (b) the second comparator 904 determines that the voltage at the input reference voltage node $V_{REF\_IN}$ is greater than the lower threshold (e.g., $V_{REF\_IN} V_{OFFSET}$), the third logic gate 906 outputs a logic high value. In other words, if the first comparator 902 and the second comparator 904 determine that the voltage at the input reference voltage node $V_{REF\_IN}$ is within the offset window (e.g., within the range, the voltage at the input reference voltage node $V_{REF\_IN}$ meets the input reference voltage threshold, etc.), the third logic gate 906 outputs a logic high value. Otherwise, the third logic gate 906 outputs a logic low value.

As described, in example operation, if the offset window detector 802 determines that the voltage of the bandgap reference voltage, $V_{BG}$, meets the bandgap threshold and/or if the voltage at the input reference voltage node $V_{REF\_IN}$ meets the input reference voltage threshold, the offset window detector 802 sets the reference confirmation signal, $V_{REF\_OK}$ and the complimented reference confirmation signal, $V_{REF\_OK\_B}$, to a logic high value and logic low value, respectively. For example, because the clock signal, CLK, generated by the oscillator 812 is a logic high value, the fourth logic gate 908 outputs a logic high value as the reference confirmation signal, $V_{REF\_OK}$, if the output of the third logic gate 906 (e.g., the offset window confirmation signal, $V_{OW\_OK}$) is a logic high value. Otherwise, the fourth logic gate 908 outputs a logic low value as the reference confirmation signal, $V_{REF\_OK}$.

In example operation, in response to a logic high value on the reference confirmation signal, $V_{REF\_OK}$, and a falling edge of the complimented reference confirmation signal, $V_{REF\_OK\_B}$, the settling time detector 804 determines whether a voltage that is dependent upon a delay of the settling time detector 804 meets a first timing threshold. For example, in response to a logic high value on the reference confirmation signal, $V_{REF\_OK}$, the first switch 912 ($M_{N1}$) is enabled. Concurrently, in response to a rising edge on the complimented reference confirmation signal, $V_{REF\_OK\_B}$, the fifth logic gate 928 outputs a logic high value as the settling confirmed signal, $V_{SETTLE}$, thereby disabling the second switch 918 ($M_{P2}$), causing the first charge capacitor 916 ($C_1$) to charge, and enabling the fourth switch 932 ($M_{P3}$).

In example operation, while the first charge capacitor 916 ($C_1$) is charging, the third switch 920 ($M_{P1}$) is disabled. As the first charge capacitor 916 ($C_1$) approaches a voltage drop equivalent to the threshold voltage, $V_{th\_MP1}$, of the third switch 920 ($M_{P1}$), the third switch 920 ($M_{P1}$) is enabled. As such, while the first charge capacitor 916 ($C_1$) is charging, the voltage at the drain of the third switch 920 ($M_{P1}$), the first terminal of the second biasing current source 922, and the input of the first trigger 924 rises (e.g., rises quickly) to the threshold of the first trigger 924. In this manner, the third switch 920 ($M_{P1}$), the second biasing current source 922, and the first trigger 924 operate as a fast-acting inverting buffer. As such, the delay of the settling time detector 804 is equivalent to the time it takes for the voltage at the first terminal of the first biasing current source 914, the second terminal of the first charge capacitor 916 ($C_1$), the drain of the second switch 918 ($M_{P2}$), and the gate of the third switch 920 ($M_{P1}$) to rise to a voltage equivalent to the difference between (a) the voltage at the voltage supply node 808 ($V_{DD}$) and (b) a voltage drop equivalent to the threshold voltage, $V_{th\_MP1}$, of the third switch 920 ($M_{P1}$). As such, the time delay of the settling time detector 804 is equivalent to the quotient of (a) the product of the capacitance of the first charge capacitor 916 ($C_1$) and the threshold voltage, $V_{th\_MP1}$, of the third switch 920 ($M_{P1}$) and (b) the first biasing current, $I_{BIAS1}$ (e.g., $$D_1 = \frac{C_1 * V_{th\_MP1}}{I_{BIAS1}}).$$

In examples disclosed herein, the delay of the settling time detector 804 tracks the time response (e.g., the settling time) of the feedback network and amplifier formed by the operational amplifier 712, the biasing current source 714, the compensation capacitor 718 ($C_C$), and the first switch 720. For example, the first charge capacitor 916 ($C_1$) tracks the compensation capacitor 718 ($C_C$), the first biasing current source 914 tracks the biasing current source 714, and the third switch 920 ($M_{P1}$) tracks the first switch 720. In example operation, when the voltage at the drain of the third switch 920 ($M_{P1}$), the first terminal of the second biasing current source 922, and the input of the first trigger 924 satisfies the threshold of the first trigger 924 (e.g., the delay of the settling time detector 804), the first trigger 924 outputs a logic high value as the first delay confirmation signal, $V_{DEL2\_OK}$. The rising edge at the output of the first trigger 924 causes the fourth inverter 926 to output a logic low value as the complimented first delay confirmation signal, $V_{DEL2\_OK\_B}$, thereby enabling the fifth switch 934 ($M_{P4}$). Additionally, the rising edge at the output of the first trigger 924 causes the fifth logic gate 928 to output a logic high value as the settling confirmed signal, $V_{SETTLE}$, thereby enabling the second switch 918 ($M_{P2}$).

In example operation, in response to (a) the bandgap reference voltage, $V_{BG}$, meeting the bandgap threshold and/or the voltage at the input reference voltage node $V_{REF\_IN}$ meeting the input reference voltage threshold and (b) the voltage that is dependent upon the delay of the settling time detector 804 (e.g., the voltage at the first terminal of the first biasing current source 914, the second terminal of the first charge capacitor 916 ($C_1$), the drain of the second switch 918 ($M_{P2}$), and the gate of the third switch 920 ($M_{P1}$)) meeting the first timing threshold (e.g., the threshold voltage, $V_{th\_MP1}$, of the third switch 920 ($M_{P1}$)), the sample acquisition controller 806 causes the second logic gate 818 to indicate to sample the voltage at the input reference voltage node $V_{REF\_IN}$ (e.g., causes the second logic gate 818 to set the sample control signal, $V_{SAMPLE\_A}$ to a logic high value and/or causes the inverter 746 to set the complimented sample control signal, $V_{SAMPLE\_B}$ to a logic low value). For example, because the clock signal, CLK, generated by the oscillator 812 is a logic high value, the sixth logic gate 944 outputs a logic high value as the start sample signal, $V_{SAMPLE\_START}$, if the output of the first trigger 924 (e.g., the delay confirmation signal, $V_{DEL2\_OK}$) is a logic high value and the voltage at the inverting terminal of the first comparator 902 and/or the non-inverting terminal of the second comparator 904 is within the offset window. Otherwise, the sixth logic gate 944 outputs a logic low value as the start sample signal, $V_{SAMPLE\_START}$.

In example operation, after causing the second logic gate 818 to indicate to sample the voltage at the input reference voltage node $V_{REF\_IN}$, the sample acquisition controller 806 determines whether a voltage that is dependent upon a delay of the sample acquisition controller 806 meets a second timing threshold. For example, because the fourth switch 932 ($M_{P3}$), the fifth switch 934 ($M_{P4}$), and the sixth switch 936 ($M_{N2}$) are enabled, the second charge capacitor 940 ($C_2$) charges. While the second charge capacitor 940 ($C_2$) is charging, the voltage at the drain of the fifth switch 934 ($M_{P4}$), the drain of the sixth switch 936 ($M_{N2}$), and the input of the second trigger 942 rises to the threshold of the second trigger 942. The time it takes for the voltage at the drain of the fifth switch 934 ($M_{P4}$), the drain of the sixth switch 936 ($M_{N2}$), and the input of the second trigger 942 to rise to the threshold of the second trigger 942 (e.g., the delay of the sample acquisition controller 806) is equivalent to the quotient of (a) the product of the capacitance of the second charge capacitor 940 ($C_2$) and the fixed biasing voltage, $V_{BIAS}$, and (b) the third biasing current, $I_{BIAS3}$ (e.g., $$D_2 = \frac{C_2 * V_{BIAS}}{I_{BIAS3}} \propto C_2 * R_{F1}).$$

In examples disclosed herein, the delay of the sample acquisition controller 806 tracks the time response of the RC filter formed by the first filter resistor 734 ($R_{F1}$) and the first filter capacitor 736 (CFO. In response to the voltage that is dependent upon the delay of the sample acquisition controller 806 (e.g., the voltage at the drain of the fifth switch 934 ($M_{P4}$), the drain of the sixth switch 936 ($M_{N2}$), and the input of the second trigger 942) meeting the second timing threshold (e.g., the threshold of the second trigger 942), the sample acquisition controller 806 causes the second logic gate 818 to indicate to halt sampling of the voltage at the input reference voltage node $V_{REF\_IN}$ (e.g., causes the second logic gate 818 to set the sample control signal, $V_{SAMPLE\_A}$ to a logic low value and/or causes the inverter 746 to set the complimented sample control signal, $V_{SAMPLE\_B}$ to a logic high value). Additionally, in response to the voltage that is dependent upon the delay of the sample acquisition controller 806 (e.g.,) meeting the second timing threshold (e.g., the threshold of the second trigger 942), the sample acquisition controller 806 causes the first logic gate 816 to set the on-time signal, $V_{ON\_TIME}$, to a logic low value and consequently causes the second inverter 820 to set the logic value of the complimented on-time signal, $V_{ON\_TIME\_B}$, to a logic high value to disable to the power control switch 708.

For example, in example operation, when the voltage at the drain of the fifth switch 934 ($M_{P4}$), the drain of the sixth switch 936 ($M_{N2}$), and the input of the second trigger 942 satisfies the threshold of the second trigger 942 (e.g., the second delay confirmation signal, $V_{DEL3\_OK}$ is a logic high value), the second trigger 942 outputs a logic high value as the end sample signal, $V_{SAMPLE\_END}$. The rising edge at the output of the second trigger 942 causes the first logic gate 816 to output a logic low value as the on-time signal, $V_{ON\_TIME}$. The falling edge of the on-time signal, $V_{ON\_TIME}$, causes the second inverter 820 to output a logic high value as the complimented on-time signal, $V_{ON\_TIME\_B}$, thereby disabling the power control switch 708. The falling edge of the on-time signal, $V_{ON\_TIME}$, causes the second logic gate 818 to output a logic low value as the sample control signal, $V_{SAMPLE\_A}$, thereby disabling the second switch 730, the third switch 732, and the fourth switch 733, and enabling the fifth switch 742.

In operation, after the sample acquisition controller 806 causes the voltage at the input reference voltage node $V_{REF\_N}$, the clock signal, CLK, transitions to a logic low value. The falling edge of the clock signal, CLK, causes the first inverter 814 to output a logic high value as the complimented clock signal, CLK_B. The logic high value at the output of the first inverter 814 (e.g., the complimented clock signal, CLK_B) enables the seventh switch 938 ($M_{N3}$), thereby discharging the second charge capacitor 940 ($C_2$).

In example operation, if the offset window detector 802 determines that the bandgap reference voltage, $V_{BG}$, no longer meets the bandgap threshold (e.g., the bandgap reference voltage, $V_{BG}$, is within an offset window (e.g., a range of +/−10 mV)), the offset window detector 802 sets the reference confirmation signal, $V_{REF\_OK}$, and the complimented reference confirmation signal, $V_{REF\_OK\_B}$, to a logic low value and logic high value, respectively. Consequently, the offset window detector 802 and the settling time detector 804 are reset. As such, the sample controller 744 achieves robust sampling that is ensured by a glitch detection reset triggered by the input voltage (e.g., the bandgap reference voltage, $V_{BG}$, and/or the voltage at the input reference voltage node $V_{REF\_IN}$) falling outside the offset window (e.g., a range of +/−10 mV). For example, when the fourth logic gate 908 sets the reference confirmation signal, $V_{REF\_OK}$, to a logic low value and causes the third inverter 910 to set the complimented reference confirmation signal, $V_{REF\_OK\_B}$, to a logic high value, the fifth logic gate 928 outputs a logic low value. As a result, the fifth logic gate 928 enables the second switch 918 ($M_{P2}$) and causes the first charge capacitor 916 ($C_1$) to discharge. Additionally, when the fourth logic gate 908 causes the third inverter 910 to set the complimented reference confirmation signal, $V_{REF\_OK\_B}$, to a logic high value, the fourth switch 932 ($M_{P3}$) is disabled thereby causing the sample control signal, $V_{SAMPLE\_A}$, to transition to a logic low and halt sampling of the voltage at the input reference voltage node $V_{REF\_IN}$. Similarly, if the voltage that is dependent upon the delay of the settling time detector 804 (e.g., the voltage at the first terminal of the first biasing current source 914, the second terminal of the first charge capacitor 916 ($C_1$), the drain of the second switch 918 ($M_{P2}$), and the gate of the third switch 920 ($M_{P1}$)), the first terminal of the second biasing current source 922, and the input of the first trigger 924) does not meet the first timing threshold (e.g., the threshold voltage, Vd, of the third switch 920 ($M_{P1}$)), then the first trigger 924 outputs a logic low value as the first delay confirmation signal, $V_{DEL2\_OK}$, and causes the fourth inverter 926 to output a logic high value as the complimented first delay confirmation signal, $V_{DEL2\_OK\_B}$. As a result, the fifth switch 934 ($M_{P4}$) is disabled thereby causing the sample control signal, $V_{SAMPLE\_A}$, to transition to a logic low and halt sampling of the voltage at the input reference voltage node $V_{REF\_IN}$. As such, when the fourth logic gate 908 and/or the first trigger 924 output a logic low value as the reference confirmation signal, $V_{REF\_OK}$, and/or the first delay confirmation signal, $V_{DEL2\_OK}$, respectively, the second logic gate 818 outputs a logic low value as the sample control signal, $V_{SAMPLE\_A}$, and halts sampling of the voltage at the input reference voltage node $V_{REF\_IN}$.

Figure 10:
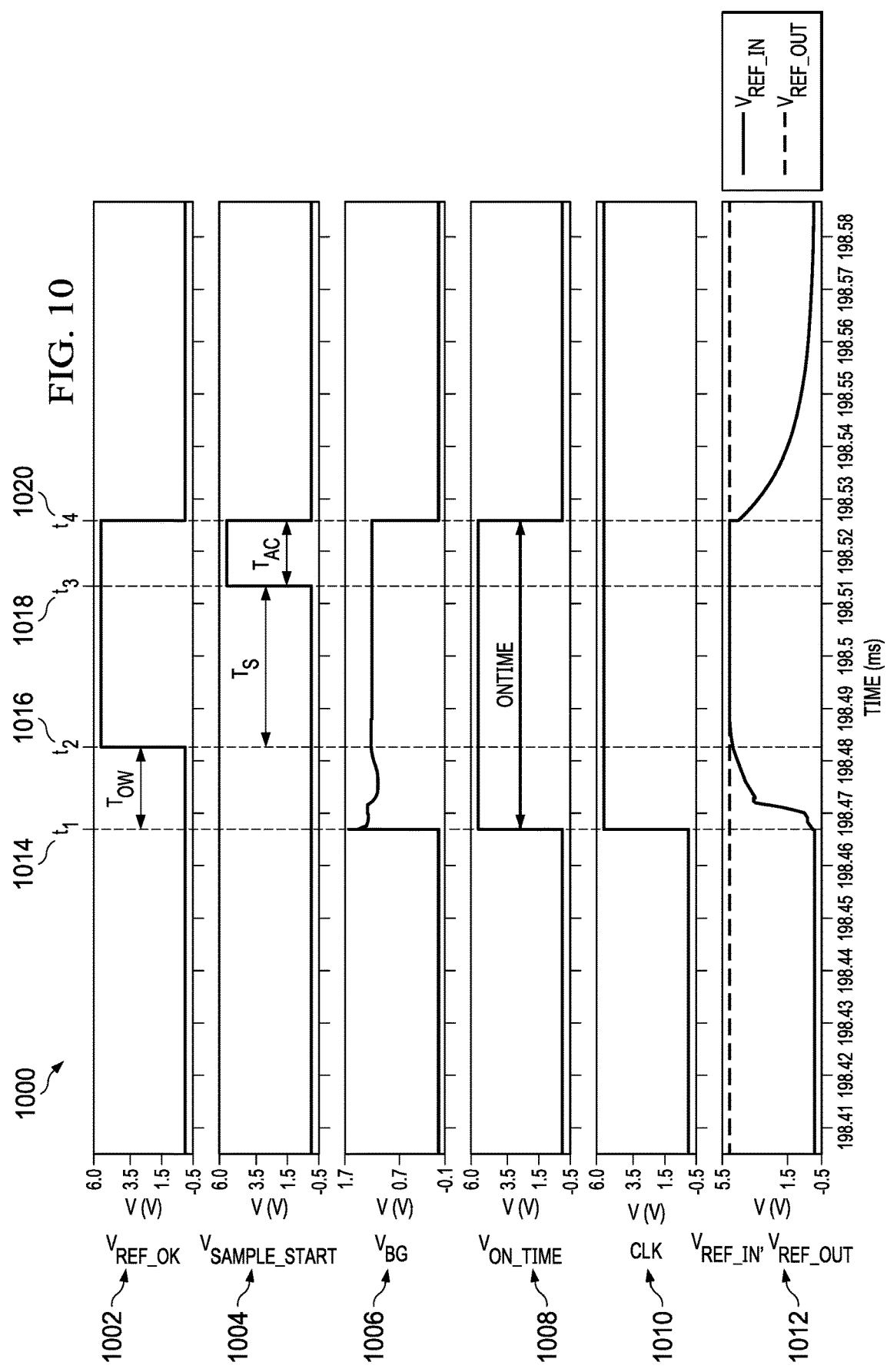
FIG. 10 is a graphical illustration depicting example operation of the example sample controller of FIGS. 7, 8, and 9.

FIG. 10 is a graphical illustration 1000 depicting example operation of the example sample controller 744 of FIGS. 7, 8, and 9. The graphical illustration 1000 is a timing diagram including six plots. The timing diagram of the graphical illustration 1000 includes an example first plot 1002 of the voltage of the reference confirmation signal, $V_{REF\_OK}$, in volts versus time in ms. The timing diagram of the graphical illustration 1000 includes an example second plot 1004 of the start sample signal, $V_{SAMPLE\_START}$, in volts versus time in ms. The timing diagram of the graphical illustration 1000 includes an example third plot 1006 the bandgap reference voltage, $V_{BG}$, in volts versus time is ms. The timing diagram of the graphical illustration 1000 includes an example fourth plot 1008 on-time signal, $V_{ON\_TIME}$, in volts versus time in ms. The timing diagram of the graphical illustration 1000 includes an example fifth plot 1010 of the clock signal, CLK, in volts versus time in ms. The timing diagram of the graphical illustration 1000 includes an example sixth plot 1012 of the voltage at the input reference voltage node $V_{REF\_IN}$ in volts and the voltage at the output reference voltage node $V_{REF\_OUT}$ in volts versus time in ms. The timing diagram of the graphical illustration 1000 includes a first time 1014 ($t_1$), a second time 1016 ($t_2$), a third time 1018 ($t_3$), and a fourth time 1020 ($t_4$).

In the illustrated example of FIG. 10, the period between the first time 1014 ($t_1$) and the second time 1016 ($t_2$) is the offset window detection time, $T_{OW}$. At the first time 1014 ($t_1$), the clock signal, CLK, of the fifth plot 1010 transitions from a logic low value to a logic high value. The rising edge of the clock signal, CLK, causes the on-time signal, $V_{ON\_TIME}$, to increase. Additionally, the rising edge of the clock signal, CLK, causes the bandgap reference voltage, $V_{BG}$, to increase. Between the first time 1014 ($t_1$) and the second time 1016 ($t_2$), the first comparator 902 determines whether the voltage of the bandgap reference voltage, $V_{BG}$, is less than the upper threshold (e.g., $V_{BG}+V_{OFFSET}$) and the second comparator 904 determines whether the voltage of the bandgap reference voltage, $V_{BG}$, is greater than the lower threshold (e.g., $V_{BG}-V_{OFFSET}$). During the offset window detection time, $T_{OW}$, the voltage of the bandgap reference voltage, $V_{BG}$, is rising to within a threshold of a target bandgap reference voltage (e.g., within 10 mV of the target bandgap reference voltage).

In the example illustrated in FIG. 10, at the second time 1016 ($t_2$) the first comparator 902 determines that the voltage of the bandgap reference voltage, $V_{BG}$, is less than the upper threshold (e.g., $V_{BG}+V_{OFFSET}$) and the second comparator 904 determines that the voltage of the bandgap reference voltage, $V_{BG}$, is greater than the lower threshold (e.g., $V_{BG}-V_{OFFSET}$), the third logic gate 906 outputs a logic high value. In other words, the first comparator 902 and the second comparator 904, and/or, more generally, the offset window detector 802 determine that the bandgap reference voltage, $V_{BG}$, is within the offset window (e.g., the bandgap reference voltage, $V_{BG}$, meets the bandgap threshold, is within the range, etc.). As a result, at the second time 1016 ($t_2$), the third logic gate 906 and/or, more generally, the offset window detector 802 outputs a logic high value as the reference confirmation signal $V_{REF\_OK}$.

In the example illustrated in FIG. 10, the period between the second time 1016 ($t_2$) and the third time 1018 ($t_3$) is the settling time detector delay period, $T_S$. In examples disclosed herein, the settling time detector delay period, $T_S$, is equivalent to the quotient of (a) the product of the capacitance of the first charge capacitor 916 ($C_1$) and the threshold voltage, $V_{th\_MP1}$, of the third switch 920 ($M_{P1}$) and (b) the first biasing current, $I_{BIAS1}$ (e.g., $$D_1 = \frac{C_1 * V_{th\_MP1}}{I_{BIAS1}}).$$

Between the second time 1016 ($t_2$) and the third time 1018 ($t_3$), the settling time detector 804 determines whether a voltage that is dependent upon a delay of the settling time detector 804 meets a first timing threshold. During the settling time detector delay period, $T_S$, the voltage at the input reference voltage node $V_{REF\_IN}$ is settling to within a threshold of a target input reference voltage (e.g., within 1 mV of the target input reference voltage).

For example, between the second time 1016 ($t_2$) and the third time 1018 ($t_3$), the first trigger 924 determines whether the voltage that is dependent upon the delay of the settling time detector 804 (e.g., the voltage at the first terminal of the first biasing current source 914, the second terminal of the first charge capacitor 916 ($C_1$), the drain of the second switch 918 ($M_{P2}$), and the gate of the third switch 920 ($M_{P1}$)), the first terminal of the second biasing current source 922, and the input of the first trigger 924) meets the first timing threshold (e.g., the threshold voltage, $V_{th\_MP1}$, of the third switch 920 ($M_{P1}$)). At the third time 1018 ($t_3$), the first trigger 924 determines that the voltage that is dependent upon the delay of the settling time detector 804 (e.g., the voltage at the first terminal of the first biasing current source 914, the second terminal of the first charge capacitor 916 ($C_1$), the drain of the second switch 918 ($M_{P2}$), and the gate of the third switch 920 ($M_{P1}$)), the first terminal of the second biasing current source 922, and the input of the first trigger 924) meets the first timing threshold (e.g., the threshold voltage, $V_{th\_MP1}$, of the third switch 920 ($M_{P1}$)).

In the example illustrated in FIG. 10, at the third time 1018, in response to (a) the bandgap reference voltage, $V_{BG}$, meeting the bandgap threshold and/or the voltage at the input reference voltage node $V_{REF\_IN}$ meeting the input reference voltage threshold and (b) the voltage that is dependent upon the delay of the settling time detector 804 (e.g., the voltage at the first terminal of the first biasing current source 914, the second terminal of the first charge capacitor 916 ($C_1$), the drain of the second switch 918 ($M_{P2}$), and the gate of the third switch 920 ($M_{P1}$)), the first terminal of the second biasing current source 922, and the input of the first trigger 924) meeting the first timing threshold (e.g., the threshold voltage, $V_{th\_MP1}$, of the third switch 920 ($M_{P1}$)), the sample acquisition controller 806 sets the start sample signal, $V_{SAMPLE\_START}$, to a logic high value.

In the illustrated example of FIG. 10, the period between the third time 1018 ($t_3$) and the fourth time 1020 ($t_4$) is the acquisition time, $T_{AC}$. In examples disclosed herein, the acquisition time, $T_{AC}$, is equivalent to the quotient of (a) the product of the capacitance of the second charge capacitor 940 ($C_2$) and the fixed biasing voltage, $V_{BIAS}$, and (b) the third biasing current, $I_{BIAS3}$ (e.g., $$T_{AC} = D_2 = \frac{C_2 * V_{BIAS}}{I_{BIAS3}} \propto C_2 * R_{F1}).$$

Between the third time 1018 ($t_3$) and the fourth time 1020 ($t_4$), the sample acquisition controller 806 determines whether a voltage that is dependent upon a delay of the sample acquisition controller 806 meets a second timing threshold.

For example, between the third time 1018 ($t_3$) and the fourth time 1020 ($t_4$), the second trigger 942 determines whether the voltage that is dependent upon a delay of the sample acquisition controller 806 (e.g., the voltage at the drain of the fifth switch 934 ($M_{P4}$), the drain of the sixth switch 936 ($M_{N2}$), and the input of the second trigger 942) meets the second timing threshold (e.g., the threshold of the second trigger 942). At the fourth time 1020 ($t_4$), the second trigger 942 determines that voltage that is dependent upon a delay of the sample acquisition controller 806 (e.g., the voltage at the drain of the fifth switch 934 ($M_{P4}$), the drain of the sixth switch 936 ($M_{N2}$), and the input of the second trigger 942) meets the second timing threshold (e.g., the threshold of the second trigger 942). Because of the accurate delays implemented during the offset window detection time, $T_{OW}$, the settling time detector delay period, $T_S$, and the acquisition time, $T_{AC}$, the voltage at the input reference voltage node $V_{REF\_IN}$ is highly accurate (e.g., within 1 mV of a target input reference voltage). Additionally, because of the accurate delays implemented during the offset window detection time, $T_{OW}$, the settling time detector delay period, $T_S$, and the acquisition time, $T_{AC}$, the voltage stored by the first filter capacitor 736 ($C_{F1}$) at the output reference voltage node $V_{REF\_OUT}$ and/or the voltage stored by the second filter capacitor 740 ($C_{F2}$) at the buffered output reference voltage node $V_{REF\_OUT\_BUFFERED}$, is maintained with reduced ripple voltage.

After the fourth time 1020 ($t_4$), the second trigger 942 causes the first logic gate 816 to output a logic low value as the on-time signal, $V_{ON\_TIME}$. The falling edge of the on-time signal, $V_{ON\_TIME}$, causes the second inverter 820 to output a logic high value as the complimented on-time signal, $V_{ON\_TIME\_B}$, thereby disabling the power control switch 708. The falling edge of the on-time signal, $V_{ON\_TIME}$, causes the second logic gate 818 to output a logic low value as the sample control signal, $V_{SAMPLE\_A}$, thereby disabling the second switch 730 and the third switch 732 and enabling the fifth switch 742. In other words, the second trigger 942 causes sampling (e.g., is to cause sampling) of the voltage at the input reference voltage node $V_{REF\_IN}$ to be disabled.

Figure 11:
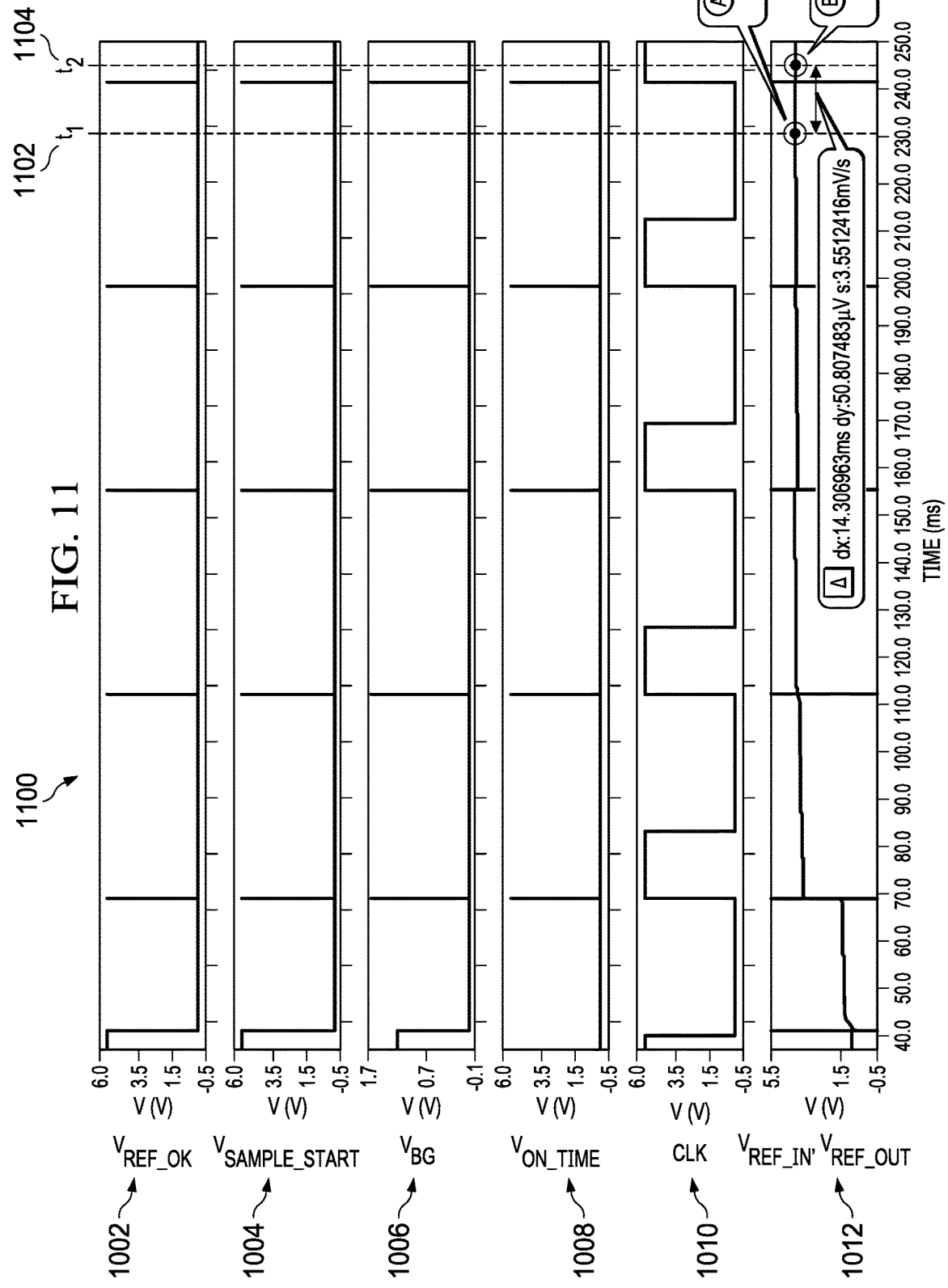
FIG. 11 is a graphical illustration depicting example operation of the example sample controller of FIGS. 8 and 9 at an increased time scale.

FIG. 11 is a graphical illustration 1100 depicting example operation of the example sample controller 744 of FIGS. 8 and 9 at an increased time scale. The graphical illustration 1100 is a timing diagram including six plots. The timing diagram of the graphical illustration 1100 includes the example first plot 1002 of the voltage of the reference confirmation signal, $V_{REF\_OK}$, in volts versus time in ms. The timing diagram of the graphical illustration 1100 includes the example second plot 1004 of the start sample signal, $V_{SAMPLE\_START}$, in volts versus time in ms. The timing diagram of the graphical illustration 1100 includes the example third plot 1006 the bandgap reference voltage, $V_{BG}$, in volts versus time is ms. The timing diagram of the graphical illustration 1100 includes the example fourth plot 1008 on-time signal, $V_{ON\_TIME}$, in volts versus time in ms. The timing diagram of the graphical illustration 1100 includes the example fifth plot 1010 of the clock signal, CLK, in volts versus time in ms. The timing diagram of the graphical illustration 1100 includes the example sixth plot 1012 of the voltage at the input reference voltage node $V_{REF\_IN}$ in volts and the voltage at the output reference voltage node $V_{REF\_OUT}$ in volts versus time in ms. The timing diagram of the graphical illustration 1100 includes a first time 1102 ($t_1$) and a second time 1104 ($t_2$).

In the illustrated example of FIG. 11, the sixth plot 1012 illustrates that ripple voltage on the voltage at the output reference voltage node $V_{REF\_OUT}$ between the first time 1102 ($t_1$) and the second time 1104 ($t_2$) is less than 51 µV. The reduced ripple voltage in the voltage at the output reference voltage node $V_{REF\_OUT}$ is due to the accurate delays implemented during the offset window detection time, $T_{OW}$, the settling time detector delay period, $T_S$, and the acquisition time, $T_{AC}$.

Figure 12:
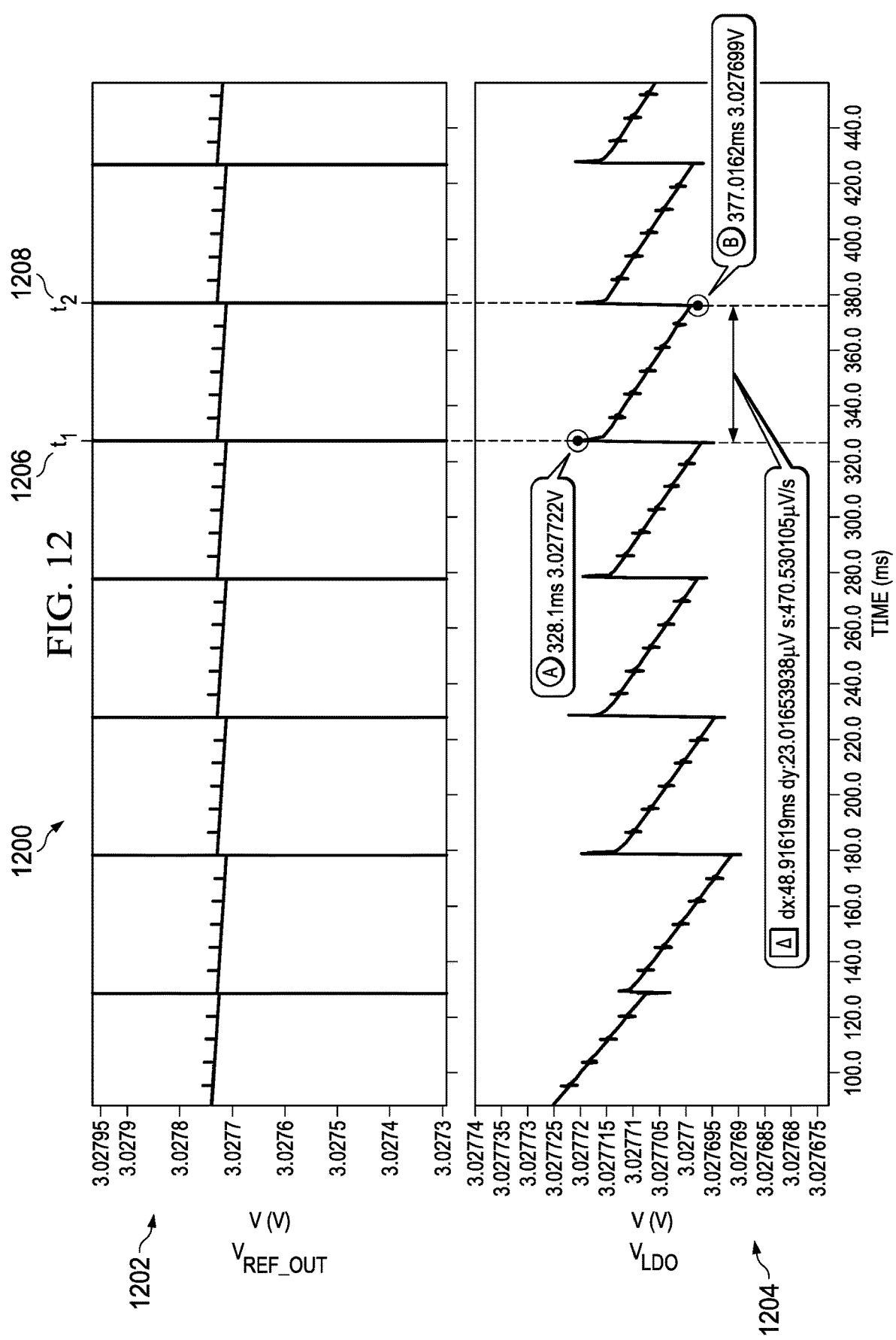
FIG. 12 is a graphical illustration depicting example operation of the example low-dropout regulator of FIG. 7.

FIG. 12 is a graphical illustration 1200 depicting example operation of the example low-dropout (LDO) regulator 702 of FIG. 7. The graphical illustration 1200 is a timing diagram including two plots. The timing diagram of the graphical illustration 1200 includes an example first plot 1202 of the voltage at the output reference voltage node $V_{REF\_OUT}$ in volts versus time in ms. The timing diagram of the graphical illustration 1200 includes an example second plot 1204 of the voltage of the LDO output voltage, $V_{LDO}$, in volts versus time in ms. The timing diagram of the graphical illustration 1200 includes a first time 1206 ($t_1$) and a second time 1208 ($t_2$).

In the illustrated example of FIG. 12, the second plot 1204 illustrates that ripple voltage on the voltage the LDO output voltage, $V_{LDO}$, between the first time 1206 ($t_1$) and the second time 1208 ($t_2$) is less than 23 μV. Additionally, the second plot 1204 illustrates that the LDO regulator 702 filters any high frequency components in the signal at the output reference voltage node $V_{REF\_OUT}$ before generating the LDO output voltage, $V_{LDO}$. The reduced ripple voltage in the LDO output voltage, $V_{LDO}$, is a result of the accurate delays implemented during the offset window detection time, $T_{OW}$, the settling time detector delay period, $T_S$, and the acquisition time, $T_{AC}$.

Figure 13:
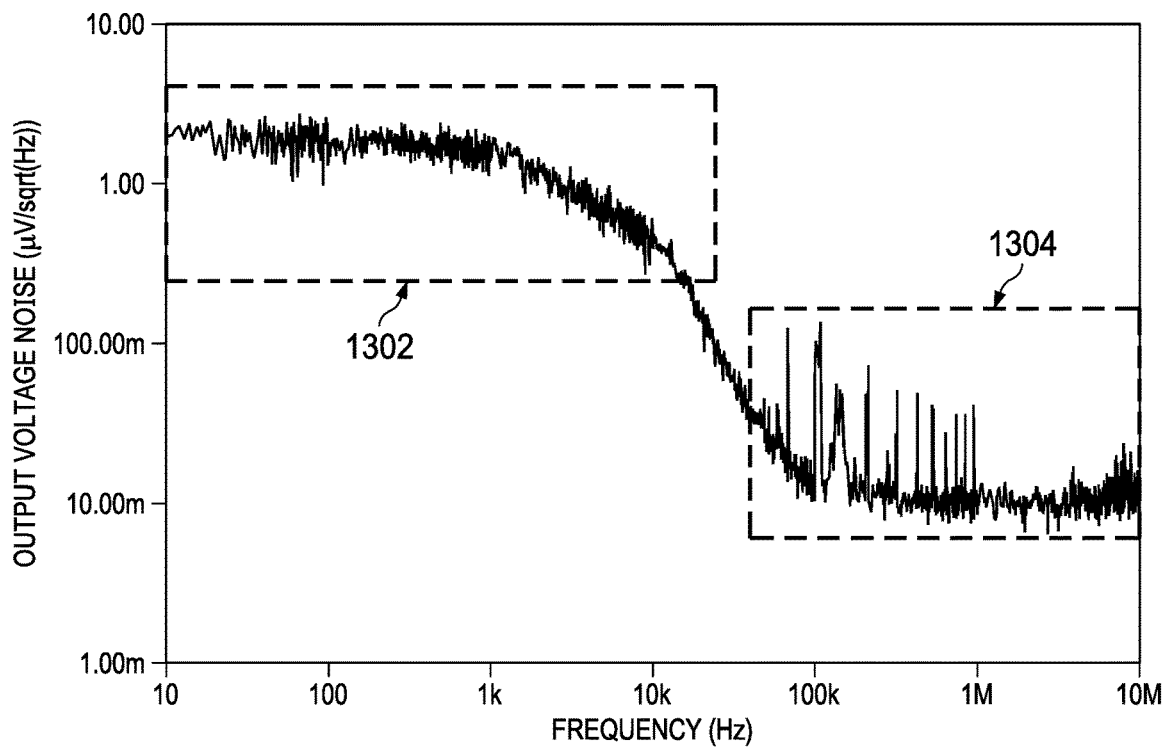
FIG. 13 is a graphical illustration depicting example noise in the low-dropout output voltage of the example low-dropout regulator of FIG. 7 when not utilizing the sample-hold circuit of FIG. 7 at a low current.

FIG. 13 is a graphical illustration 1300 depicting example noise in the low-dropout (LDO) output voltage, $V_{LDO}$, of the example LDO regulator 702 of FIG. 7 when not utilizing the sample-hold (S/H) circuit 704 of FIG. 7 at a low current. For example, the graphical illustration 1300 is a timing diagram of the noise in the LDO output voltage, $V_{LDO}$, versus frequency in Hz for an LDO regulator supplying load current, $I_{LOAD}$, of 300 microamps (μA) with a voltage of 0.8 volts. In the example of FIG. 13, the S/H circuit operates continuously. The noise is calculated as quotient of the voltage of LDO output voltage, $V_{LDO}$, and the square root of the frequency of the oscillator of the LDO regulator 702 of FIG. 7 when not utilizing the S/H circuit 704 (e.g., $$N = \frac{V_{LDO}}{\sqrt{f_{CLK}}}).$$

The timing diagram of the graphical illustration 1300 includes an example first region 1302 and an example second region 1304.

In the illustrated example of FIG. 13, the first region 1302 ranges from zero Hz to 11 kHz. The range of frequencies that the first region 1302 includes the desired operating range of an oscillator of the LDO regulator 702 of FIG. 7 when not utilizing the sample-hold (S/H) circuit 704 of FIG. 7 and is of interest. For the region of interest (e.g., the first region 1302), the integrated root mean squared (RMS) noise is equivalent to $$103 \frac{\mu V}{\sqrt{Hz}}.$$

The second region 1304 ranges from 13 kHz to ten megahertz (MHz). The range of frequencies that the second region 1304 includes are above the desired operating range of an oscillator of the LDO regulator 702 of FIG. 7 when not utilizing the S/H circuit 704 of FIG. 7 and is not of interest.

Figure 14:
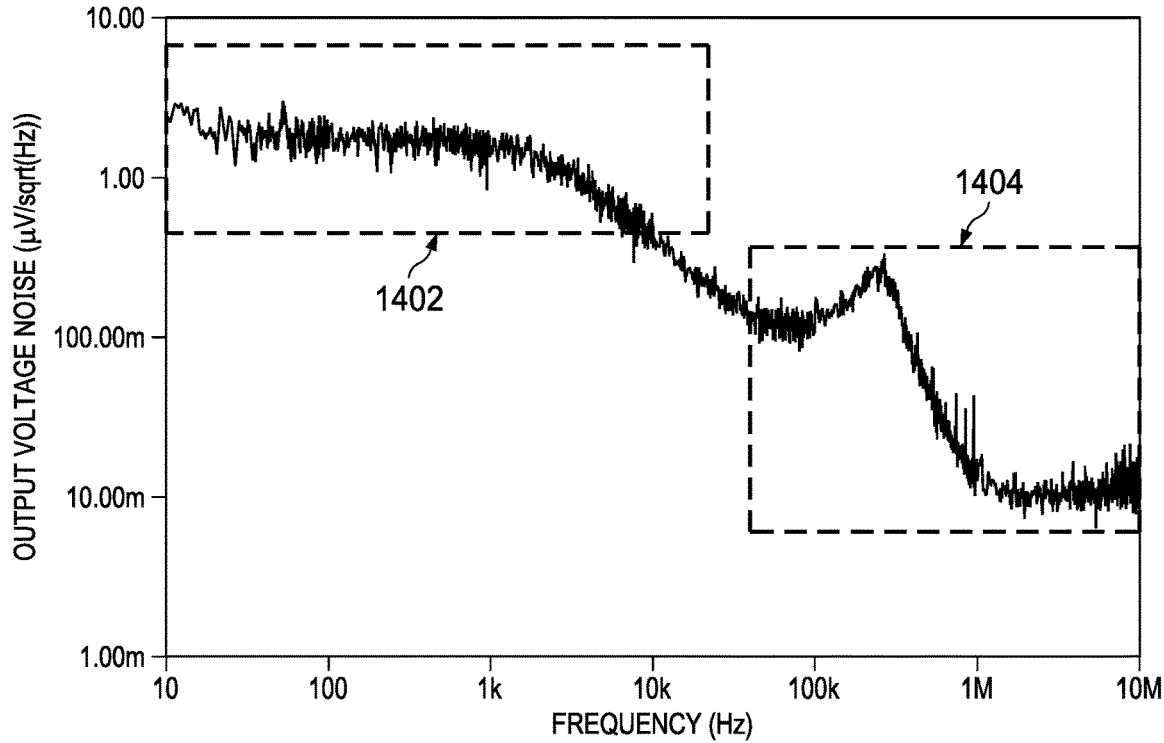
FIG. 14 is a graphical illustration depicting example noise in the low-dropout output voltage of the example low-dropout regulator of FIG. 7 when not utilizing the sample-hold circuit of FIG. 7 at a higher current.

FIG. 14 is a graphical illustration 1400 depicting example noise in the low-dropout (LDO) output voltage, $V_{LDO}$, of the example LDO regulator 702 of FIG. 7 when not utilizing the sample-hold (S/H) circuit 704 of FIG. 7 at a higher current. For example, the graphical illustration 1400 is a timing diagram of the noise in the LDO output voltage, $V_{LDO}$, versus frequency in Hz for an LDO regulator supplying load current, $I_{LOAD}$, of 30 mA with a voltage of 0.8 volts. In the example of FIG. 14, the S/H circuit operates continuously. The noise is calculated as quotient of the voltage of LDO output voltage, $V_{LDO}$, and the square root of the frequency of the oscillator of the LDO regulator 702 of FIG. 7 when not utilizing the S/H circuit 704 (e.g., $$N = \frac{V_{LDO}}{\sqrt{f_{CLK}}}).$$

the timing diagram or the graphical illustration 1400 includes an example first region 1402 and an example second region 1404.

In the illustrated example of FIG. 14, the first region 1402 ranges from zero Hz to 11 kHz. The range of frequencies that the first region 1402 includes the desired operating range of an oscillator of the LDO regulator 702 of FIG. 7 when not utilizing the S/H circuit 704 of FIG. 7 and is of interest. For the region of interest (e.g., the first region 1402), the integrated RMS noise is equivalent to $$113 \frac{\mu V}{\sqrt{Hz}}.$$

The second region 1404 ranges from 13 kHz to ten MHz. The range of frequencies that the second region 1404 includes are above the desired operating range of an oscillator of the LDO regulator 702 of FIG. 7 when not utilizing the S/H circuit 704 of FIG. 7 and is not of interest.

Figure 15:
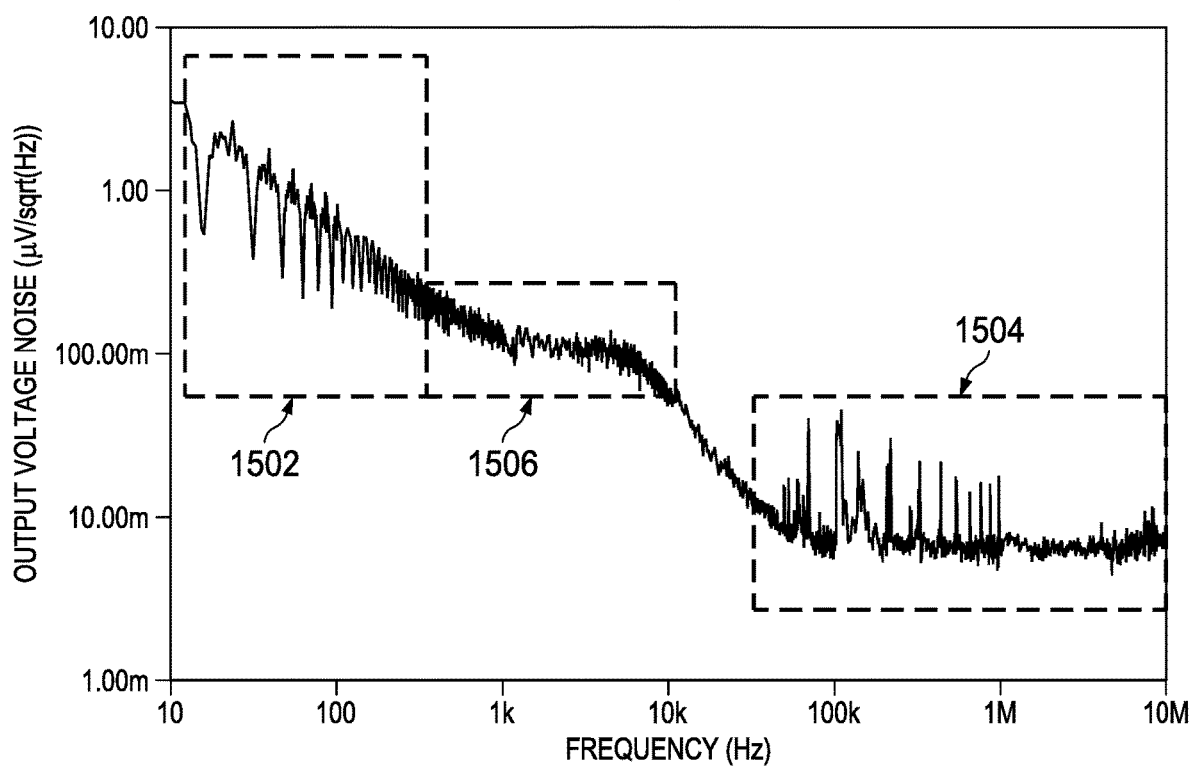
FIG. 15 is a graphical illustration depicting example noise in the low-dropout output voltage of the example low-dropout regulator of FIG. 7 when utilizing the sample-hold circuit of FIG. 7.

FIG. 15 is a graphical illustration 1500 depicting example noise in the low-dropout (LDO) output voltage, $V_{LDO}$, of the example LDO regulator 702 of FIG. 7 when utilizing the sample-hold (S/H) circuit 704 of FIG. 7. The graphical illustration 1500 is a timing diagram of the noise in the LDO output voltage, $V_{LDO}$, versus frequency in Hz for the LDO regulator 702 supplying load current, $I_{LOAD}$, of 100 μA with a voltage of 0.8 volts. In the example of FIG. 15, the frequency of the S/H circuit 704 is 20 Hz. The noise is calculated as quotient of the voltage of LDO output voltage, $V_{LDO}$, and the square root of the frequency of the oscillator 812 (e.g., $$N = \frac{V_{LDO}}{\sqrt{f_{CLK}}}).$$

The timing diagram of the graphical illustration 1500 includes an example first region 1502, an example second region 1504, and an example third region 1506.

In the illustrated example of FIG. 15, the first region 1502 ranges from zero Hz to 300 Hz. The range of frequencies that the first region 1502 are below the desired operating range of the oscillator 812 and not of interest. In the first region 1502, there is high noise with a sharp roll off. The second region 1504 ranges from 12 kHz to ten MHz. The range of frequencies that the second region 1504 are above the desired operating range of the oscillator 812 and not of interest. The third region 1506 ranges from 300 Hz to ten kHz. The range of frequencies that the third region 1506 includes the desired operating range of the oscillator 812 and is of interest. For the region of interest (e.g., the third region 1506), the integrated RMS noise is equivalent to $$85 \frac{\mu V}{\sqrt{Hz}}.$$

Thus, examples disclosed herein (e.g., delays implemented during the offset window detection time, $T_{OW}$, the settling time detector delay period, $T_S$, and the acquisition time, $T_{AC}$), reduce the integrated RMS noise in the LDO output voltage, $V_{LDO}$, at least from $$113 \frac{\mu V}{\sqrt{Hz}} \text{ to } 85 \frac{\mu V}{\sqrt{Hz}}.$$

While an example manner of implementing the sample controller 744 of FIG. 7 is illustrated in FIG. 8, and an example manner of implementing the sample controller 744 of FIG. 8 is illustrated in FIG. 9, one or more of the elements, processes and/or devices illustrated in FIGS. 8 and 9 may be combined, divided, re-arranged, omitted, eliminated and/or implemented in any other way. Further, the example offset window detector 802, the example settling time detector 804, the example sample acquisition controller 806, the example voltage supply node 808, the example ground node 810, the example oscillator 812, the example first inverter 814, the example first logic gate 816, the example second logic gate 818, and/or the example second inverter 820, and/or, the example first comparator 902, the example second comparator 904, the example third logic gate 906, the example fourth logic gate 908, the example third inverter 910, the example first switch 912 ($M_{N1}$), the example first biasing current source 914, the example first charge capacitor 916 ($C_1$), the example second switch 918 ($M_{P2}$), the example third switch 920 ($M_{P1}$), the example second biasing current source 922, the example first trigger 924, the example third inverter 926, the example fifth logic gate 928, the example third biasing current source 930, the example fourth switch 932 ($M_{P3}$), the example fifth switch 934 ($M_{P4}$), the example sixth switch 936 ($M_{N2}$), the example seventh switch 938 ($M_{N3}$), the example second charge capacitor 940 ($C_2$), the example second trigger 942, the example sixth logic gate 944, and/or, more generally, the example sample controller 744 of FIGS. 8 and 9 may be implemented by hardware, software, firmware and/or any combination of hardware, software and/or firmware. Thus, for example, any of the example offset window detector 802, the example settling time detector 804, the example sample acquisition controller 806, the example voltage supply node 808, the example ground node 810, the example oscillator 812, the example first inverter 814, the example first logic gate 816, the example second logic gate 818, and/or the example second inverter 820, and/or, the example first comparator 902, the example second comparator 904, the example third logic gate 906, the example fourth logic gate 908, the example third inverter 910, the example first switch 912 ($M_{N1}$), the example first biasing current source 914, the example first charge capacitor 916 ($C_1$), the example second switch 918 ($M_{P2}$), the example third switch 920 ($M_{P1}$), the example second biasing current source 922, the example first trigger 924, the example third inverter 926, the example fifth logic gate 928, the example third biasing current source 930, the example fourth switch 932 ($M_{P3}$), the example fifth switch 934 ($M_{P4}$), the example sixth switch 936 ($M_{N2}$), the example seventh switch 938 ($M_{N3}$), the example second charge capacitor 940 ($C_2$), the example second trigger 942, the example sixth logic gate 944, and/or, more generally, the example sample controller 744 of FIGS. 8 and 9 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example offset window detector 802, the example settling time detector 804, the example sample acquisition controller 806, the example voltage supply node 808, the example ground node 810, the example oscillator 812, the example first inverter 814, the example first logic gate 816, the example second logic gate 818, and/or the example second inverter 820, and/or, the example first comparator 902, the example second comparator 904, the example third logic gate 906, the example fourth logic gate 908, the example third inverter 910, the example first switch 912 ($M_{N1}$), the example first biasing current source 914, the example first charge capacitor 916 ($C_1$), the example second switch 918 ($M_{P2}$), the example third switch 920 ($M_{P1}$), the example second biasing current source 922, the example first trigger 924, the example third inverter 926, the example fifth logic gate 928, the example third biasing current source 930, the example fourth switch 932 ($M_{P3}$), the example fifth switch 934 ($M_{P4}$), the example sixth switch 936 ($M_{N2}$), the example seventh switch 938 ($M_{N3}$), the example second charge capacitor 940 ($C_2$), the example second trigger 942, the example sixth logic gate 944, and/or, more generally, the example sample controller 744 of FIGS. 8 and 9 is/are hereby expressly defined to include a non-transitory computer readable storage device or storage disk such as a memory, a digital versatile disk (DVD), a compact disk (CD), a Blu-ray disk, etc. including the software and/or firmware. Further still, the example sample controller 744 of FIG. 7 may include one or more elements, processes and/or devices in addition to, or instead of, those illustrated in FIGS. 8 and 9, and/or may include more than one of any or all of the illustrated elements, processes and devices. As used herein, the phrase in communication, including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 16:
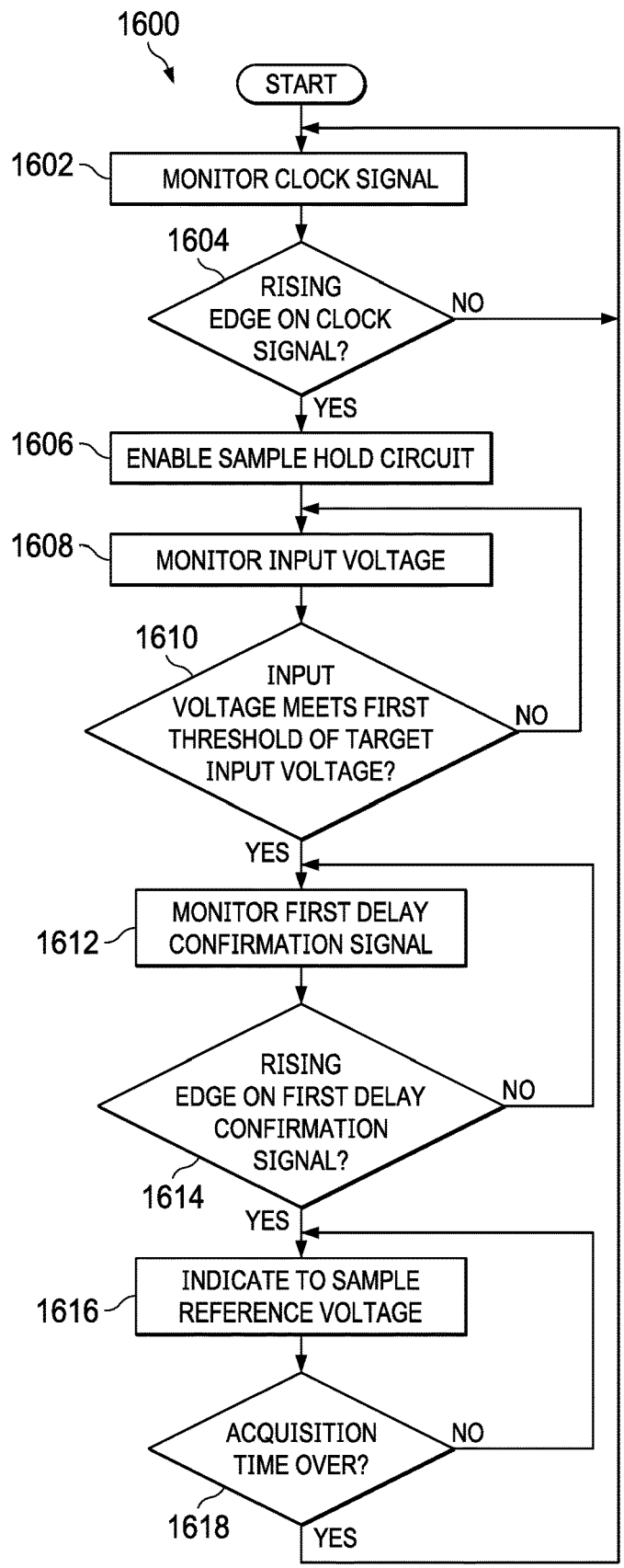
FIG. 16 is a flowchart representative of a process, which may be implemented utilizing machine-readable instructions that may be executed, to implement the example sample controller of FIGS. 7, 8, and 9.

A flowchart representative of example hardware logic, machine readable instructions, hardware implemented state machines, and/or any combination thereof for implementing the sample controller 744 of FIGS. 7, 8, and 9 is shown in FIG. 16. The machine-readable instructions may be one or more executable programs or portion(s) of an executable program for execution by a computer processor. The program may be embodied in software stored on a non-transitory computer readable storage medium such as a CD-ROM, a floppy disk, a hard drive, a DVD, a Blu-ray disk, or a memory associated with a processor, but the entire program and/or parts thereof could alternatively be executed by a device other than the processor and/or embodied in firmware or dedicated hardware. Further, although the example program is described with reference to the flowchart illustrated in FIG. 16, many other methods of implementing the example sample controller 744 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine-readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine-readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example processes of FIG. 16 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

FIG. 16 is a flowchart representative of a process 1600, which may be implemented utilizing machine-readable instructions that may be executed, to implement the example sample controller 744 of FIGS. 7, 8, and 9. The example process 1600 begins at block 1602 where the sample controller 744 monitors the clock signal, CLK, generated by the oscillator 812. For example, at block 1602 the first logic gate 816 monitors the clock signal, CLK, generated by the oscillator 812. At block 1604 the sample controller 744 determines whether there is a rising edge on the clock signal, CLK. For example, at block 1604 the first logic gate 816 determines whether there is a rising edge on the clock signal, CLK. In response to no rising edge on the clock signal, CLK (block 1604: NO), the process 1600 returns to block 1602.

In the example illustrated in FIG. 16, in response to a rising edge on the clock signal, CLK (block 1604: YES), the process 1600 proceeds to block 1606 where the sample controller 744 enables the S/H circuit 704. For example, at block 1606, in response to a rising edge on the clock signal, CLK, the first logic gate 816 causes the second inverter 820 to enable the power control switch 708, thereby enabling the S/H circuit 704. At block 1608 the sample controller 744 monitors an input voltage. For example, at block 1608 the first comparator 902 and the second comparator 904, and/or, more generally, the offset window detector 802, monitors the input voltage. In some examples, the input voltage is the bandgap reference voltage, $V_{BG}$, generated by the bandgap reference voltage generator 710. In additional or alternative examples, the input voltage is the voltage at the input reference voltage node $V_{REF\_IN}$.

In the illustrated example of FIG. 16, at block 1610 the sample controller 744 determines whether the input voltage meets a first threshold of a target input voltage. For example, at block 1610 the first comparator 902 and the second comparator 904, and/or, more generally, the offset window detector 802 determine whether the input voltage meets a first threshold of a target input voltage. In some examples, the first threshold of the target input voltage is the target bandgap reference voltage plus or minus an offset voltage (e.g., $V_{BG}+/-V_{OFFSET}$). In additional or alternative examples, the first threshold of the target input voltage is the target input reference voltage plus or minus an offset voltage (e.g., $V_{REF\_IN}+/-V_{OFFSET}$). In response to the input voltage not meeting the first threshold (block 1610: NO), the process 1600 returns to block 1608.

In the example illustrated in FIG. 16, in response to the input voltage meeting the first threshold (block 1610: YES), the process 1600 proceeds to block 1612 where the sample controller 744 monitors the first delay confirmation signal, $V_{DEL2\_OK}$, at the first output of the settling time detector 804. For example, at block 1612, the sixth logic gate 944, and/or, more generally, the sample acquisition controller 806 monitors the first delay confirmation signal, $V_{DEL2\_OK}$, at the output of the first trigger 924, and/or, more generally, at the first output of the settling time detector 804. At block 1614, the sample controller 744 determines whether there is a rising edge on the first delay confirmation signal, $V_{DEL2\_OK}$. For example, at block 1614 the sixth logic gate 944, and/or, more generally, the sample acquisition controller 806 determines whether there is a rising edge on the first delay confirmation signal, $V_{DEL2\_OK}$. In response to no rising edge on the first delay confirmation signal, $V_{DEL2\_OK}$ (block 1614: NO), the process 1600 returns to block 1612.

In the illustrated example of FIG. 16, in response to a rising edge on the first delay confirmation signal, $V_{DEL2\_OK}$ (block 1614: YES), the process 1600 proceeds to block 1616 where the sample controller 744 indicates to sample a reference voltage (e.g., the voltage at the input reference voltage node $V_{REF\_N}$). For example, at block 1616 in response to a rising edge on the first delay confirmation signal, $V_{DEL2\_OK}$ and a rising edge and/or logic high value on the reference confirmation signal, $V_{REF\_OK}$, the sixth logic gate 944, and/or, more generally, the sample acquisition controller 806 indicates to sample the reference voltage (e.g., the voltage at the input reference voltage node $V_{REF\_N}$).

In the example illustrated in FIG. 16, at block 1618, the sample controller 744 determines whether the acquisition time, $T_{AC}$, is over. For example, the second trigger 942, and/or, more generally, the sample acquisition controller 806 determines whether the voltage that is dependent upon a delay of the sample acquisition controller 806 (e.g., the voltage at the drain of the fifth switch 934 ($M_{P4}$), the drain of the sixth switch 936 ($M_{N2}$), and the input of the second trigger 942) meets the second timing threshold (e.g., the threshold of the second trigger 942). In response to the acquisition time, $T_{AC}$, not being over (block 1618: NO), the process 1600 returns to block 1616. In response to the acquisition time, $T_{AC}$, being over (block 1618: YES), the process 1600 returns to block 1602.

From the foregoing, it will be appreciated that example methods, apparatus, and articles of manufacture have been disclosed that control switching of a sampling circuit. The example methods, apparatus, and articles of manufacture disclosed herein advantageously combine delay elements to improve on-time control of S/H circuits and reduce the average power consumption of S/H circuits. For example, the examples disclosed herein include at least three delay elements to improve on-time control and reduce the average power consumption of S/H circuits. The example three delay elements disclosed herein include a delay element that tracks the startup time of the a bandgap reference voltage generator of an S/H circuit and/or the startup time of a feedback network and amplifier the S/H circuit; a delay element that tracks the settling time of the feedback network and the amplifier of the S/H circuit; and a delay element that tracks the time response of the one or more RC filters of the S/H circuit.

Because of the advantageous combination of delay elements disclosed herein, even if the biasing current of the scaling amplifier and/or the slew rate of the bandgap reference voltage generator vary across process, voltage, and temperature (PVT), the on-time control and acquisition time of S/H circuit will still be improved. For example, as the biasing current of the scaling amplifier and/or the slew rate of the bandgap reference voltage generator vary across PVT, the delay elements disclosed herein will similarly vary across PVT. Thus, the acquisition time of S/H circuits will be accurately matched regardless of variations across PVT.

Examples disclosed herein include a sample-and-hold circuit with an adjustable timer and duty-cycle that balances both quiescent current and S/H error sources. For example, the disclosed methods, apparatus, and articles of manufacture reduce input settling error by, before sampling, tuning the input settling time window to a delay based on a target window settling detection of a window comparator (e.g., the first comparator 902 and/or the second comparator 904) and an additional delay (e.g., $$D_1 = \frac{C_1 * V_{th\_MP1}}{I_{BIAS1}},$$

the delay of the settling time detector 804, etc.) to track slewing of the scaling amplifier (e.g., the feedback network and amplifier formed by the operational amplifier 712, the biasing current source 714, the compensation capacitor 718 ($C_C$), and the first switch 720). For example, a delay based on a target window settling detection of a window comparator (e.g., the first comparator 902 and/or the second comparator 904) and an additional delay (e.g., $$D_1 = \frac{C_1 * V_{th\_MP1}}{I_{BIAS1}},$$

the delay of the settling time detector 804, etc.) to track slewing of the scaling amplifier enable sampling of a input reference voltage with is within 1 mV of a target input reference voltage. Additionally or alternatively, the disclosed methods, apparatus, and articles of manufacture reduce input settling error by sampling the input reference voltage in response to both the delay based on a target window settling detection of a window comparator (e.g., the first comparator 902 and/or the second comparator 904) and the additional delay (e.g., $$D_1 = \frac{C_1 * V_{th\_MP1}}{I_{BIAS1}},$$

the delay of the settling time detector 804, etc.) to track slewing of the scaling amplifier being met. Additionally or alternatively, the disclosed methods, apparatus, and articles of manufacture reduce input settling error by, before sampling, including a glitch detection reset triggered by the window comparator (e.g., the first comparator 902 and/or the second comparator 904) which resets both the delay based on a target window settling detection of a window comparator (e.g., the first comparator 902 and/or the second comparator 904) and the additional delay (e.g., $$D_1 = \frac{C_1 * V_{th\_MP1}}{I_{BIAS1}},$$

the delay of the settling time detector 804, etc.) to track slewing of the scaling amplifier.

Additionally or alternatively, examples disclosed herein balance both quiescent current and S/H error sources by reducing acquisition settling error. For example, examples disclosed herein reduce the acquisition settling error by, during sampling, filtering with an RC filter (e.g., the first filter resistor 734 ($R_{F1}$) and the first filter capacitor 736 ($C_{F1}$) to reduce input noise from the bandgap reference voltage generator and/or the scaling amplifier. Additionally or alternatively, examples disclosed herein reduce the acquisition settling error by, during sampling, setting a sample window that is proportional to the input RC filter time constant and independent from variations in the bandgap reference voltage generator and/or scaling amplifier settling time.

The disclosed methods, apparatus and articles of manufacture improve the efficiency of using a computing device at least by reducing the average power consumption of a computing device and reducing ripple voltage in the output of an low-dropout (LDO) regulator implementing the example methods, apparatus, and articles of manufacture disclosed herein. For example, when implementing the example methods, apparatus, and articles of manufacture disclosed herein the ripple voltage at the output of an LDO regulator can be reduced to less than 23 µV. The disclosed methods, apparatus, and articles of manufacture are accordingly directed to one or more improvement(s) in the functioning of a computer. For example, the disclosed methods, apparatus, and articles of manufacture reduce the average quiescent current, $I_{q\_avg}$, of the S/H circuit 704 from 22 nanoamps (nA) to 3 nA.

Methods, apparatus, systems and articles of manufacture are disclosed to control switching of a sampling circuit. An example apparatus includes an offset window detector to determine whether a first voltage meets a first threshold of a target input voltage; a settling time detector coupled to the offset window detector, the settling time detector to determine whether a second voltage meets a second threshold, the second voltage dependent on a delay of the settling time detector, the delay of the settling time detector to track a time response of a scaling amplifier; and a sample acquisition controller coupled to the offset window detector and the settling time detector, the sample acquisition controller operable to cause a reference voltage to be sampled, in response to the first threshold and the second threshold being met; and in response to a third voltage dependent on a delay of the sample acquisition controller meeting a third threshold, the delay of the sample acquisition controller to track a time response of a filter, cause sampling of the reference voltage to be disabled.

Including and comprising (and all forms and tenses thereof) are used herein to be open ended terms. Thus, whenever a claim employs any form of include or comprise (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase at least is used as the transition term in, for example, a preamble of a claim, it is open-ended in the same manner as the term comprising and including are open ended. The term and/or when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase at least one of A and B is intended to refer to implementations including any of (1) at least one A, (2) at least one B, and (3) at least one A and at least one B. Similarly, as used herein in the context of describing structures, components, items, objects and/or things, the phrase at least one of A or B is intended to refer to implementations including any of (1) at least one A, (2) at least one B, and (3) at least one A and at least one B. As used herein in the context of describing the performance or execution of processes, instructions, actions, activities and/or steps, the phrase at least one of A or B is intended to refer to implementations including any of (1) at least one A, (2) at least one B, and (3) at least one A and at least one B. Similarly, as used herein in the context of describing the performance or execution of processes, instructions, actions, activities and/or steps, the phrase at least one of A or B is intended to refer to implementations including any of (1) at least one A, (2) at least one B, and (3) at least one A and at least one B.

As used herein, singular references (e.g., a, an, first, second, etc.) do not exclude a plurality. The term a or an entity, as used herein, refers to one or more of that entity. The terms a (or an), one or more, and at least one can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
    an offset window detector including a first output, a second output, a first input coupled to an output of an amplifier, and a second input coupled to an output of an oscillator;
    a settling time detector including a first output, a second output, a first input coupled to the first output of the offset window detector, and a second input coupled to the second output of the offset window detector;
    a sample acquisition controller including a first output, a second output, a first input coupled to the first output of the offset window detector, a second input coupled to the second output of the offset window detector, a third input coupled to the first output of the settling time detector, a fourth input coupled to the second output of the settling time detector, and a fifth input coupled an output of a first inverter;
    a first logic gate including an output, a first input coupled to the first output of the sample acquisition controller, and a second input coupled to the output of the oscillator;
    a second logic gate including a first input coupled to the second output of the sample acquisition controller, a second input coupled to the output of the first logic gate, and an output coupled to a control terminal of a first switch; and
    a second inverter including an input coupled to the output of the first logic gate and an output coupled to a control terminal of a second switch.

2. The apparatus of claim 1, wherein the first logic gate includes an XOR gate and the second logic gate includes an AND gate.

3. The apparatus of claim 2, wherein the AND gate is a first AND gate, the offset window detector including:
    a first comparator including an output, an inverting input coupled to the output of the amplifier, and a non-inverting input coupled to a first voltage supply;
    a second comparator including an output, an inverting input coupled to a second voltage supply, and a non-inverting input coupled to the inverting input of the first comparator and the output of the amplifier;

a second AND gate including an output, a first input coupled to the output of the first comparator, and a second input coupled to the output of the second comparator;

a third AND gate including a first input coupled to the output of the second AND gate, a second input coupled to the output of the oscillator, and an output coupled to the second input of the settling time detector and the second input of the sample acquisition controller; and a third inverter including an input coupled to the output of the second AND gate and an output coupled to the first input of the settling time detector and the first input of the sample acquisition controller.

4. The apparatus of claim 2, wherein the settling time detector includes:

a third switch including a first current terminal, a second current terminal coupled to a ground node, and a control terminal coupled to the second output of the offset window detector;

a first current source including a first terminal and a second terminal, the second terminal coupled to the first current terminal of the third switch;

a capacitor including a first terminal coupled to a voltage supply node and a second terminal coupled to the first terminal of the first current source;

a fourth switch including a control terminal, a first current terminal coupled to the voltage supply node and the first terminal of the capacitor, and a second current terminal coupled to the second terminal of the capacitor;

a fifth switch including a first current terminal, a second current terminal coupled to the voltage supply node, and a control terminal coupled to the second terminal of the capacitor;

a second current source including a first terminal coupled to the first current terminal of the fifth switch and a second terminal coupled to the first current terminal of the third switch and the ground node;

a trigger including an input coupled to the first current terminal of the fifth switch and the first terminal of the second current source and an output coupled to the third input of the sample acquisition controller;

a third inverter including an input coupled to the output of the trigger and an output coupled to the fourth input of the sample acquisition controller; and a NOR gate including a first input coupled to the first output of the offset window detector, a second input coupled to the output of the trigger, and an output coupled to the control terminal of the fourth switch.

5. The apparatus of claim 4, wherein a delay of the settling time detector is based on a capacitance of the capacitor, a threshold voltage of the fifth switch, and a biasing current of the second current source.

6. The apparatus of claim 2, wherein the AND gate is a first AND gate, the sample acquisition controller including:

a current source including a first terminal and a second terminal coupled to a voltage supply node;

a third switch including a first current terminal, a second current terminal coupled to the first terminal of the current source, and a control terminal coupled to the first output of the offset window detector;

a fourth switch including a first current terminal, a second current terminal coupled to the first current terminal of the third switch, and a control terminal coupled to the second output of the settling time detector;

a fifth switch including a first current terminal, a second current terminal coupled to the first current terminal of the fourth switch, and a control terminal coupled to a biasing voltage source;

a sixth switch including a first current terminal coupled to the first current terminal of the fifth switch, a second current terminal coupled to a ground node, and a control terminal coupled to the output of the first inverter;

a capacitor including a first terminal coupled to the first current terminal of the fifth switch and the first current terminal of the sixth switch and a second terminal coupled to the ground node;

a trigger including an input coupled to the first current terminal of the fourth switch and the second current terminal of the fifth switch and an output coupled to the first input of the first logic gate; and a second AND gate including a first input coupled to the second output of the offset window detector, a second input coupled to the first output of the settling time detector, and an output coupled to the first input of the second logic gate.

7. The apparatus of claim 6, wherein a delay of the sample acquisition controller is based on a capacitance of the capacitor, a voltage of the biasing voltage source, and a biasing current of the current source.

8. An apparatus comprising:

an offset window detector to determine whether a first voltage meets a first threshold of a target input voltage;

a settling time detector coupled to the offset window detector, the settling time detector to determine whether a second voltage meets a second threshold, the second voltage dependent on a delay of the settling time detector, the delay of the settling time detector to track a time response of a scaling amplifier; and a sample acquisition controller coupled to the offset window detector and the settling time detector, the sample acquisition controller operable to cause a reference voltage to be sampled, in response to the first threshold and the second threshold being met.

9. The apparatus of claim 8, wherein:

the offset window detector includes a first output, a second output, a first input coupled to an amplifier to obtain the first voltage, and a second input coupled to an output of an oscillator;

the settling time detector includes a first output, a second output, a first input coupled to the first output of the offset window detector, a second input coupled to the second output of the offset window detector, and a third input coupled to a voltage supply node; and the sample acquisition controller includes a first output, a second output, a first input coupled to the first output of the offset window detector, a second input coupled to the second output of the offset window detector, a third input coupled to the first output of the settling time detector, a fourth input coupled to the second output of the settling time detector, a fifth input coupled an output of a first inverter, and a sixth input coupled to the voltage supply node.

10. The apparatus of claim 9, further including:

an XOR gate including an output, a first input coupled to the first output of the sample acquisition controller, and a second input coupled to the output of the oscillator;

an AND gate including a first input coupled to the second output of the sample acquisition controller, a second input coupled to the output of the XOR gate, and an output coupled to a control terminal of a first switch; and a second inverter including an input coupled to the output of the XOR gate and an output coupled to a control terminal of a second switch.

11. The apparatus of claim 8, wherein the first threshold corresponds to a range including an upper threshold and a lower threshold.

12. The apparatus of claim 8, wherein the delay of the settling time detector is based on a capacitance of the settling time detector, a threshold voltage of a switch of the settling time detector, and a biasing current of the settling time detector.

13. The apparatus of claim 8, wherein the delay of the settling time detector is a first delay and a second delay of the sample acquisition controller is based on a capacitance of the sample acquisition controller, a voltage of a biasing voltage source of the sample acquisition controller, and a biasing current of the sample acquisition controller.

14. The apparatus of claim 8, wherein the sample acquisition controller is to, in response to a third voltage dependent on a delay of the sample acquisition controller meeting a third threshold, the delay of the sample acquisition controller to track a time response of a filter, cause sampling of the reference voltage to be disabled.

15. A system comprising:
a first switch including a control terminal, a first current terminal, and a second current terminal coupled to a voltage supply node;
a bandgap reference voltage amplifier including an output and an input coupled to the first current terminal of the first switch, the bandgap reference voltage amplifier to generate a bandgap reference voltage;
a scaling amplifier including an output and an input coupled the output of the bandgap reference voltage amplifier, the scaling amplifier to generate an input reference voltage based on the bandgap reference voltage;
a second switch including a control terminal, a first current terminal, and a second current terminal coupled to the output of the scaling amplifier;
a resistor including a first terminal and a second terminal coupled to the first current terminal of the second switch;
a capacitor including a first terminal coupled to the first terminal of the resistor and a second terminal coupled to a ground node, the capacitor to store an output reference voltage;
a low-dropout (LDO) regulator coupled to the first terminal of the resistor and the first terminal of the capacitor, the LDO regulator to generate a voltage based on the output reference voltage; and a sample controller including an input coupled to at least one of the output of the bandgap reference voltage amplifier or the output of the scaling amplifier, a first output coupled to the control terminal of the first switch, and a second output coupled to the control terminal of the second switch, the sample controller to:
determine whether at least one of a first voltage at the output of the bandgap reference voltage amplifier or a second voltage at the output of the scaling amplifier meets a first threshold of a target input voltage;
determine whether a third voltage meets a second threshold, the third voltage dependent on a delay of the sample controller, the delay of the sampling controller to track a time response of the scaling amplifier; and
in response to the first threshold and the second threshold being met, indicate to sample the input reference voltage.

16. The system of claim 15, wherein the first threshold corresponds to a range including an upper threshold and a lower threshold.

17. The system of claim 15, wherein the sample controller is to, in response to at least one of the first voltage or the second voltage not meeting the first threshold of the target input voltage, indicate not to sample the input reference voltage.

18. The system of claim 15, wherein the sample controller is to, in response to the third voltage not meeting the second threshold, reset the delay of the sample controller.

19. The system of claim 15, wherein the delay of the sample controller is based on a capacitance of the sample controller, a threshold voltage of a switch of the sample controller, and a biasing current of the sample controller.

20. The system of claim 15, wherein the delay of the sample controller is a first delay and a second delay of the sample controller is based on a capacitance of the sample controller, a voltage of a biasing voltage source of the sample controller, and a biasing current of the sample controller.

21. An electronic device comprising:
a power source; and
a sample-hold-circuit including an amplifier and a filter, the sample-hold-circuit operable to sample a voltage produced based on the power source; and
a sample controller coupled to the sample-hold-circuit, the sample controller operable to:
track a first time response of the amplifier and a second time response of the filter; and
control on-time of the sample-hold-circuit based on the first time response and the second time response.

* * * * *